US009385754B2

(12) United States Patent
Sakai et al.

(10) Patent No.: US 9,385,754 B2
(45) Date of Patent: Jul. 5, 2016

(54) CONTROLLER, INFORMATION PROCESSING SYSTEM, METHOD OF CONTROLLING CONTROLLER, AND PROGRAM

(71) Applicant: Sony Corporation, Tokyo (JP)

(72) Inventors: Lui Sakai, Kanagawa (JP); Yasushi Fujinami, Tokyo (JP); Ryoji Ikegaya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 25 days.

(21) Appl. No.: 14/156,024

(22) Filed: Jan. 15, 2014

(65) Prior Publication Data

US 2014/0208182 A1    Jul. 24, 2014

(30) Foreign Application Priority Data

Jan. 21, 2013    (JP) .................................. 2013-008257

(51) Int. Cl.
  *G06F 11/10*    (2006.01)
  *H03M 13/11*    (2006.01)
  *H03M 13/23*    (2006.01)
  *H03M 13/29*    (2006.01)
  *H03M 13/37*    (2006.01)

(52) U.S. Cl.
  CPC ....... *H03M 13/1117* (2013.01); *G06F 11/1012* (2013.01); *H03M 13/3707* (2013.01); *H03M 13/1108* (2013.01); *H03M 13/23* (2013.01); *H03M 13/2957* (2013.01)

(58) Field of Classification Search
  CPC .......... G06F 11/1012; H03M 13/1108; H03M 13/1117; H03M 13/23; H03M 13/2957; H03M 13/3707
  USPC ......................................... 714/755, 758, 780
  See application file for complete search history.

(56) References Cited

U.S. PATENT DOCUMENTS

| | | | |
|---|---|---|---|
| 7,239,673 B2* | 7/2007 | Sawada et al. ................. | 375/316 |
| 7,363,553 B2* | 4/2008 | Cai et al. ........................ | 714/709 |
| 8,996,964 B2* | 3/2015 | Choi et al. ..................... | 714/780 |
| 2012/0198304 A1* | 8/2012 | Kondo et al. .................. | 714/758 |
| 2013/0173985 A1* | 7/2013 | Chung .............. H03M 13/1111 714/755 |
| 2013/0326314 A1* | 12/2013 | Choi et al. ..................... | 714/780 |
| 2013/0346825 A1* | 12/2013 | Marukame et al. ........... | 714/758 |
| 2014/0208182 A1* | 7/2014 | Sakai et al. .................... | 714/755 |
| 2014/0380129 A1* | 12/2014 | Shin et al. ...................... | 714/773 |

* cited by examiner

*Primary Examiner* — James C Kerveros
(74) *Attorney, Agent, or Firm* — Chip Law Group

(57) ABSTRACT

A controller includes: a low-level error correction section configured to execute low-level error correction in which an error in a code word is corrected with use of a predetermined decoding algorithm; and a high-level soft-decision error correction section configured to execute high-level soft-decision error correction in which the error in the code word is corrected with use of a high-level algorithm when the error correction by the low-level error correction section has failed, the high-level algorithm being a soft-decision decoding algorithm having higher error correction capability than error correction capability of the predetermined decoding algorithm.

16 Claims, 55 Drawing Sheets

$$\text{CHECK MATRIX H} = \begin{bmatrix} & & & & \vdots & & & & & \\ \cdots & 1 & 1 & 1 & 1 & 1 & \cdots & 1 & \cdots \\ & & & & 1 & & & & & \\ & & & & 1 & & & & & \\ & & & & \vdots & & & & & \end{bmatrix}$$

FIG. 6A $$\text{CHECK MATRIX H} = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

READ DATA #1 READ FROM ADDRESS A FOR FIRST TIME

| 0 | 1 | 2 | 3 | ... | n−1 |
|---|---|---|---|-----|-----|
| 0 | 1 | 1 | 0 | ... | 1   |

FIG. 42B

READ DATA #2 READ FROM ADDRESS A FOR SECOND TIME

| 0 | 1 | 2 | 3 | ... | n−1 |
|---|---|---|---|-----|-----|
| 0 | 0 | 0 | 1 | ... | 1   |

FIG. 42C

READ DATA #3 READ FROM ADDRESS A FOR THIRD TIME

| 0 | 1 | 2 | 3 | ... | n−1 |
|---|---|---|---|-----|-----|
| 0 | 0 | 0 | 1 | ... | 1   |

FIG. 42D

SOFT-DECISION VALUE DATA
(n-NUMBER OF FLOATING-POINT DATA)

| 0 | 1 | 2 | 3 | ... | n−1 |
|---|---|---|---|-----|-----|
| $-\infty$ | $-0.7$ | $-0.7$ | $0.7$ | ... | $+\infty$ |

| READ VALUE AT THRESHOLD VALUE $R_{VL}$ | READ VALUE AT THRESHOLD VALUE $R_L$ | READ VALUE AT THRESHOLD VALUE $R_H$ | READ VALUE AT THRESHOLD VALUE $R_{VH}$ | SOFT-DECISION VALUE |
|---|---|---|---|---|
| 1 | 1 | 1 | 1 | $+\infty$ |
| 1 | 1 | 1 | 0 | $+1.1$ |
| 1 | 1 | 0 | 0 | $0.0$ |
| 1 | 0 | 0 | 0 | $-1.1$ |
| 0 | 0 | 0 | 0 | $-\infty$ |

FIG. 52

CONTROLLER, INFORMATION PROCESSING SYSTEM, METHOD OF CONTROLLING CONTROLLER, AND PROGRAM

CROSS REFERENCE TO RELATED APPLICATIONS

This application claims the benefit of Japanese Priority Patent Application JP 2013-008257 filed Jan. 21, 2013, the entire contents which are incorporated herein by reference.

BACKGROUND

The present technology relates to a controller, an information processing system, a method of controlling a controller, and a program. More specifically, the present technology relates to a controller, an information processing system, a method of controlling a controller, and a program in which error correction by a soft-decision decoding algorithm is performed.

In recent years, information processing systems may use non-volatile memories (NVMs) or HDDs (Hard Disk Drives) as storages. In these storages, stored data may be corrupted, and may not be read correctly. Therefore, a typical information processing system generates an error detection and correction code (ECC), based on data that is to be stored, and stores the ECC in the storage. When the data is reproduced, the information processing systems is allowed to detect and correct an error in the data, based on the ECC.

When the error is corrected, based on the ECC, a soft-decision decoding algorithm may be used. The soft-decision decoding algorithm is an algorithm that corrects an error, based on a soft-decision value corresponding to probability that a bit in data is "1" or probability that the a bit in data is "0". On the other hand, an algorithm that corrects an error, based on a hard-decision value indicating that a bit in data is "1" or "0" is referred to as a hard-decision decoding algorithm.

Although the soft-decision decoding algorithm has higher error correction capability than the hard-decision decoding algorithm, processing is complicated, thereby increasing a circuit size and processing time. Therefore, an apparatus in which a part of the soft-decision decoding algorithm is simplified to suppress increase in circuit size and the like has been proposed (for example, refer to Japanese Unexamined Patent Application Publication No. 2010-28408). More specifically, this apparatus uses a repeat mode soft-decision decoding algorithm in which a process of performing error correction by transmitting a soft-decision value generated in one of a variable node and a check node to the other one is repeated to simplify processing in the check node.

SUMMARY

However, in the above-described technique, it is difficult to improve error correction capability. The more an amount of parity information added to data is increased, that is, the more a code rate is reduced, the more the error correction capability is increased, but the more use efficiency of a storage region is reduced. To improve the error correction capability without changing the code rate, a method using an algorithm having higher error correction capability, or a method in which the number of repeats in the repeat mode soft-decision decoding algorithm is increased may be used. However, in the former method, processing with use of an algorithm having higher error correction capability is more complicated, thereby increasing the circuit size and processing time. Moreover, in the latter method in which the number of repeats is increased, processing time is increased. Therefore, it is difficult to improve the error correction capability while suppressing increase in circuit size and processing time without changing the code rate.

It is desirable to improve error correction capability in an information processing system in which a soft-decision algorithm is used.

According to an embodiment of the present technology, there is provided a controller including: a low-level error correction section configured to execute low-level error correction in which an error in a code word is corrected with use of a predetermined decoding algorithm; and a high-level soft-decision error correction section configured to execute high-level soft-decision error correction in which the error in the code word is corrected with use of a high-level algorithm when the error correction by the low-level error correction section has failed, the high-level algorithm being a soft-decision decoding algorithm having higher error correction capability than error correction capability of the predetermined decoding algorithm.

According to an embodiment of the present technology, there is provided a method of controlling a controller, the method including: executing low-level error correction in which an error in a code word is corrected with use of a predetermined decoding algorithm; and executing high-level soft-decision error correction in which the error in the code word is corrected with use of a high-level algorithm when the error correction in the low-level error correction has failed, the high-level algorithm being a soft-decision algorithm having higher error correction capability than error correction capability of the predetermined decoding algorithm.

According to an embodiment of the present technology, there is provided a non-transitory tangible recording medium having a program embodied therein, the computer-readable program allowing, when executed by a computer, the computer to implement a method, the method including: executing low-level error correction in which an error in a code word is corrected with use of a predetermined decoding algorithm; and executing high-level soft-decision error correction in which the error in the code word is corrected with use of a high-level algorithm when the error correction in the low-level error correction has failed, the high-level algorithm being a soft-decision algorithm having higher error correction capability than error correction capability of the predetermined decoding algorithm.

Thus, an effect is achieved that the error in the code word is corrected with use of the high-level algorithm when error correction by the low-level error correction section has failed.

Moreover, the controller according to the embodiment of the present technology may further include: a read processing section configured to read the code word from a memory and supply the code word to the low-level error correction section, the code word including a plurality of code elements, a code word acquisition section configured to execute, a plurality of times, code word acquisition in which the code word is read from the memory when the error correction by the low-level error correction section has failed; and a soft-decision value generation section configured to generate, for each of the code elements, a soft-decision value corresponding to probability that a value of each of the code elements is a specific value, based on each of the code words read by the code word acquisition section, and supply, to the high-level soft-decision error correction section, the code word in which the soft-decision value is substituted for the value of each of the code elements. Thus, an effect is achieved that code word acquisition in which a code word is read is executed a plurality of times when the error correction by the low-level error correction section has failed and a soft-decision value is generated, based on each of the read code words.

Further, in the controller according to the embodiment of the present technology, the soft-decision value generation section may determine, for each of the code elements, frequency with which the specific value is read by the code word acquisition section, and may generate the soft-decision value, based on the frequency. Thus, an effect is achieved that the soft-decision value is generated, based on the frequency with which the specific value is read.

Furthermore, the controller according to the embodiment of the present technology may further include a threshold value control section configured to change, in a predetermined range, a threshold value every time the code word acquisition is executed, the threshold value being a threshold for determination of the values of the code elements, and the soft-decision value generation section may generate the soft-decision value, based on a maximum value or a minimum value of the threshold values when the code element with the specific value is read. Thus, an effect is achieved that the soft-decision value is generated, based on the maximum value or the minimum value of the threshold values when the code element with the specific value is read.

Moreover, in the controller according to the embodiment of the present technology, the soft-decision value generation section may the soft-decision value after the code word acquisition is executed a plurality of times, and the high-level soft-decision error correction section may execute the high-level soft-decision error correction when the soft-decision value is generated. Thus, an effect is achieved that the code word acquisition is executed a plurality of times, and then the soft-decision value is generated to execute the high-level soft-decision error correction.

Further, in the controller according to the embodiment of the present technology, the soft-decision value generation section may generate the soft-decision value every time the code word acquisition is executed, and the high-level soft-decision error correction section may execute the high-level soft-decision correction every time the soft-decision value is generated. Thus, an effect is achieved that the soft-decision value is generated every time the code word acquisition is executed to execute the high-level soft-decision error correction.

In the controller according to the embodiment of the present technology, the code word may include a plurality of code elements, and the low-level error correction section may generate, for each of the code elements, a soft-decision value corresponding to probability that a value of each of the code elements is a specific value, and may supply, to the high-level soft-decision error correction section, the code word in which the soft-decision value is substituted for the value of each of the code elements. Thus, an effect is achieved that the soft-decision value generated by the above-described low-level error correction section is supplied to the above-described high-level soft-decision error correction section.

According to an embodiment of the present technology, there is provided an information processing system including: a host computer configured to issue a read command that instructs reading of a code word from a storage section; a read processing section configured to read the code word from the storage section in response to the read command; a low-level error correction section configured to execute low-level error correction in which an error in the code word is corrected with use of a predetermined decoding algorithm; and a high-level soft-decision error correction section configured to execute high-level soft-decision error correction in which the error in the code word is corrected with use of a high-level algorithm when error correction by the low-level error correction section has failed, the high-level algorithm being a soft-decision decoding algorithm having higher error correction capability than error correction capability of the predetermined decoding algorithm. Thus, an effect is achieved that the error in the code word is corrected with use of the high-level algorithm when the error correction by the low-level error correction section has failed.

In the information processing system according to the embodiment of the present technology, the host computer may determine execution order of one or more commands including a correction start command, based on processing time of the high-level soft-decision error correction, and may supply the one or more commands in the execution order to the high-level soft-decision error correction section, the correction start command that instructs starting of the high-level soft-decision error correction when the error correction by the low-level error correction section has failed, and the high-level soft-decision error correction section may start the high-level soft-decision error correction when the error correction by the low-level error correction section has failed and the correction start command is supplied to the high-level soft-decision error correction section. Thus, an effect is achieved that the high-level soft-decision error correction is executed when the error correction by the low-level error correction section has failed and the correction start command is supplied.

In the information processing system according to the embodiment of the present technology, the host computer may issue an abort command that suspends the high-level soft-decision error correction when the error correction by the low-level error correction section has failed and interruption of the reading of the code word has occurred, and the high-level soft-decision error correction section may suspend, in response to the abort command, the high-level soft-decision error correction being in execution when the error correction by the low-level error correction section has failed. Thus, an effect is achieved that the high-level soft-decision error correction is suspended when interruption of the reading of the code word has occurred.

Moreover, in the information processing system according to the embodiment of the present technology, the host computer may further generate, based on kind of the code word, an enable signal indicating whether or not to execute the high-level soft-decision error correction, and the high-level soft-decision error correction section may execute the high-level soft-decision error correction in response to the enable signal when the error correction by the low-level error correction section has failed. Thus, an effect is achieved that the high-level soft-decision error correction is executed in response to the enable signal when the error correction by the low-level error correction section has failed.

Further, in the information processing system according to the embodiment of the present technology, the high-level algorithm may include a plurality of high-level algorithms, the host computer may specify one of the plurality of high-level algorithms, based on kind of the code word, and the high-level soft-decision error correction section may correct the error in the code word with use of the specified high-level algorithm when the error correction by the low-level error correction section has failed. Thus, an effect is achieved that the error in the code word is corrected with use of the specified high-level algorithm when the error correction by the low-level error correction section has failed.

According to an embodiment of the present technology, there is provided an information processing system including: a controller configured to read a code word from a storage section and execute low-level error correction in which an error in the code word is corrected with use of a predetermined decoding algorithm; and a host computer configured to execute high-level soft-decision error correction in which the error in the code word is corrected with use of a high-level algorithm when the error correction by the controller has failed, the high-level algorithm being a soft-decision decoding algorithm having higher error correction capability than error correction capability of the predetermined decoding algorithm.

In the information processing system according to the embodiment of the present technology, the host computer may issue a code word output command when the error correction by the controller has failed, the code word output command instructing the controller to output the code word, and the controller may read the code word from the storage section and outputs the code word to the host computer without executing the low-level error correction in response to the code word output command. Thus, an effect is achieved that the controller reads the code word from the storage section and outputs the code word to the host computer without executing the low-level error correction in response to the code word output command.

The above-described controller may generate correction success/failure information in the low-level error correction, and may output the correction success/failure information to the host computer, the correction success/failure information indicating whether or not error correction to the code word is successful, and the host computer may determine, based on the correction success/failure information, whether or not the error correction by the controller has failed. Thus, an effect is achieved that whether or not the error correction by the above-described controller has failed is determined by the host computer, based on the correction success/failure information.

In the embodiments of the present technology, a superior effect that error correction capability is allowed to be improved in the information processing system in which a soft-decision algorithm is used is achieved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIGS. 6A and 6B are diagrams illustrating a check matrix according to the first embodiment.

FIGS. 42A to 42D are diagrams illustrating an example of read data and soft-decision values according to the fourth embodiment.

FIG. 52 is a diagram for describing a method of generating a soft-decision value according to the fifth embodiment.

DETAILED DESCRIPTION

Some embodiments of the present technology will be described below. Description will be given in the following order.

1. First Embodiment (An example in which a memory controller performs error correction by a plurality of soft-decision decoding algorithms)

2. Second Embodiment (An example in which a memory controller performs error correction, based on control by a host computer)

3. Third Embodiment (An example in which the host computer performs error correction by a soft-decision decoding algorithm)

4. Fourth Embodiment (An example in which a soft-decision value is generated from data read with use of a same threshold value, and error correction is performed with use of the soft-decision value)

5. Fifth Embodiment (An example in which a soft-decision value is generated from data read with use of different threshold values, and error correction is performed with use of the soft-decision value)

1. First Embodiment

Configuration Example of Information Processing System

Figure 1:
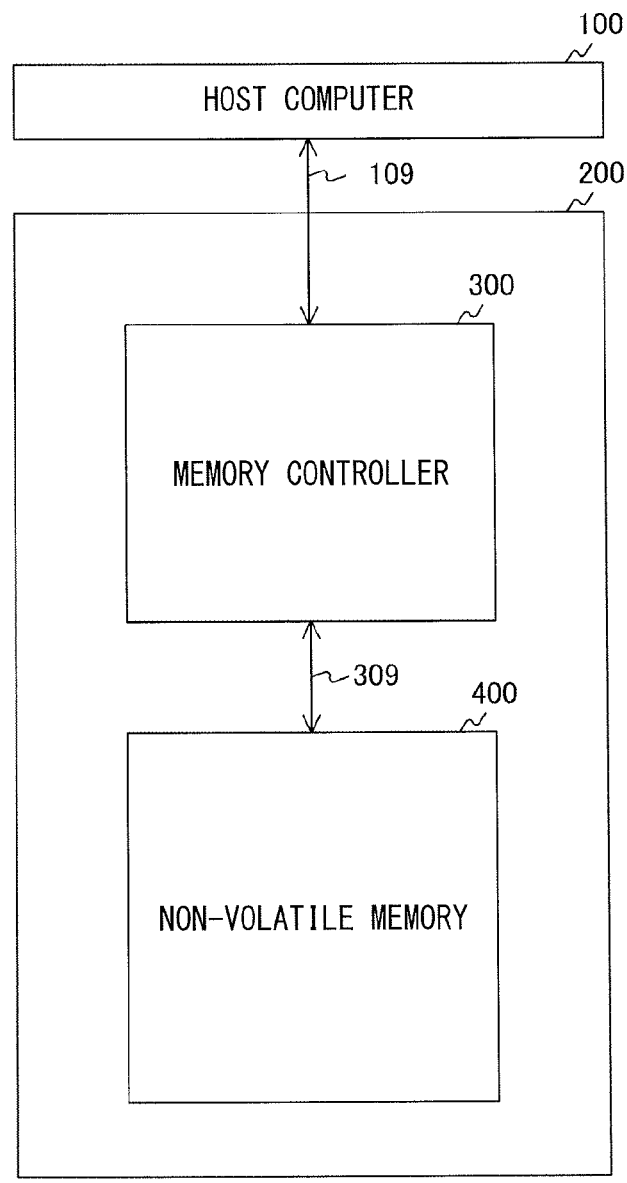
FIG. 1 is a block diagram illustrating a configuration example of an information processing system according to a first embodiment.

FIG. 1 is a block diagram illustrating a configuration example of an information processing system according to a first embodiment. The information processing system includes a host computer 100 and a storage 200.

The host computer 100 is configured to control the entire information processing system. More specifically, the host computer 100 generates commands and write data, and supplies the commands and the write data to the storage 200 through a signal line 109. Moreover, the host computer 100 receives read data from the storage 200. The commands may be used to control the storage 200, and examples of the commands may include a write command for writing write data, and a read command for reading read data.

The storage 200 includes a memory controller 300 and a non-volatile memory 400. The memory controller 300 is configured to control the non-volatile memory 400. When the memory controller 300 receives the write command and the write data from the host computer 100, the memory controller 300 generates an error detection and correction code (ECC) from the write data. More specifically, the memory controller 300 converts (i.e., encodes) the write data into a code word containing the write data and parity. The memory controller 300 accesses the non-volatile memory 400 through a signal line 309 to write the encoded data to the non-volatile memory 400.

Moreover, when the memory controller 300 receives the read command from the host computer 100, the memory controller 300 accesses the non-volatile memory 400 through the signal line 309 to read the encoded data. Then, the memory controller 300 converts (i.e., decodes) the encoded data into original data before encoded. In decoding, the memory controller 300 detects and corrects an error in data, based on the ECC. The memory controller 300 supplies corrected data to the host computer 100.

It is to be noted that the memory controller 300 corresponds to a specific example of "controller" in an embodiment of the present technology.

The non-volatile memory 400 holds data, based on control by the memory controller 300. For example, a ReRAM may be used as the non-volatile memory 400. It is to be noted that, instead of the ReRAM, a flash memory, a PCRAM, an MRAM, or the like may be used as the non-volatile memory 400. Moreover, the memory controller 300 stores data in the non-volatile memory 400; however, data may be stored in any storage medium or any storage device capable of holding data other than the non-volatile memory 400. One example of such a storage device may be a hard disk drive (HDD).

Configuration Example of Host Computer

Figure 2:
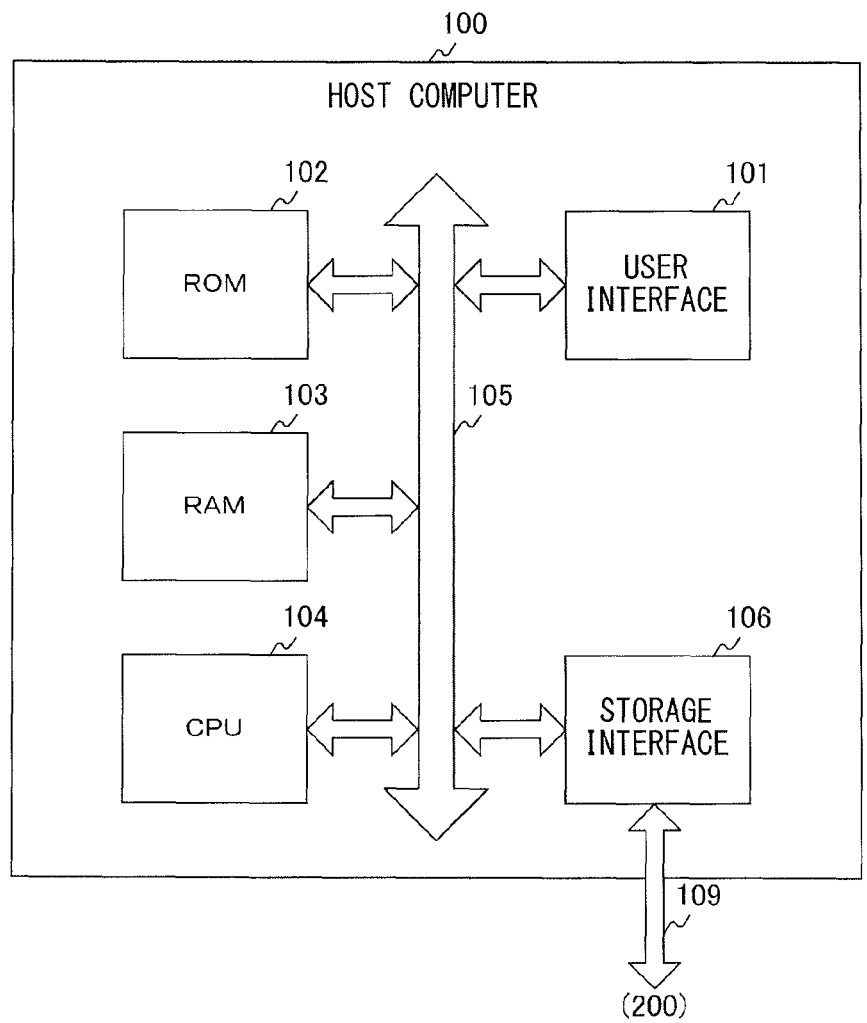
FIG. 2 is a block diagram illustrating a configuration example of a host computer according to the first embodiment.

FIG. 2 is a block diagram illustrating a configuration example of the host computer 100 according to the first embodiment. The host computer 100 includes a ROM (Read Only Memory) 102, a RAM (Random Access Memory) 103, and a CPU (Central Processing Unit) 104. Moreover, the host computer 100 includes a user interface 101, a bus 105, and a storage interface 106.

The user interface 101 is an interface for mutually exchanging input data and output data between the information processing system and a user of the information processing system. The ROM 102 holds a program executed by the CPU 104, and the like. The RAM 103 temporarily holds data necessary for processing that is executed by the CPU 104. The CPU 104 is configured to control the entire host computer 100. The bus 105 is a common path for mutually exchanging data between the user interface 101, the ROM 102, the RAM 103, the CPU 104, and the storage interface 106. The storage interface 106 is an interface for mutually exchanging data and commands between the host computer 100 and the storage 200.

Configuration Example of Memory Controller

Figure 3:
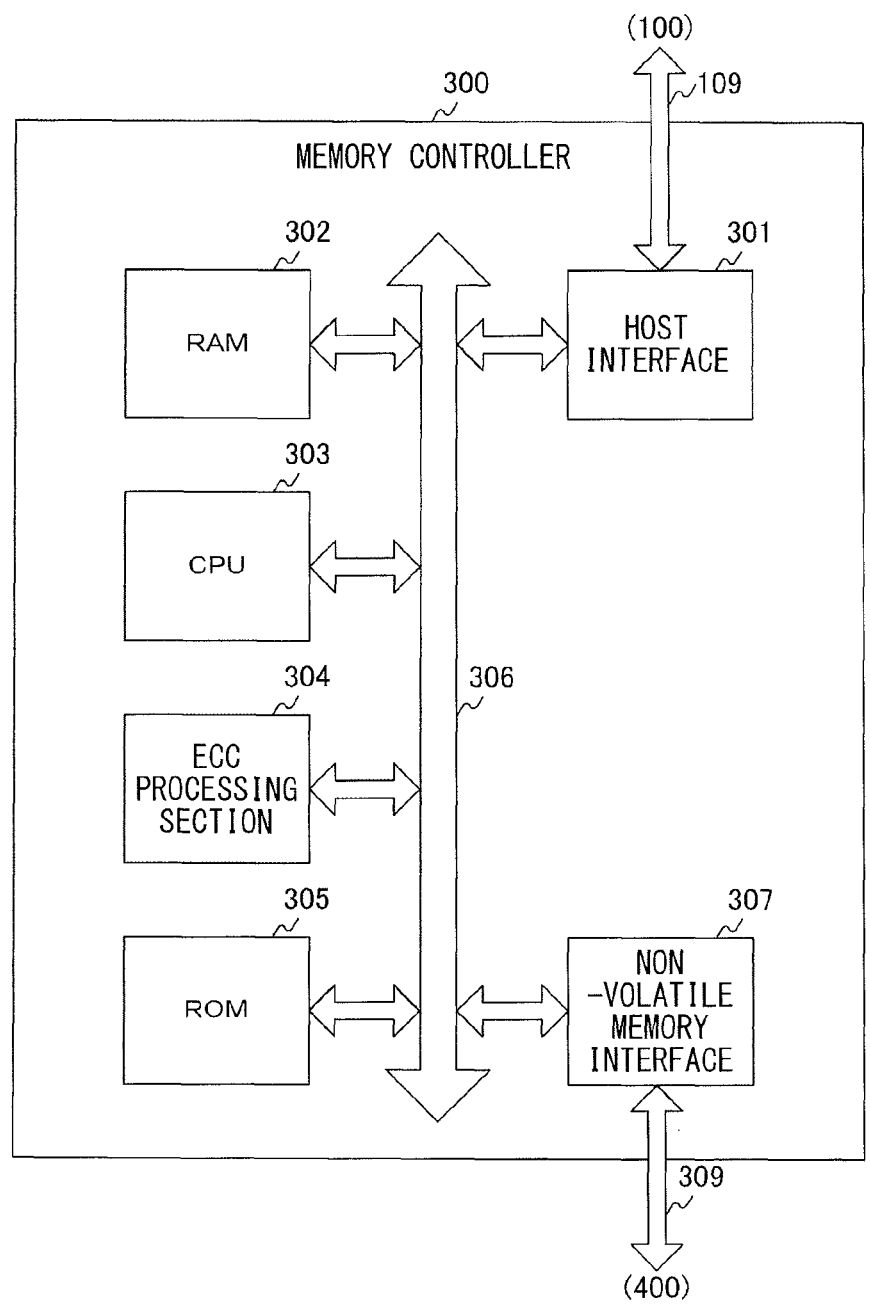
FIG. 3 is a block diagram illustrating a configuration example of a memory controller according to the first embodiment.

FIG. 3 is a block diagram illustrating a configuration example of the memory controller 300 according to the first embodiment. The memory controller 300 includes a host interface 301, a RAM 302, a CPU 303, an ECC processing section 304, a ROM 305, a bus 306, and a non-volatile memory interface 307.

The host interface 301 allows the memory controller 300 to mutually exchange data and commands with the host computer 100. The RAM 302 temporarily holds data necessary for processing that is executed by the CPU 303.

The ECC processing section 304 is configured to encode write data and to decode read data. In encoding of write data, the ECC processing section 304 encodes a plurality of write data on a predetermined unit basis by adding parity to each of the write data. Encoding is performed with use of an algorithm capable of correcting an error by a soft-decision decoding algorithm. Moreover, each of the data encoded in the predetermined unit is referred to as "code word". Then, the ECC processing section 304 supplies the encoded write data to the non-volatile memory 400 through the bus 306.

Further, the ECC processing section 304 decodes encoded read data into original data. In this decoding, the ECC processing section 304 corrects an error in the code word with use of the soft-decision decoding algorithm. The ECC processing section 304 supplies, to the CPU 303 through the bus 306, correction success/failure information indicating whether or not error correction has failed. Moreover, when the error correction is successful, the ECC processing section 304 supplies decoded data to the host computer 100 through the bus 306.

The CPU 303 is configured to control the entire memory controller 300. Moreover, when the CPU 303 receives, from the ECC processing section 304, correction success/failure information indicating that the error correction has failed, the CPU 303 corrects the error in the code word with use of a soft-decision decoding algorithm having higher error correction capability than that of the algorithm used by the ECC processing section 304.

The ROM 305 holds a program executed by the CPU 303, and the like. For example, the ROM 305 may hold a program for executing a process of correcting an error by a soft-decision decoding algorithm.

The bus 306 is a common path for mutually exchanging data between the host interface 301, the RAM 302, the CPU 303, the ECC processing section 304, the ROM 305, and the non-volatile memory interface 307. The non-volatile memory interface 307 is an interface for allowing the memory controller 300 to mutually exchange data and commands with the non-volatile memory 400.

Figure 4:
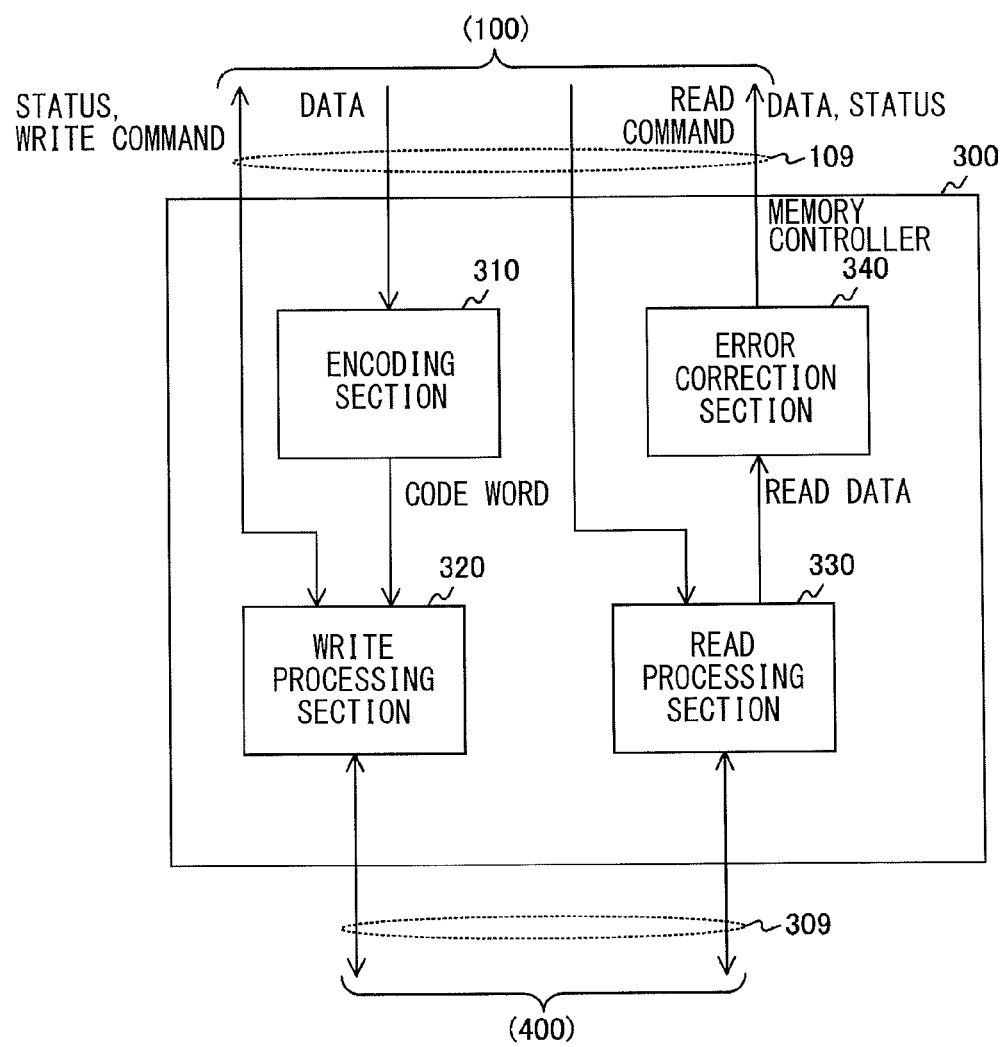
FIG. 4 is a block diagram illustrating a functional configuration example of the memory controller according to the first embodiment.

FIG. 4 is a block diagram illustrating a functional configuration example of the memory controller 300 according to the first embodiment. The memory controller 300 includes an encoding section 310, a write processing section 320, a read processing section 330, and an error correction section 340. The encoding section 310 in FIG. 4 is implemented by the ECC processing section 304 in FIG. 3. Moreover, the write processing section 320 and the read processing section 330 in FIG. 4 are implemented by the host interface 301, the RAM 302, the CPU 303, the ROM 305, the bus 306, the non-volatile memory interface 307 in FIG. 3, and the like. The error correction section 340 in FIG. 4 is implemented by the RAM 302, the CPU 303, the ECC processing section 304, the ROM 305 in FIG. 3, and the like.

The encoding section 310 is configured to encode write data into a code word. In this encoding, the write data is encoded into a code in which an error is to be corrected by a soft-decision decoding algorithm. More specifically, the write data is encoded into an LDPC (Low Density Parity Check) code or the like. The encoding section 310 supplies the generated code word to the write processing section 320.

It is to be noted that the encoding section 310 encodes the write data into the LDPC code; however, the write data may be encoded into any code in which an error is allowed to be corrected with use of the soft-decision decoding algorithm, other than the LDPC code. For example, the encoding section 310 may encode the write data into a convolution code or a turbo code.

The write processing section 320 executes a process of writing encoded write data to the non-volatile memory 400 in response to the write command. When the write processing section 320 receives the write command from the host computer 100, the write processing section 320 acquires the write data encoded into the code word from the encoding section 310, and accesses the non-volatile memory 400 to write the code word to a memory address specified by the command.

The read processing section 330 is configured to execute a process of reading read data from the non-volatile memory 400 in response to the read command. When the read processing section 330 receives the read command from the host computer 100, the read processing section 330 accesses the non-volatile memory 400 to read data corresponding to a code word as read data from a memory address specified by the command. A value of each bit in the code word may be a value of "0" or "1", i.e., a value that is read by a hard-decision value. The read processing section 330 supplies the read data to the error correction section 340.

The error correction section 340 corrects an error in the read data (data equivalent to a code word). The error correction section 340 first corrects the error in the read data with use of an algorithm having low error correction capability (hereinafter referred to as "low-level algorithm") of a plurality of decoding algorithms. In a case where error correction by the low-level algorithm has failed, the error correction section 340 corrects the error in the read data with use of a soft-decision decoding algorithm having higher error correction capability (hereinafter referred to as "high-level algorithm") than that of the low-level algorithm. In a case where error correction by the high-level algorithm is successful, the error correction section 340 outputs, to the host computer 100, original data (k bits) that is the corrected code word without parity. Moreover, the error correction section 340 generates a status to which information indicating whether or not the correction is successful is written, and outputs the status to the host computer 100.

The level of the error correction capability of the soft-decision decoding algorithm may be represented by a data error rate such as a BER (Bit Error Rate) or communication quality such as a CNR (Carrier to Noise Ratio). For example, in a case where the soft-decision decoding algorithm is used, the lower communication quality (such as the CNR) necessary to suppress the error rate (such as the BER) to a certain value or less is, the higher the error correction capability of the soft-decision decoding algorithm is. Alternatively, the lower the error rate with fixed communication quality is, the higher the error correction capability of the soft-decision decoding algorithm is.

Figure 5:
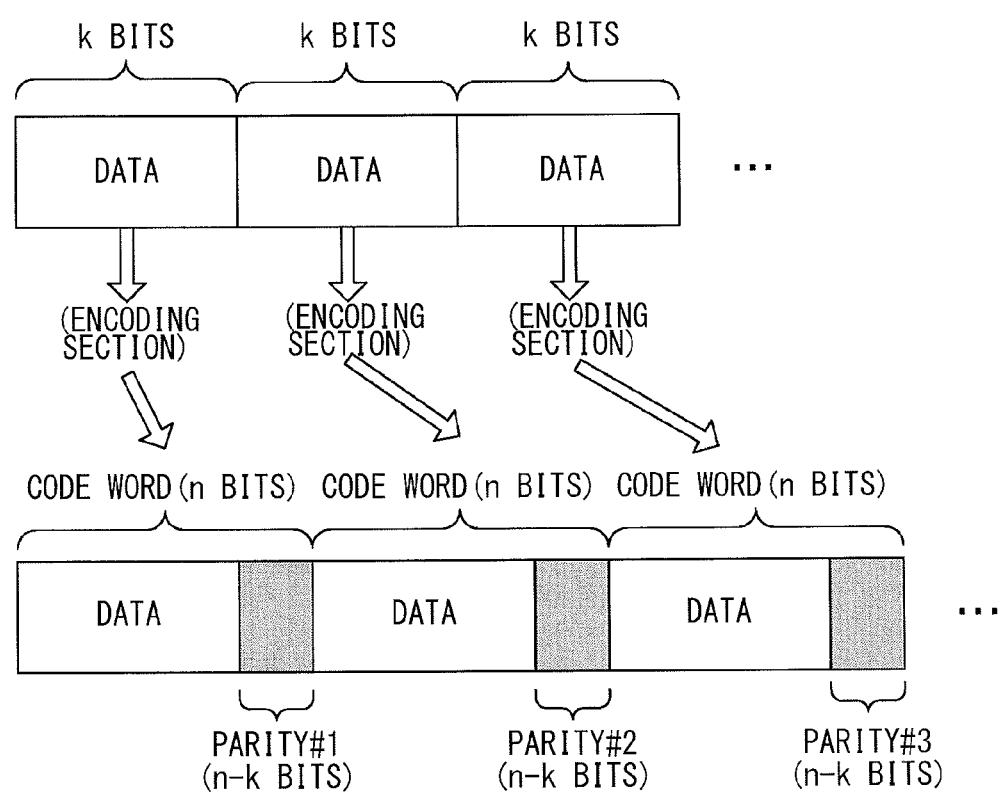
FIG. 5 is a diagram illustrating an example of a data structure of an error correction code according to the first embodiment.

FIG. 5 is a diagram illustrating an example of a data structure of a code word according to the first embodiment. As illustrated in FIG. 5, the encoding section 310 encodes each of k-bit data into an n-bit code word, where k is an integer, and n is an integer larger than k. Each of the code words contains k-bit data and n−k-bit parity. Each of the code words is an error detection and correction code (ECC). Thus, the code word contains data, as it is, that is to be encoded, and a code capable of easily separating the code word into data and parity is referred to as "systematic code". It is to be noted that data may be encoded into a nonsystematic code.

FIGS. 6A and 6B are diagrams illustrating an example of a data structure of an error correction code according to the first embodiment. In an LDPC encoding system, a check matrix H is generated by the error correction section 340. The check matrix H is a check matrix in which the number of "1"s (hereinafter referred to as "weight") in rows and columns is fixed. The weights of the rows and the columns are so set as to allow the number of "1"s in the entire check matrix to be sparse. FIG. 6A is a diagram illustrating an example of a weight of the check matrix H. In this example, the weight of each column is "3", and the weight of each row is "6". FIG. 6B is a diagram illustrating an example of the check matrix H having a weight illustrated in FIG. 6A.

Figures 7A, 7B:
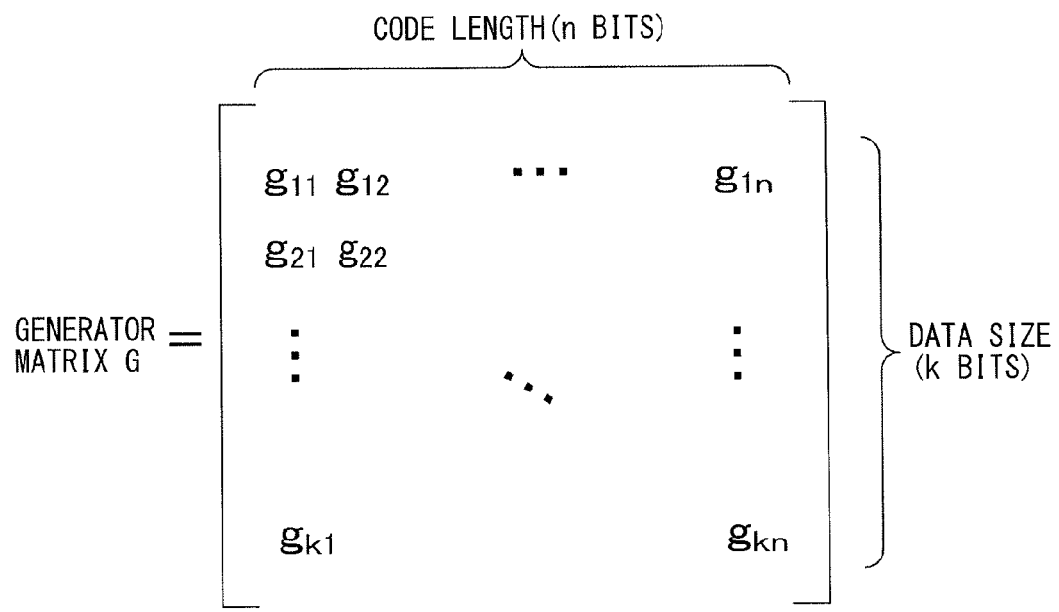
FIGS. 7A and 7B are diagrams for describing an example of a method of generating the error correction code according to the first embodiment.

FIGS. 7A and 7B are diagrams for describing a method of using a generator matrix according to the first embodiment. FIG. 7A is a diagram illustrating an example of the generator matrix G according to the first embodiment. The encoding section 310 generates the generator matrix G illustrated in FIG. 7A from the check matrix H exemplified in FIGS. 6A and 6B with use of the following expression. It is to be noted that encoding is not limited to encoding using a check matrix necessitating the following expression. For example, encoding may be performed with use of a check matrix with a LDGM (Low Density Generation matrix) configuration.

$$G \times H^T = 0$$

In a case where the number of columns and the number of rows in the check matrix H is n and n−k, respectively, as illustrated in FIG. 7A, the generator matrix G having an n-number of columns and a k-number of rows is generated from the check matrix H. FIG. 7B illustrates an example of an expression for generating a code word from the generator matrix and data. As illustrated in FIG. 7B, a code word is generated by the product of the generator matrix G and data that is to be encoded. The code word contains k-bit data and n−k-bit parity. It is to be noted that the encoding section 310 is configured to generate the generator matrix G; however, the configuration of the encoding section 310 is not limited thereto. The encoding section 310 may be configured to store the generator matrix G generated in advance in a generator matrix storage section such as a ROM, and then to read the generator matrix from the generator matrix storage section.

Configuration Example of Error Correction Section

Figure 8:
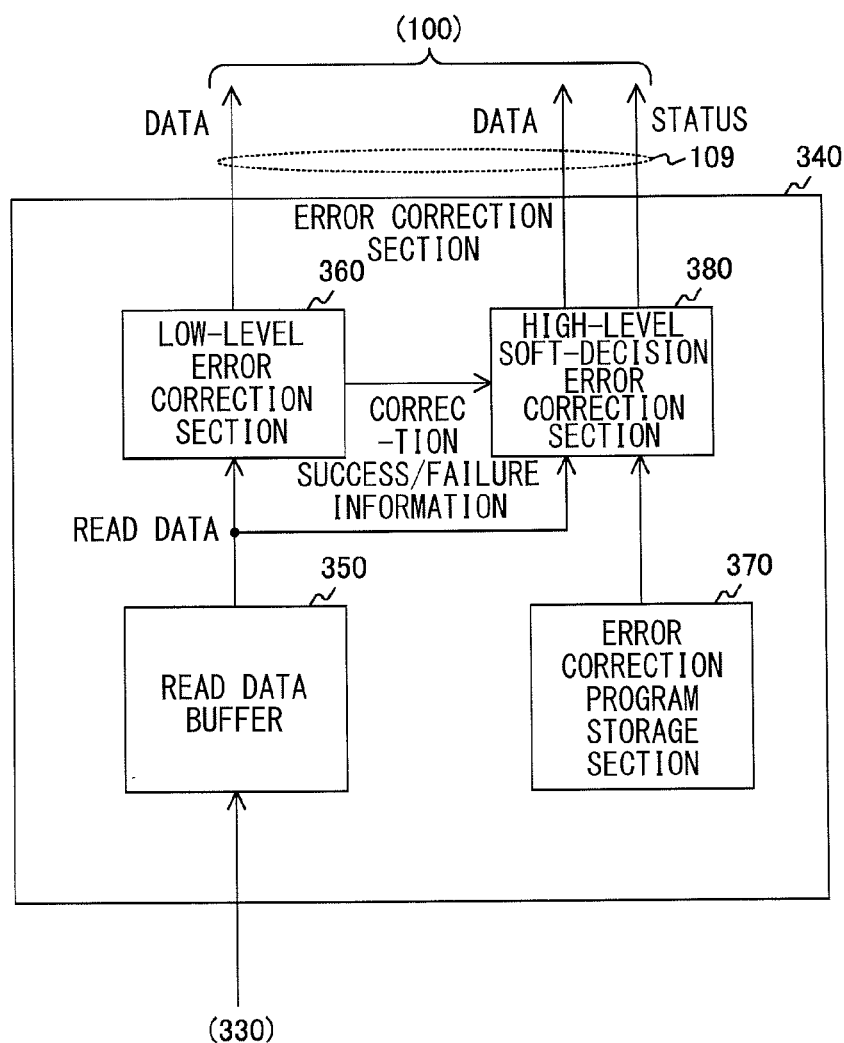
FIG. 8 is a block diagram illustrating a configuration example of an error correction section according to the first embodiment.

FIG. 8 is a block diagram illustrating a configuration example of the error correction section 340 according to the first embodiment. The error correction section 340 includes a read data buffer 350, a low-level error correction section 360, an error correction program storage section 370, and a high-level soft-decision error correction section 380.

The read data buffer 350 is configured to hold read data read by the read processing section 330.

The low-level error correction section 360 is configured to correct an error in read data with use of a decoding algorithm having lower error correction capability (a low-level algorithm) than that of an algorithm in the high-level soft-decision error correction section 380. For example, as the low-level algorithm, a Min-Sum algorithm that is a soft-decision decoding algorithm may be used. It is to be noted that the low-level algorithm is not limited to the soft-decision decoding algorithm. For example, any decoding algorithm capable of correcting an error in read data such as a Bit-flipping algorithm other than the soft-decision algorithm may be used. The low-level error correction section 360 reads read data from the read data buffer 350, and corrects an error in the read data with use of the low-level algorithm. In a case where error correction is successful, the low-level error correction section 360 outputs, to the host computer 100, original data (k bits) that is the corrected read data without parity. Moreover, the low-level error correction section 360 supplies, to the high-level soft-decision error correction section 380, correction success/failure information indicating whether or not the correction is successful.

The error correction program storage section 370 is configured to hold an error correction program for executing a process of correcting an error by a high-level algorithm.

The high-level soft-decision error correction section 380 is configured to correct an error in read data with use of a soft-decision decoding algorithm having higher error correction capability (a high-level algorithm) than that of the algorithm in the low-level error correction section 360. As the high-level algorithm, for example, a BP (Brief-Propagation) algorithm may be used. The BP algorithm is also called "sum-product algorithm". When the high-level soft-decision error correction section 380 receives correction success/failure information indicating that the correction has failed from the low-level error correction section 360, the high-level soft-decision error correction section 380 reads read data to which the error correction has failed. The high-level soft-decision error correction section 380 starts error correction to the read data by reading an error correction program from the error correction program storage section 370 and then executing the error correction program. In a case where the error correction is successful, the high-level soft-decision error correction section 380 outputs, to the host computer 100, original data (k bits) that is corrected read data without parity. Moreover, the high-level soft-decision error correction section 380 generates a status to which information indicating whether or not the correction is successful is written, and outputs the status to the host computer 100.

As described above, since the value of each bit in the read data is a hard-decision value, the hard-decision value is input to the low-level error correction section 360 and the high-level soft-decision error correction section 380.

It is to be noted that the low-level error correction section 360 is allowed to correct an error with use of any soft-decision decoding algorithm, other than the Min-Sum algorithm, having lower error correction capability than that of the algorithm in the high-level soft-decision error correction section 380. Moreover, the high-level soft-decision error correction section 380 is allowed to correct an error with use of any soft-decision decoding algorithm, other than the BP algorithm, having higher error correction capability than that of the algorithm in the low-level error correction section 360.

Configuration Example of Low-Level Error Correction Section

Figure 9:
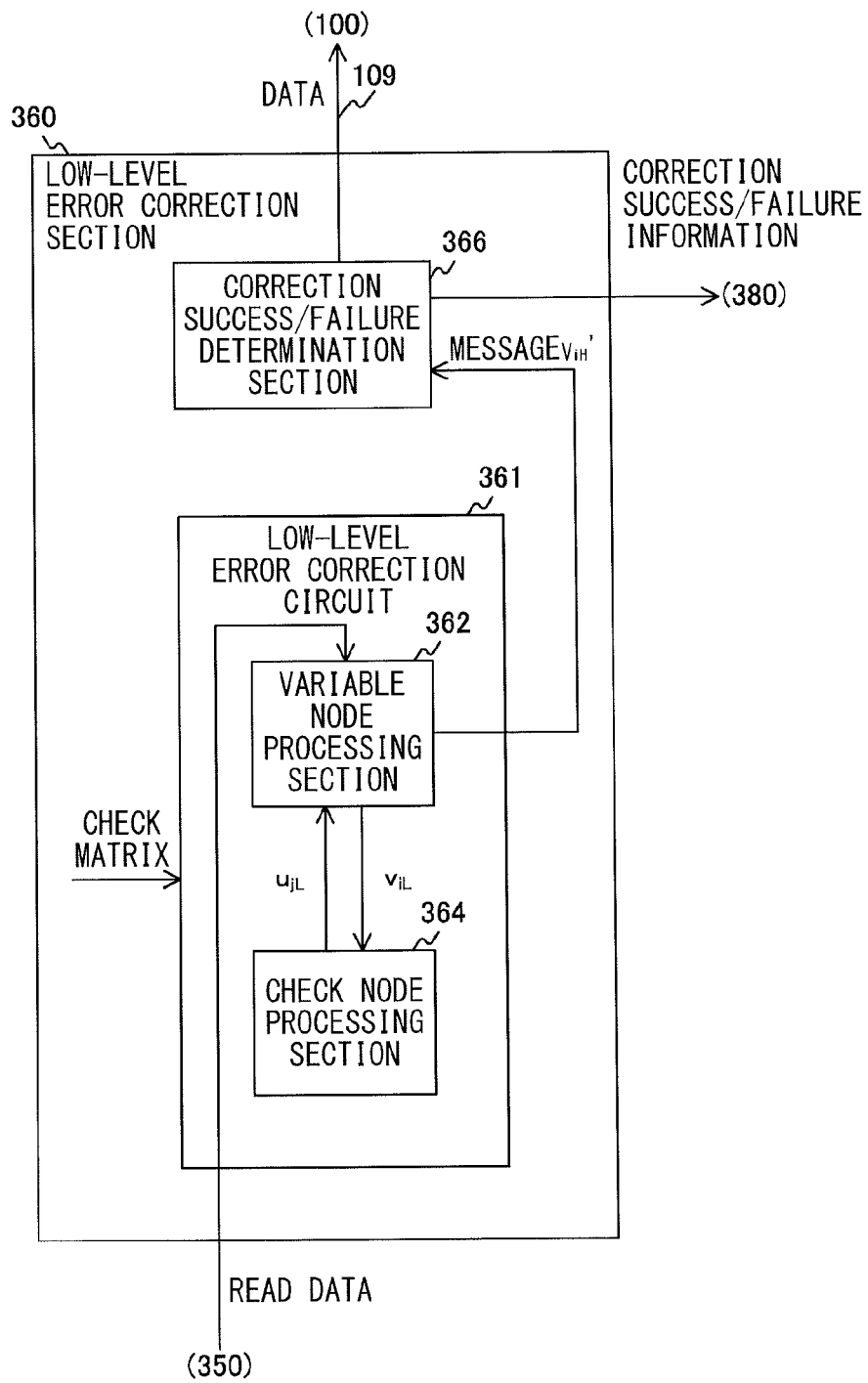
FIG. 9 is a block diagram illustrating a configuration example of a low-level error correction section according to the first embodiment.

FIG. 9 is a block diagram illustrating a configuration example of the low-level error correction section 360 according to the first embodiment. The low-level error correction section 360 includes a low-level error correction circuit 361 and a correction success/failure determination section 366.

The low-level error correction circuit 361 is a circuit configured to correct an error in read data with use of a soft-decision decoding algorithm. In the low-level error correction circuit 361, for example, as the soft-decision decoding algorithm, a Min-Sum algorithm may be used. In a case where the Min-Sum algorithm is used, the low-level error correction circuit 361 includes a variable node processing section 362 and a check node processing section 364.

The variable node processing section 362 is configured to perform detection and correction of an error in read data, based on a result of a parity check in the check node processing section 364. Moreover, the check node processing section 364 is configured to perform a parity check on read data.

More specifically, the variable node processing section 362 acquires read data from the read data buffer 350, and generates a message $u_{0\_iL}$, based on the read data. The message $u_{0\_iL}$ is a real variable representing a likelihood that a value of an ith code element (for example, bit) in a code word before being corrected is "0" or "1". Moreover, "i" is an integer of 0 to n−1, where n is a code length of a code word. The code element may be a minimum unit configuring a code word, and is also called "symbol".

The variable node processing section 362 generates a message $v_{iL}$, based on the message $u_{0\_jL}$ and the result of the parity check by the check node processing section 364, and outputs the message $v_{iL}$ to the check node processing section 364. The message $v_{iL}$ is a real variable representing a likelihood of a value of an iLth code element (for example, bit) in the corrected code word. For example, a log-likelihood ratio $\Lambda(r_{iL})$ may be generated as the message $u_{0\_iL}$. The log-likelihood ratio $\Lambda(r_{iL})$ is a log of a ratio of probability that the value of the iLth bit of the code word is "0" to probability that the value of the iLth bit of the code word is "1", and may be determined by the following expression, for example.

[Math. 1]

$$\Lambda(r_{iL}) = \ln \frac{P(r_{iL} = 1 \mid r)}{P(r_{iL} = 0 \mid r)} \qquad \text{Expression 1}$$

where r is received read data, $P(r_{iL}=1|r)$ is probability that the value of an iLth bit $r_{iL}$ in the read data is "1", and $P(r_{iL}=0|r)$ is probability that the value of the iLth bit $r_{iL}$ in the read data is "0".

It is to be noted that the message $u_{0\_iL}$ is not limited to the log-likelihood ratio, as long as the message $u_{0\_iL}$ is a value representing likelihood. For example, probability that the value of $r_{iL}$ is "1" or "0" may be adopted as the message $u_{0\_iL}$. This is also applicable to other messages (such as $v_{iL}$ and $u_{jL}$). In the low-level error correction circuit 361, these messages may be represented by, for example, signed fixed-point data.

The check node processing section 364 performs a parity check, based on the message $v_{iL}$, generates a message $u_{jL}$, based on the result of the parity check, and then outputs the message $u_{jL}$ to the variable node processing section 362. "jL" may be an integer of 0 to (n−k)−1, where k is a size of data that is to be encoded.

The variable node processing section 362 and the check node processing section 364 exchange messages therebetween until a predetermined termination condition is satisfied. For example, when messages are exchanged a fixed number of times or when an absolute value of the log-likelihood ratio exceeds a threshold value, it may be determined that the termination condition is satisfied.

When the termination condition is satisfied, the variable node processing section 362 generates a message $v_{iL}'$ that is a correction result, based on the received message $u_{jL}$, and outputs the message $v_{iL}'$ to the correction success/failure determination section 366.

The correction success/failure determination section 366 is configured to determine whether or not error correction is successful. For example, in a case where all of parity checks on respective rows of the check matrix have been passed, the correction success/failure determination section 366 may determine that the correction is successful. On the other hand, in a case where any one of the parity checks has failed, the correction success/failure determination section 366 may determine that the correction has failed. It is to be noted that the correction success/failure determination section 366 may determine whether or not the correction is successful by determination as to whether or not all of absolute values of the messages $v_{iL}'$ exceed a predetermined threshold value. In a case where the correction is successful, the correction success/failure determination section 366 generates an error-corrected code word, based on the message $V_{iL}'$, and outputs, to the host computer 100, original data (k bits) that is the code word without parity. Moreover, the correction success/failure determination section 366 supplies, to the high-level soft-decision error correction section 380, correction success/failure information indicating whether or not the correction is successful.

Figure 10:
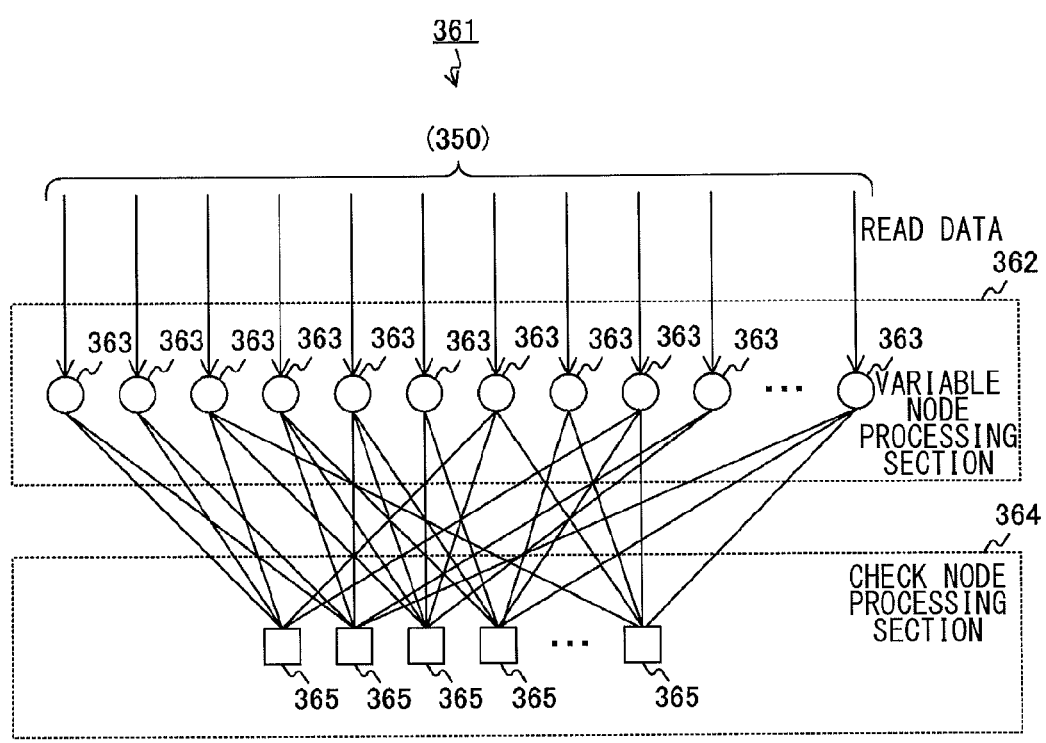
FIG. 10 is a diagram illustrating a configuration example of a low-level error correction circuit according to the first embodiment.

FIG. 10 is a diagram illustrating a configuration example of the low-level error correction circuit 361 according to the first embodiment. In the low-level error correction circuit 361, the variable node processing section 362 includes an equal number of variable nodes 363 to the number of bits of the code word (i.e., the number of columns of the check matrix H).

Moreover, the check node processing section 364 includes an equal number of check nodes 365 to the number of parity bits (i.e., the number of rows of the check matrix H). Then, the variable nodes 363 and the check nodes 365 are connected to each other, based on a value of a component of the check matrix H. More specifically, when a value of a component in a jLth row and an iLth column is "1", a jLth check node 365 and an iLth variable node 363 are connected to each other, and when the value of the component is "0", these nodes are not connected to each other.

The iLth variable node 363 performs detection and correction of an error in an iLth bit of read data, based on a result of the parity check by the check node 365. The jLth check node 365 performs a parity check corresponding to the jLth row of the check matrix H.

More specifically, the iLth variable node 363 acquires the iLth bit of the read data from the read data buffer 350, and generates the message $u_{0\_iL}$, based on the value of the bit. In a case where the message $u_{0\_iL}$ is the log-likelihood ratio, when the value of the iLth bit is "1", a predetermined positive value is set to $u_{0\_iL}$. On the other hand, when the value of the iLth bit is "0", a predetermined negative value is set to $u_{0\_iL}$.

After the message $u_{0\_iL}$ is generated, the variable node 363 sets an initial value (for example, "0") to the message $u_{jL}$ from each of the check nodes 365 connected thereto. Then, the variable node 363 determines the message $v_{iL}$ by calculation with use of the following expression, and outputs the message $v_{iL}$ to one of the check nodes 365 connected thereto.

[Math. 2]

$$v_{iL} = u_{0\_iL} + \sum_{jL=1}^{d_v-1} u_{jL} \qquad \text{Expression 2}$$

where $d_v$ is the number of "1"s (i.e., weight) in a column of the check matrix H.

When the check node 365 receives the message $v_{iL}$ from each of the variable nodes 363 connected thereto, the check node 365 determines the message $u_{jL}$ by calculation with use of the following expression, and outputs the message $u_{jL}$ to one of the variable nodes 363 connected thereto.

[Math. 3]

$$u_{jL} = \min_{iL=1}^{d_c-1} |v_{iL}| \times \prod_{iL=1}^{d_c-1} \text{sign}(v_{iL}) \qquad \text{Expression 3}$$

In the above expression, $\min|v_{iL}|$ represents a minimum value of $v_{iL}$. Moreover, sign(x) is a function returning a value of "1" to an input value x in a case of x≤0, and returning a value of "−1" to the input value x in a case of x<0. Further, $d_e$ is the number of "1"s (i.e., weight) in a row of the check matrix H. In this expression, a logarithmic arithmetic is not applicable. On the other hand, in a BP algorithm, the logarithmic arithmetic is necessary. Therefore, compared to a circuit using the BP algorithm, the circuit size of the low-level error correction section 360 is allowed to be relatively reduced.

The variable nodes 363 and the check nodes 365 generate the messages $v_{iL}$ and $u_{jL}$ with use of the expression 2 and the expression 4 until the predetermined termination condition is satisfied, and exchange these messages therebetween.

When the termination condition is satisfied, the variable node 363 generates the message $v_{iL}'$ with use of the following expression, and supplies the message $v_{iL}'$ to the correction success/failure determination section 366. The correction success/failure determination section 366 determines the value of the iLth bit of the code word, based on the message $v_{iL}'$. For example, the correction success/failure determination section 366 determines the value of the iLth bit to "1" in a case of $v_{iL}'≥0$, and to "0" in a case of $v_{iL}'<0$. Thus, the error in the read data is corrected.

[Math. 4]

$$v_{iL}' = u_{0\_iL} + \sum_{jL=1}^{d_v} u_{jL} \qquad \text{Expression 4}$$

It is to be noted that the variable node 363 may execute computation of the expression 2 by separating the expression 2 into the expression 4 and an expression 5. In this case, in a case where the termination condition is not satisfied, the variable node 363 outputs, to the check node 365, the message $v_{iL}$ calculated by the expression 5. Then, when the termination condition is satisfied, the variable node 363 supplies the message $v_{iL}'$ calculated by the expression 5 to the correction success/failure determination section 366.

$$v_{iL} = v_{iL}' - u_{d_v} \qquad \text{Expression 5}$$

where $u_{d_v}$ is a message from a $d_v$th check node 365 connected to the variable node 363.

Figure 11A:
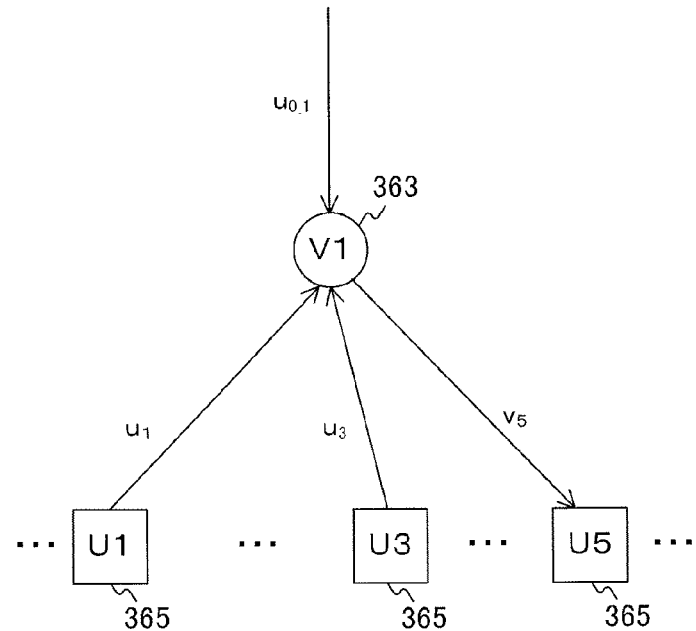
FIGS. 11A and 11B are diagrams illustrating an example of message exchange between a variable node and a check node according to the first embodiment.
Figure 11B:
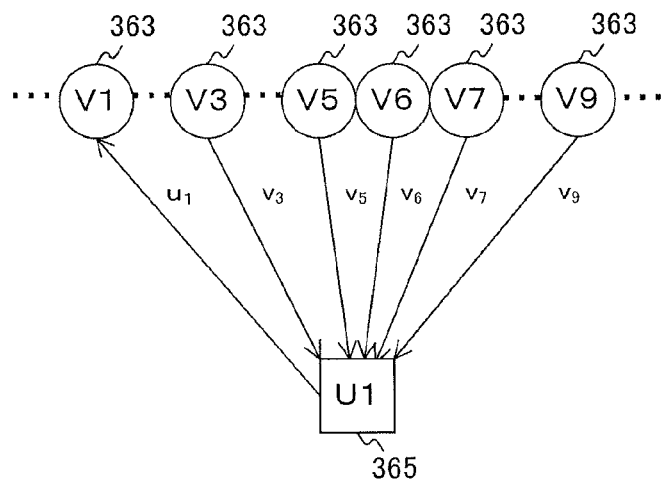

FIGS. 11A and 11B are diagrams illustrating an example of message exchange between the variable nodes 363 and the check nodes 365 according to the first embodiment. FIG. 11A is a diagram illustrating an example of message exchange when the variable node 363 generates the message $v_{iL}$. For example, it is assumed that a first variable node V1 is connected to first, third, and fifth check nodes U1, U3, and U5. In this case, when the variable node V1 generates a message $u_{0\_1}$, based on read data that is read, and receives messages $u_1$ and $u_3$ from the check nodes U1 and U3, the variable node V1 generates a message $v_5$, based on these messages, and outputs the message $v_5$ to the check node U5.

FIG. 11B is a diagram illustrating an example of message exchange when the check node 365 generates a message $u_j$. For example, it is assumed that the first check node U1 is connected to first, third, fifth, sixth, seventh, and ninth variable nodes V1, V3, V5, V6, V7, and V9. In this case, when the check node U1 receives messages $v_3$, $v_5$, $v_6$, $v_7$, and $v_9$ from the variable nodes V3, V5, V6, V7, and V9, the check node U1 generates the message $u_1$, based on the these messages, and outputs the message $u_1$ to the variable node V1.

High-Level Soft-Decision Error Correction Section

Figure 12:
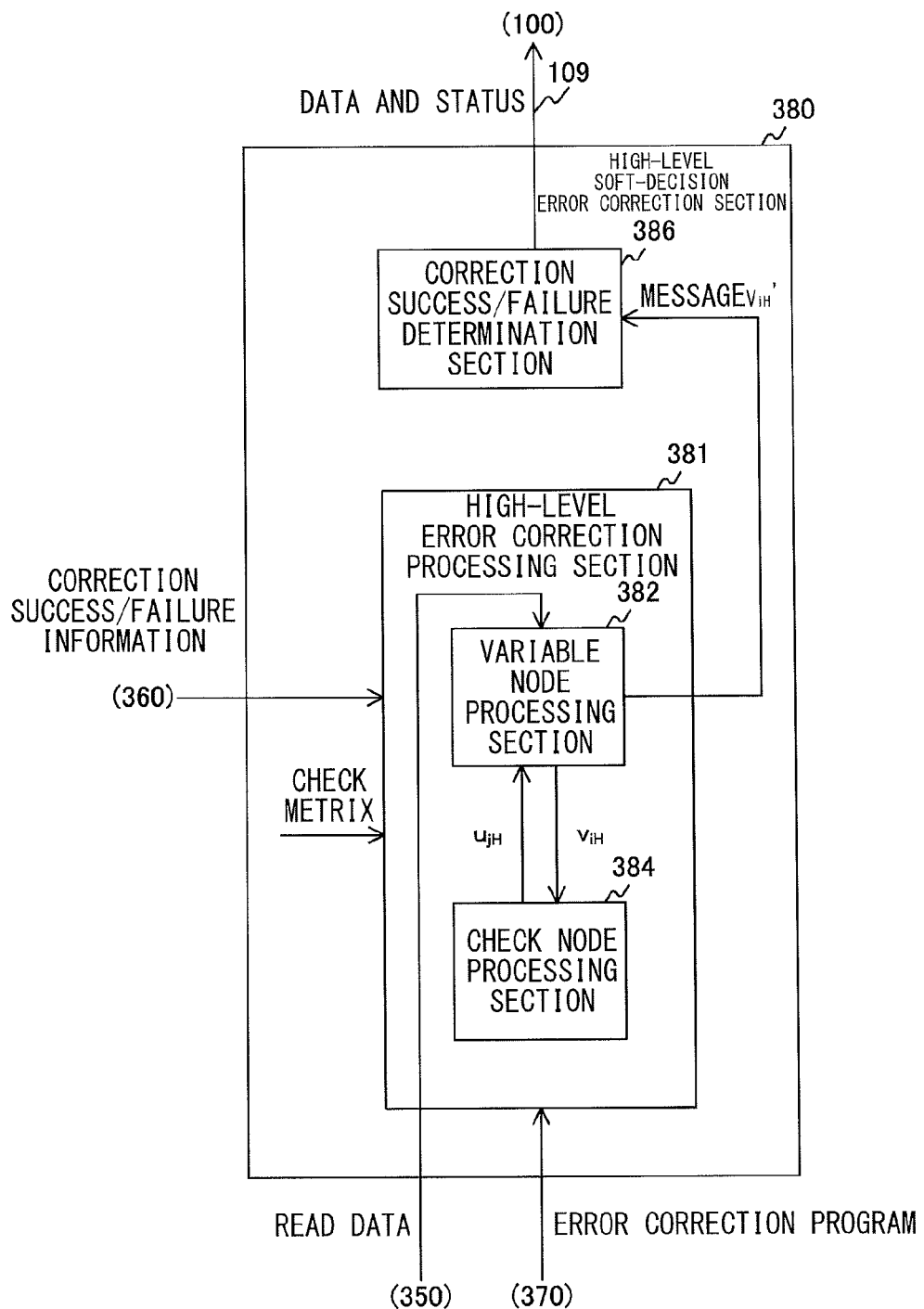
FIG. 12 is a diagram illustrating a configuration example of a high-level soft-decision error correction section according to the first embodiment.

FIG. 12 is a diagram illustrating a configuration example of the high-level soft-decision error correction section 380 according to the first embodiment. The high-level soft-decision error correction section 380 includes a high-level error correction processing section 381 and a correction success/failure determination section 386.

The high-level error correction processing section 381 is configured to correct an error in read data with use of a soft-decision decoding algorithm. In the high-level error correction processing section 381, as the soft-decision decoding algorithm, for example, a BP algorithm may be used. In a case where the BP algorithm is used, the high-level error correction processing section 381 includes a variable node processing section 382 and a check node processing section 384.

In a case where the high-level error correction processing section 381 receives, from the low-level error correction section 360, correction success/failure information indicating that correction has failed, the high-level error correction processing section 381 reads an error correction program from the error correction program storage section 370, and executes the error correction program. Processing in the variable node processing section 382 and the check node processing section 384 is executed by the error correction program. In the high-level error correction processing section 381, a message may be represented by signed floating-point data.

The configuration of the variable node processing section 382 is similar to the configuration of the variable node processing section 362 in the low-level error correction section 360, except that a variable node 383 uses the following expression 6 instead of the expression 2. It is to be noted that the variable node 383 is not illustrated in FIG. 12.

[Math. 5]

$$v_{iH} = u_{0\_iH} + \sum_{jH=1}^{d_v-1} u_{jH} \qquad \text{Expression 6}$$

where iH and jH are substituted for iL and jL in the expression 2, respectively.

The check node processing section 384 is configured to perform a parity check by different processing from processing by the variable node processing section 382 in the low-level error correction section 360. More specifically, a check node 385 in the check node processing section 384 determines a message $u_{jH}$ by the following expression 7, instead of the expression 3. It is to be noted that the check node 385 is not illustrated in FIG. 12.

[Math. 6]

$$\tanh\left(\frac{u_{jH}}{2}\right) = \prod_{iH=1}^{d_c-1} \tanh\left(\frac{v_{iH}}{2}\right) \qquad \text{Expression 7}$$

where tan h( ) is a hyperbolic tangent function, and Πx is an infinite product of x.

The expression 7 may be transformed into the following expression 9 with use of an expression 8.

[Math. 7]

$$a \times b = \exp(\ln|a| + \ln|b|) \times \text{sign}(a) \times \text{sign}(b) \qquad \text{Expression 8}$$

$$\begin{aligned} u_{jH} &= 2\tanh^{-1}\left(\prod_{iH=1}^{d_c-1} \tanh\left(\frac{v_{iH}}{2}\right)\right) \\ &= 2\tanh^{-1}\left[\exp\left\{\sum_{iH=1}^{d_c-1} \ln\left(\left|\tanh\left(\frac{v_{iH}}{2}\right)\right|\right)\right\} \times \right. \\ &\quad \left. \prod_{iH=1}^{d_c-1} \text{sign}\left(\tanh\left(\frac{v_{iH}}{2}\right)\right)\right] \\ &= 2\tanh^{-1}\left[\exp\left\{-\left(\sum_{iH=1}^{d_c-1} -\ln\left(\tanh\left(\frac{|v_{iH}|}{2}\right)\right)\right)\right\} \times \right. \\ &\quad \left. \prod_{iH=1}^{d_c-1} \text{sign}(v_{iH})\right] \end{aligned} \qquad \text{Expression 9}$$

where ln(x) represents a natural logarithm of x, and sign( ) is a function similar to sign( ) in the expression 3.

The expression 9 into which the expression 7 is transformed may be further transformed into an expression 11 with use of a function defined in the following expression 10. The check node 385 may determine the message $u_{jH}$ by calculation with use of the expression 11, instead of the expression 7.

[Math. 8]

$$\varphi(x) = -\ln\{\tanh(x/2)\} \qquad \text{Expression 10}$$

$$u_{jH} = \phi^{-1}\left(\sum_{iH=1}^{d_c-1} \phi(|v_{jH}|)\right) \times \prod_{iH=1}^{d_c-1} \text{sign}(v_{jH}) \qquad \text{Expression 11}$$

where ln(x) represents a natural logarithm of x, and sign( ) is a function similar to sign( ) in the expression 3.

It is to be noted that the message $u_{jH}$ may be determined not only with use of the expression 7 or the expression 11 but also by a simpler computation than the expressions 7 and 11. For example, a computation result of a function $R(v_1, v_2)$ defined by the following expression 12 may be calculated in advance for each of possible values of messages $v_1$ and $v_2$. Then, a table associated with the computation result and a combination of the messages $v_1$ and $v_2$ may be formed in advance, and a computation result read from the table may be recursively used as illustrated in the following expression 13, thereby easily determining the message $u_{jH}$.

$$R(v_1,v_2)=2\tan h^{-1}\{\tan(v_1/2)\tan(v_2/2)\} \qquad \text{Expression 12}$$

$$u_{jH}=R(v_1,R(v_2,R(v_3 \ldots R(v_{dc}-2,v_{dc}-1)))) \qquad \text{Expression 13}$$

The correction success/failure determination section 386 is configured to determine whether or not error correction is successful. In a case where the correction success/failure determination section 386 receives a message $v_{iH}'$ from the variable node processing section 382, and any of absolute values in the message $v_{iH}'$ is equal to or lower than a predetermined threshold value, the correction success/failure determination section 386 determines that the correction has failed. On the other hand, in a case where all of the absolute values in the message $v_{iH}'$ exceed the threshold value, the correction success/failure determination section 366 determines that the correction is successful. In a case where the correction is successful, the correction success/failure determination section 386 generates an error-corrected code word, based on the message $v_{iH}'$, and outputs, to the host computer 100, original data (k bit) that is the code word without parity. Moreover, the correction success/failure determination section 386 generates a status to which information indicating whether or not the correction is successful is written, and outputs the status to the host computer 100.

Operation Example of Host Computer

Figure 13:
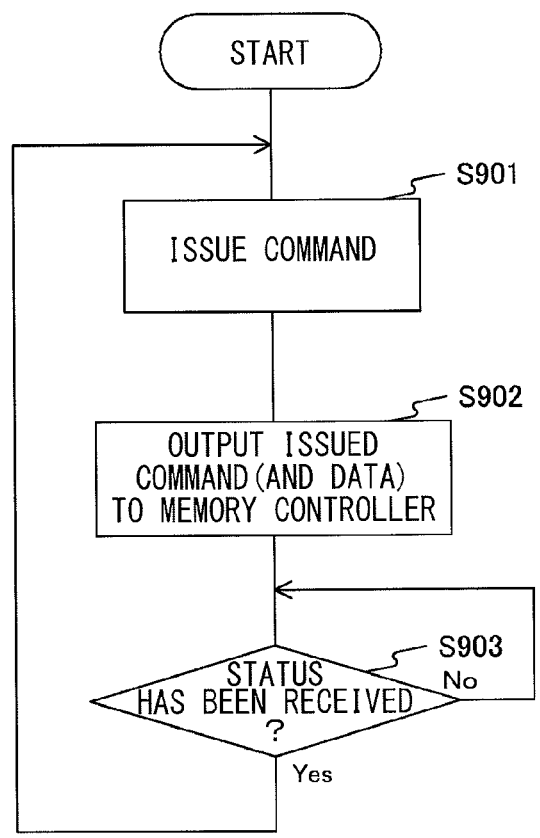
FIG. 13 is a flow chart illustrating an example of an operation of the host computer according to the first embodiment.

FIG. 13 is a flow chart illustrating an example of an operation of the host computer according to the first embodiment. For example, the operation may start when a predetermined application is executed. The host computer 100 issues a write command or a read command, as necessary (step S901). The host computer 100 outputs the issued command to the memory controller 300. In a case where the issued command is a write command, the host computer 100 outputs write data together with the write command to the memory controller 300 (step S902).

The host computer 100 determines whether or not the status has been received (step S903). In a case where the host computer 100 has not received the status (step S903: No), the host computer 100 returns to the step S903. In a case where the host computer 100 has received the status (step S903: Yes), the host computer 100 returns to the step S901.

Operation Example of Memory Controller

Figure 14:
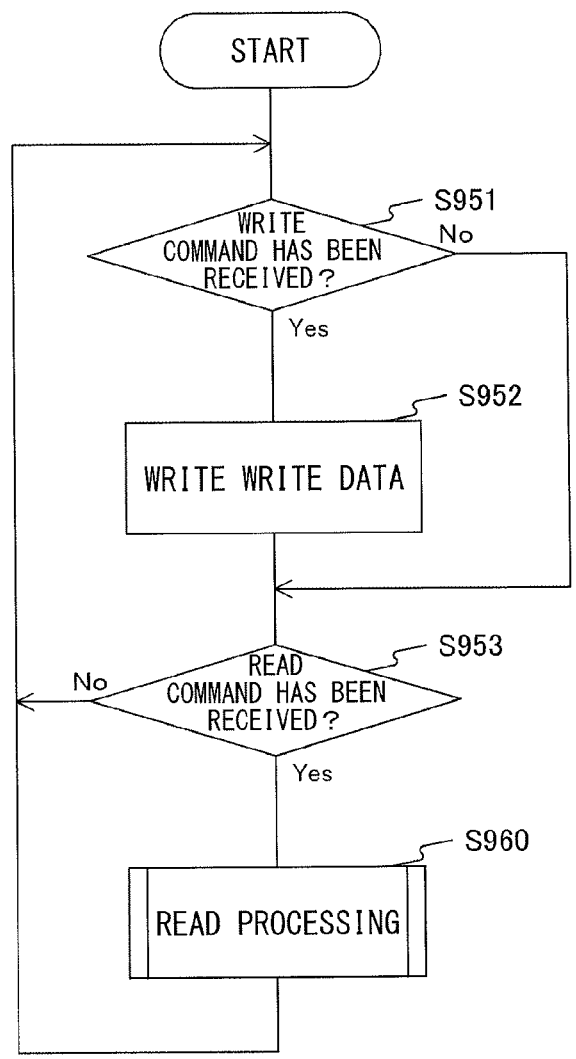
FIG. 14 is a flow chart illustrating an example of an operation of the memory controller according to the first embodiment.

FIG. 14 is a flow chart illustrating an example of an operation of the memory controller 300 according to the first embodiment. For example, this operation may start when power is applied to the memory controller 300.

The memory controller 300 determines whether or not the write command has been received from the host computer 100 (step S951). In a case where the memory controller 300 has received the write command (step S951: Yes), the memory controller 300 encodes the write data, and writes the encoded write data to the non-volatile memory 400 (step S952).

In a case where the memory controller 300 has not received the write command (step S951: No), or after the step S952, the memory controller 300 determines whether or not the read command has been received from the host computer 100 (step S953). In a case where the memory controller 300 has received the read command (step S953: Yes), the memory controller 300 executes read processing for reading read data (data equivalent to a code word) (step S960). In a case where the memory controller 300 has not received the read command (step S953: No), or after the step S960, the memory controller 300 returns to the step S951.

Figure 15:
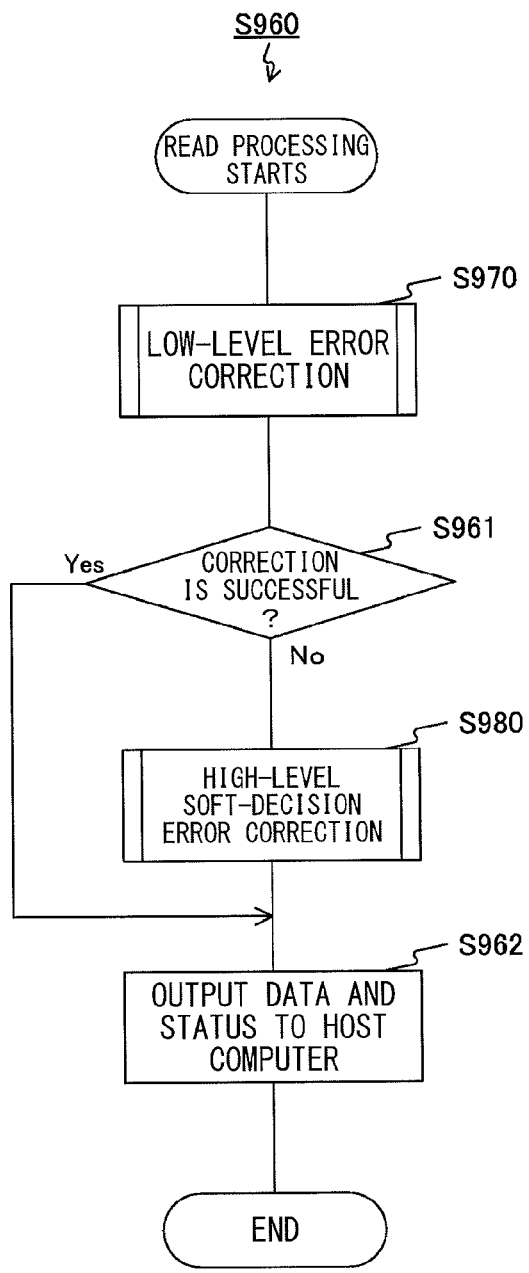
FIG. 15 is a flow chart illustrating an example of read processing according to the first embodiment.

FIG. 15 is a flow chart illustrating an example of read processing according to the first embodiment. The memory controller 300 executes low-level error correction with use of the low-level algorithm (step S970). The memory controller 300 determines whether or not the correction is successful in the low-level error correction (step S961).

In a case where the correction has failed (step S961: No), the memory controller 300 executes high-level soft-decision error correction with use of the high-level algorithm (step S980). On the other hand, in a case where the correction is successful (step S961: Yes), or after the step S980, the memory controller 300 outputs the status to the host computer 100. Moreover, in a case where the correction in the step S970 or S980 is successful, the host computer 100 outputs, to the host computer 100, original data (k bits) that is the code word without parity and the status (step S962). After the step S962, the memory controller 300 terminates the read processing.

Figure 16:
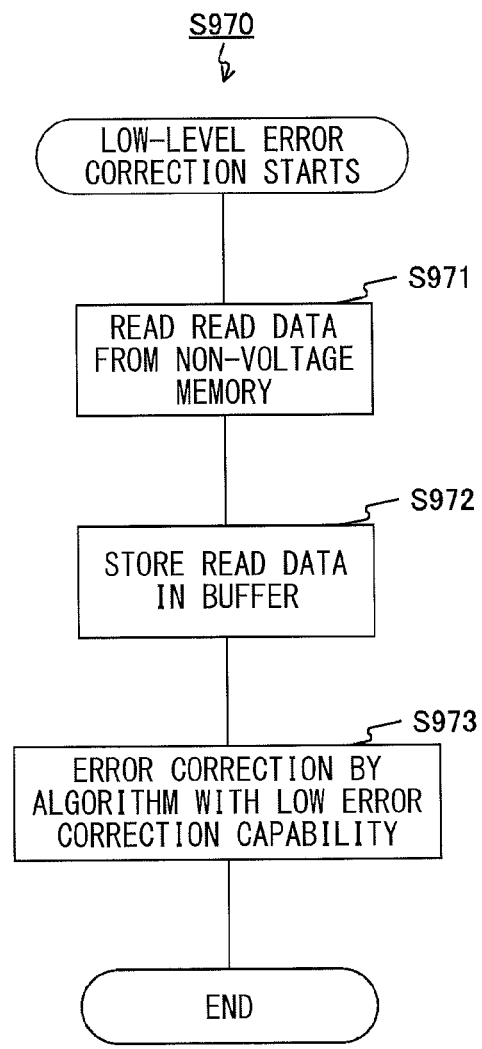
FIG. 16 is a flow chart illustrating an example of low-level error correction according to the first embodiment.

FIG. 16 is a flow chart illustrating low-level error correction according to the first embodiment. The memory controller 300 reads read data from the non-volatile memory 400 (step S971), and stores the read data in the read data buffer 350 (step S972). The low-level error correction section 360 in the memory controller 300 corrects an error in the read data with use of the soft-decision decoding algorithm having low error correction capability (step S973). After the step S973, the memory controller 300 terminates the low-level error correction.

Figure 17:
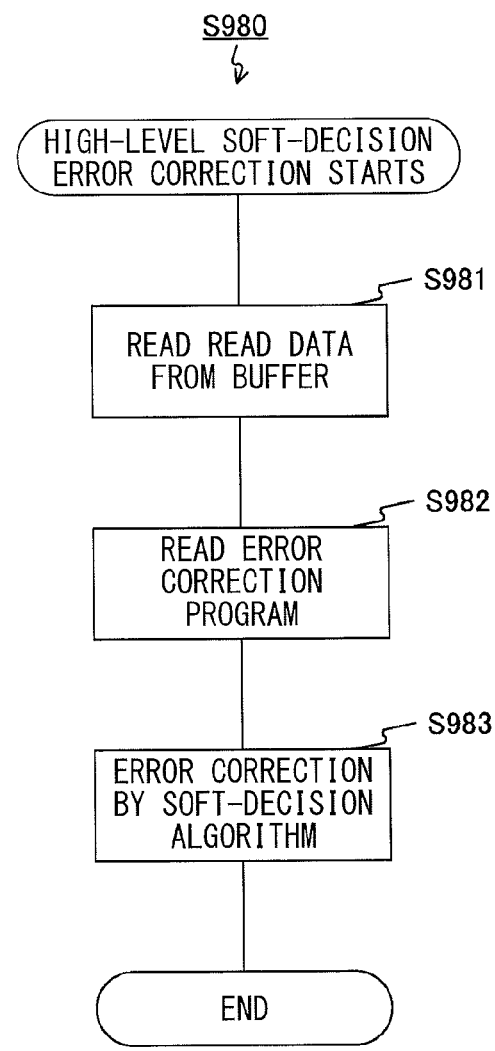
FIG. 17 is a flow chart illustrating an example of high-level soft-decision error correction according to the first embodiment.

FIG. 17 is a flow chart illustrating an example of high-level soft-decision error correction according to the first embodiment. The memory controller 300 reads the read data from the read data buffer 350 (step S981). Moreover, the high-level soft-decision error correction section 380 in the memory controller 300 reads the error correction program from the error correction program storage section 370 (step S982). The high-level soft-decision error correction section 380 corrects the error in the read data with use of the soft-decision decoding algorithm having high error correction capability by execution of the error correction program (step S983). After the step S983, the memory controller 300 terminates the high-level soft-decision error correction.

Thus, in the first embodiment, when error correction by the low-level algorithm has failed, the memory controller 300 corrects the error with use of the high-level algorithm; therefore, the error correction capability is allowed to be improved while suppressing increase in processing time. Moreover, increase in circuit size is allowed to be suppressed by executing decoding with use of the high-level algorithm by software.

First Modification Example

In the first embodiment, an input value to the high-level soft-decision error correction section 380 is a hard-decision value; however, a soft-decision value generated by the low-level error correction section 360 may be input to the high-level soft-decision error correction section 380. Error correction in the high-level soft-decision error correction section 380 becomes easier by using the soft-decision value as the input value, compared to a case where a hard-decision value is used as the input value. A first modification example of the first embodiment differs from the first embodiment in that a soft-decision value generated by the error correction section 360 is input to the high-level soft-decision error correction section 380.

Figure 18:
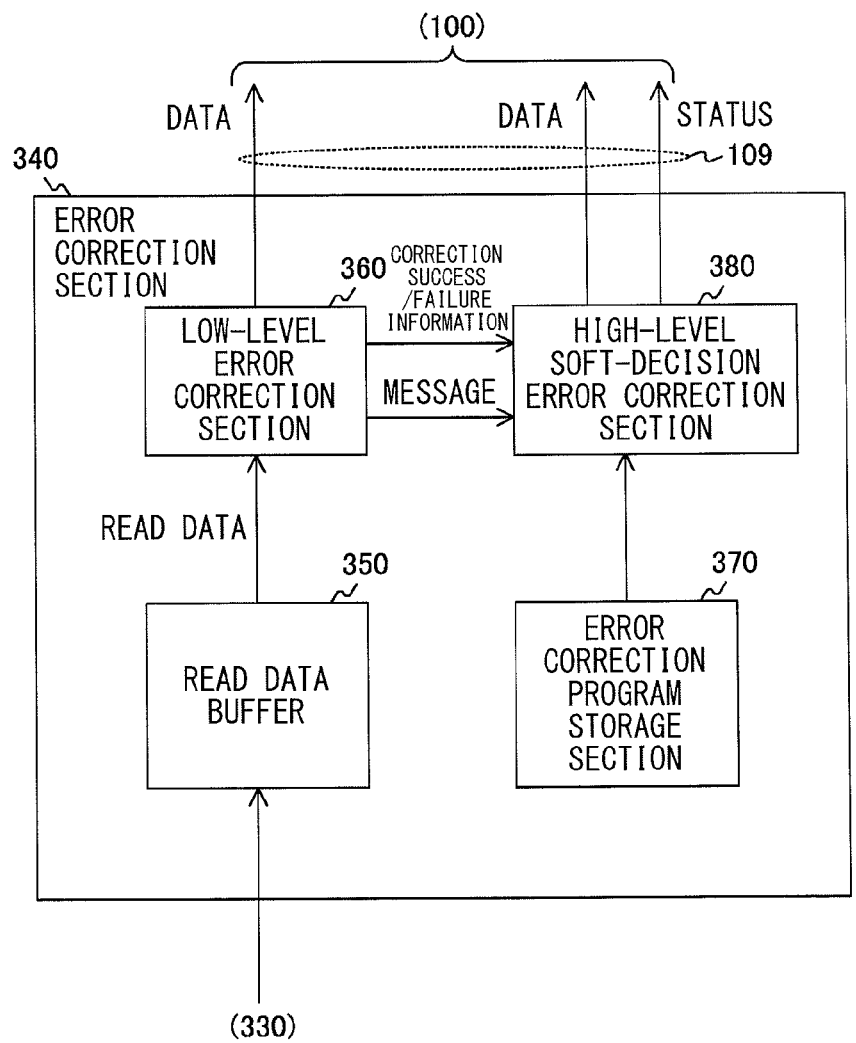
FIG. 18 is a block diagram illustrating a configuration example of an error correction section according to a first modification example of the first embodiment.

FIG. 18 is a block diagram illustrating a configuration example of the error correction section 340 according to the first modification example of the first embodiment. The error correction section 340 according to the first modification example of the first embodiment differs from that according to the first embodiment in that the low-level error correction section 360 outputs the message $v_{iL}'$ (i.e., a soft-decision value) to the high-level soft-decision error correction section 380.

Figure 19:
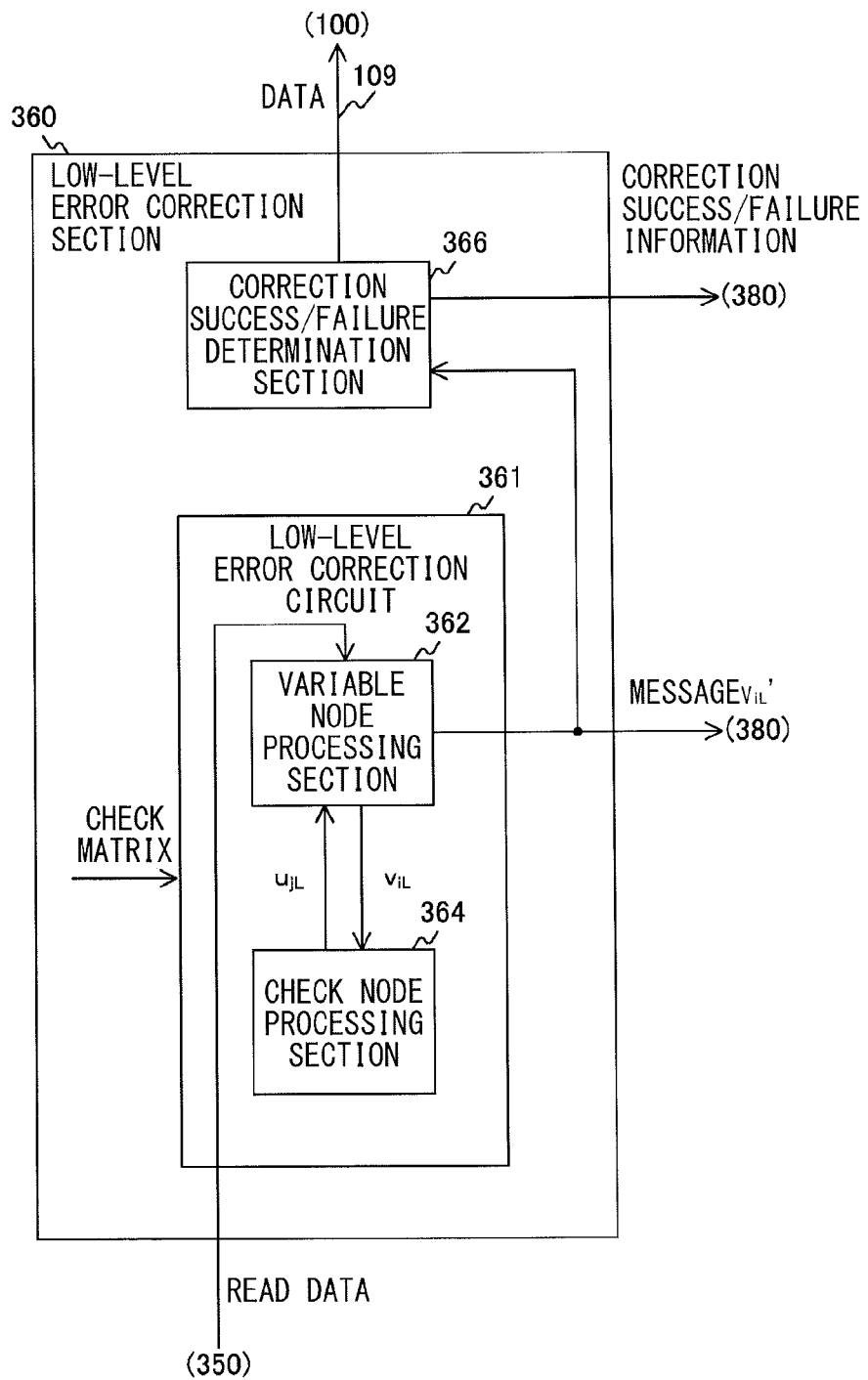
FIG. 19 is a block diagram illustrating an example of a low-level error correction section according to the first modification example of the first embodiment.

FIG. 19 is a block diagram illustrating an example of the low-level error correction section 360 according to the first modification example of the first embodiment. In the low-level error correction section 360 according to first modification example of the first embodiment, the low-level error correction circuit 361 outputs the message $v_{iL}'$ to the high-level soft-decision error correction section 380 in addition to the correction success/failure determination section 366.

Figure 20:
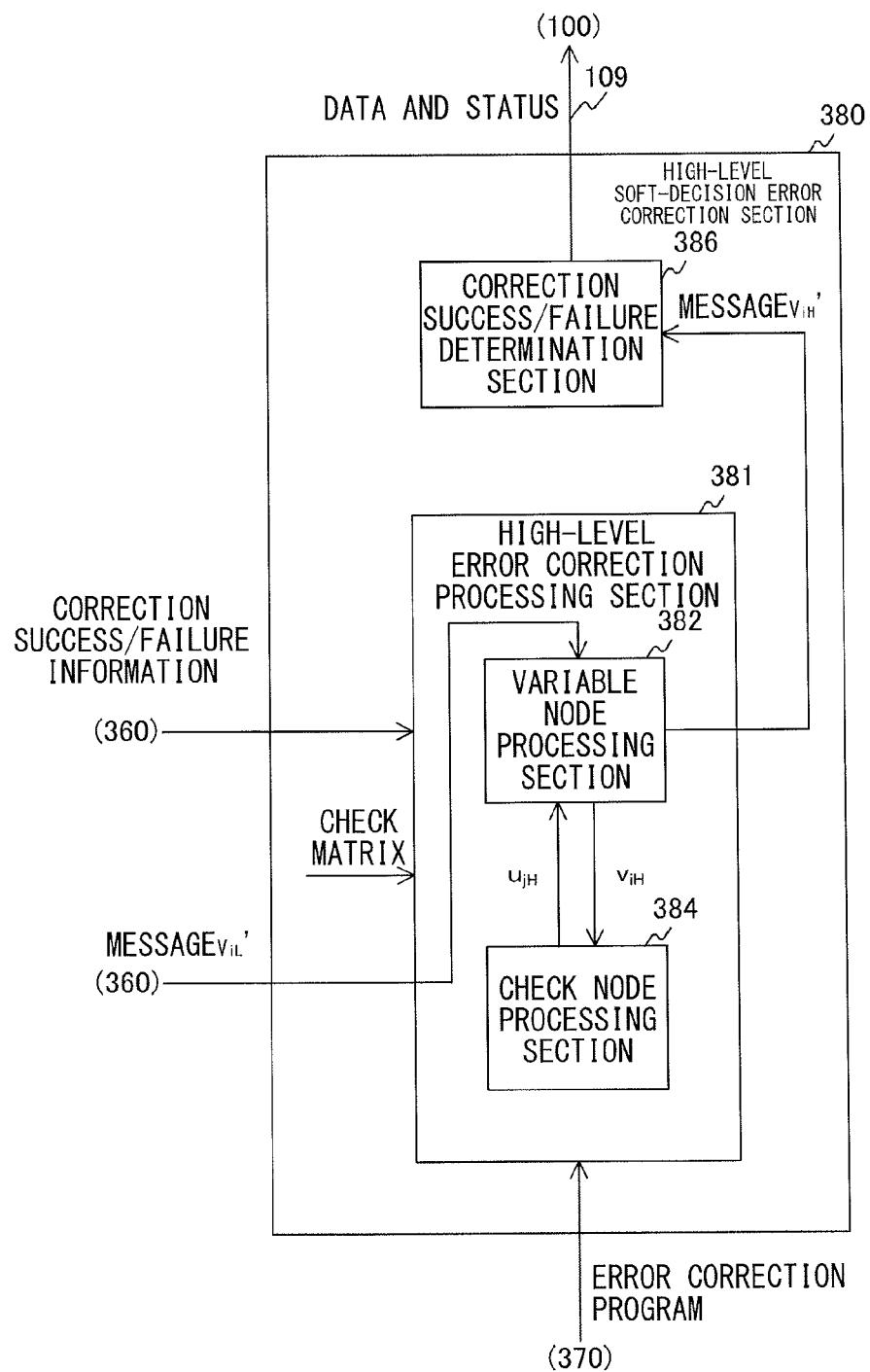
FIG. 20 is a block diagram illustrating a high-level soft-decision error correction section according to the first modification example of the first embodiment.

FIG. 20 is a block diagram illustrating an example of the high-level soft-decision error correction section 380 according to the first modification example of the first embodiment. Instead of the read data, the message $v_{iL}'$ is input to the variable node processing section 382 according to the first modification example of the first embodiment. The variable node processing section 382 executes computation exemplified in the expression 6 using the message $v_{iL}'$ as the message $u_{i\_OH}$.

Second Modification Example

In the first embodiment, the memory controller 300 does not output correction success/failure information to the host computer 100; however, the correction success/failure information may be output to the host computer 100. The memory controller 300 according to a second modification example of the first embodiment differs from that according to the first embodiment in that the memory controller 300 outputs correction success/failure information to the host computer 100.

Figure 21:
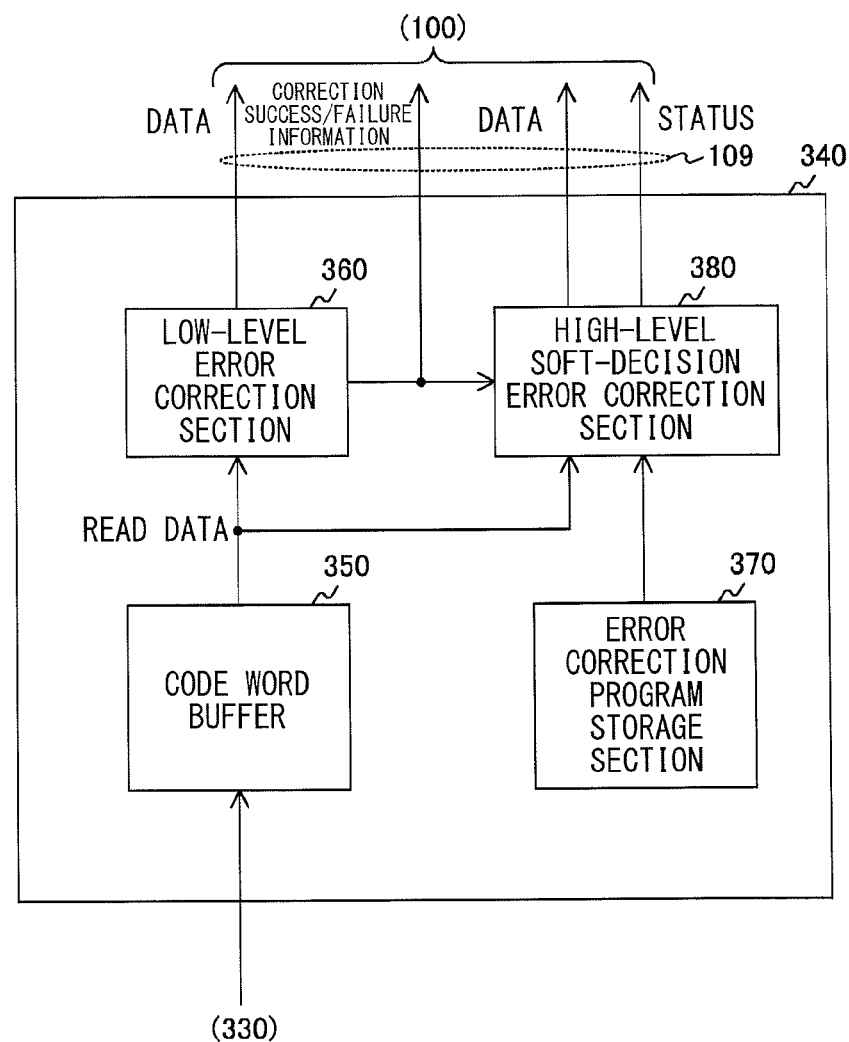
FIG. 21 is a block diagram illustrating a configuration example of an error correction section according to a second modification example of the first embodiment.

FIG. 21 is a block diagram illustrating a configuration example of the error correction section 340 according to the second modification example of the first embodiment. The low-level error correction section 360 according to the second modification example of the first embodiment differs from that according to the first embodiment in that correction success/failure information is output also to the host computer 100.

Figure 22:
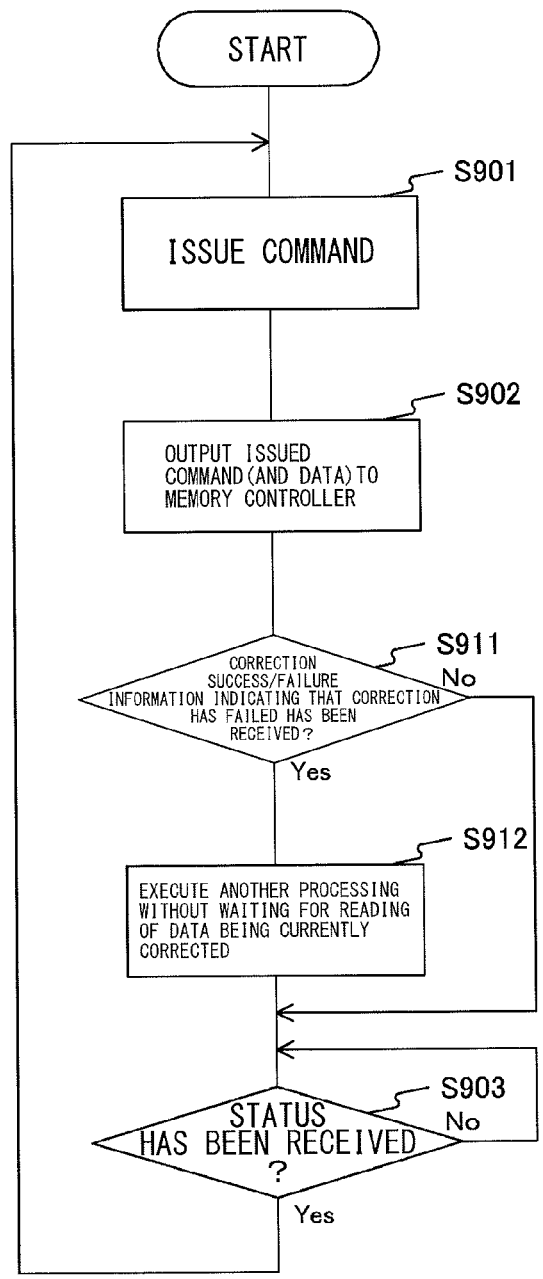
FIG. 22 is a flow chart illustrating an example of an operation of a host computer according to the second modification example of the first embodiment.

FIG. 22 is a flow chart illustrating an example of an operation of the host computer 100 according to the second modification example of the first embodiment. The host computer 100 according to the second modification example of the first embodiment differs from that according to the first embodiment in that steps S911 and S912 are further executed.

The host computer 100 determines whether or not correction success/failure information indicating that the correction has failed has been received after the step S902 (step S911). In a case where the host computer 100 has received the correction success/failure information indicating that the correction has failed (step S911: Yes), the host computer 100 executes another processing as necessary without waiting for reading of data that is currently corrected by the memory controller 300 (step S912). In a case where the host computer 100 has not received the correction success/failure information indicating that the correction has failed (step S911: No), or after the step S912, the host computer 100 executes the step S903.

Since correction by an algorithm having high error correction capability takes a long time, in a case where correction by the algorithm having low error correction capability has failed, as exemplified in FIG. 22, the host computer 100 is allowed to execute another processing within an estimated time necessary for correction.

Figure 23:
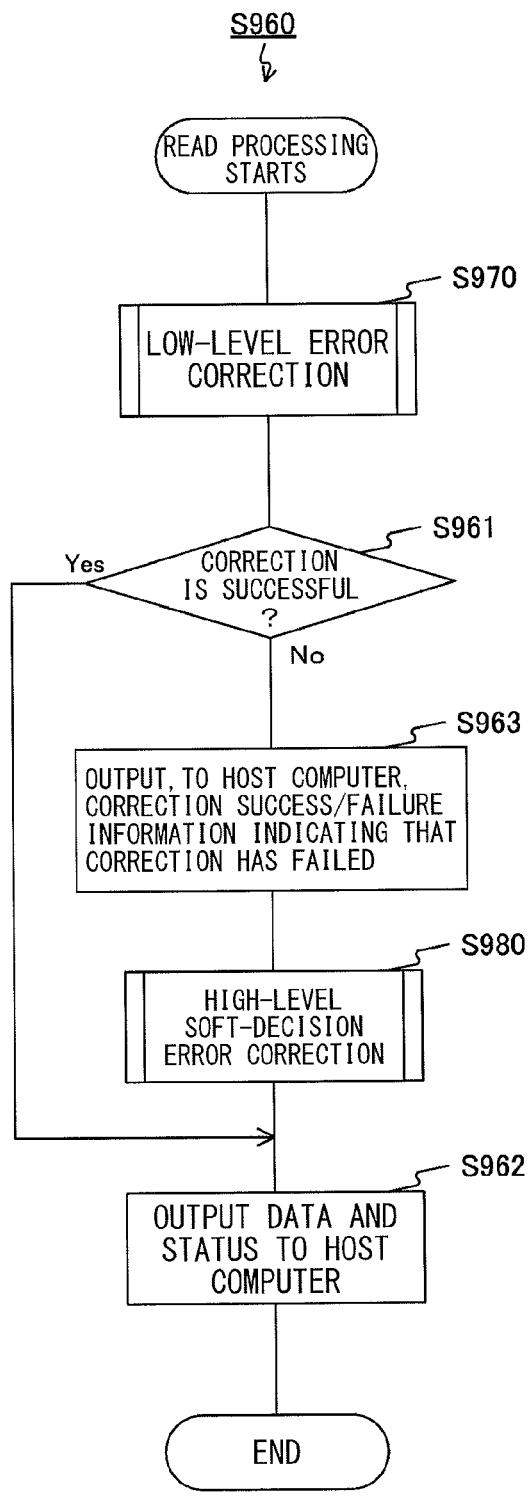
FIG. 23 is a flow chart illustrating an example of read processing according to the second modification example of the first embodiment.

FIG. 23 is a flow chart illustrating an example of read processing according to the second modification example of the first embodiment. The read processing according to the second modification example of first embodiment differs from that according to the first embodiment in that step S963 is further executed.

In a case where the correction by the low-level algorithm has failed (step S961: No), the memory controller 300 generates correction success/failure information indicating that the correction has failed, and outputs the correction success/failure information to the host computer 100 (step S963). Then, the memory controller 300 executes the high-level soft-decision error correction (step S980).

2. Second Embodiment

Configuration Example of Error Correction Section

In the first embodiment, the memory controller 300 starts error correction by the high-level algorithm immediately after error correction by the low level algorithm fails. However, the memory controller 300 may start error correction by the high-level algorithm in response to control by the host computer 100. The memory controller 300 according to the second embodiment differs from that according to the first embodiment in that error correction by the high-level algorithm starts in response to control by the host computer 100.

Figure 24:
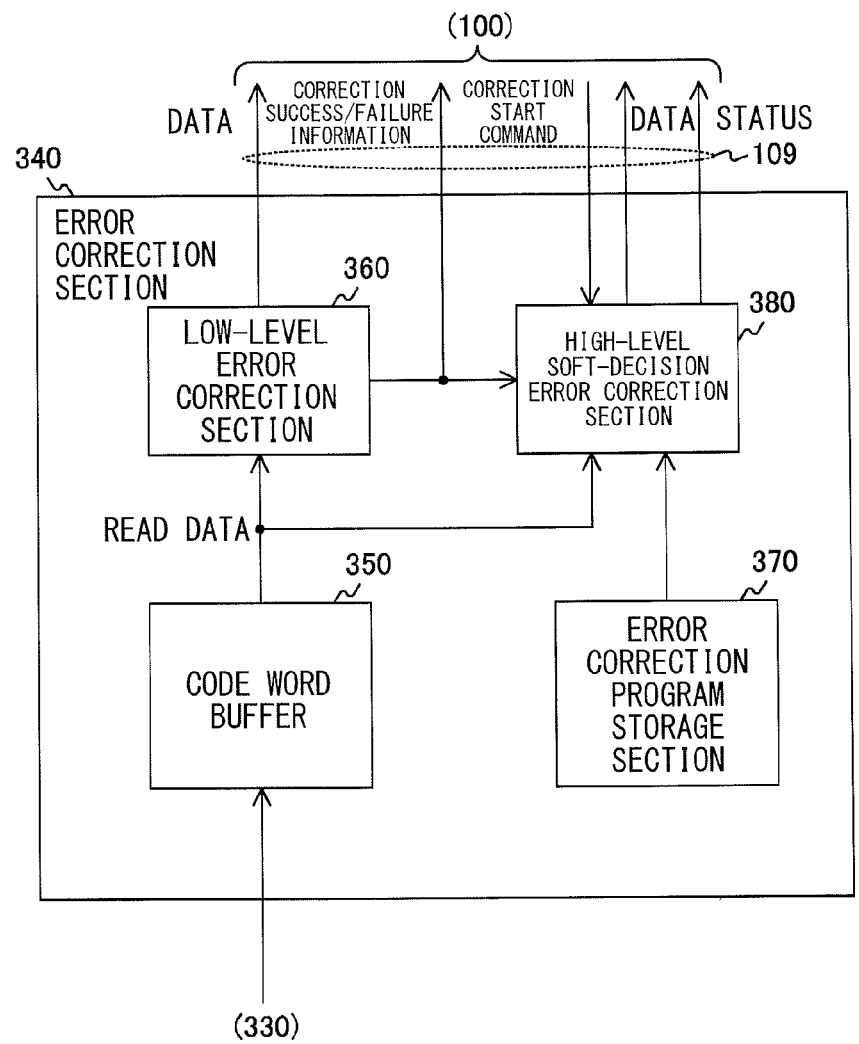
FIG. 24 is a block diagram illustrating a configuration example of an error correction section according to a second embodiment.

FIG. 24 is a block diagram illustrating a configuration example of the error correction section 340 according to the second embodiment. The low-level error correction section 360 according to the second embodiment differs from that according to the first embodiment in that correction success/failure information indicating whether or not correction is successful is output also to the host computer 100. Moreover, the high-level soft-decision error correction section 380 according to the second embodiment differs from that according to the first embodiment in that error correction starts in response to a correction start command. The correction start command is a command instructing the high-level soft-decision error correction section 380 to start error correction, and is issued by the host computer 100.

Operation Example of Host Computer

Figure 25:
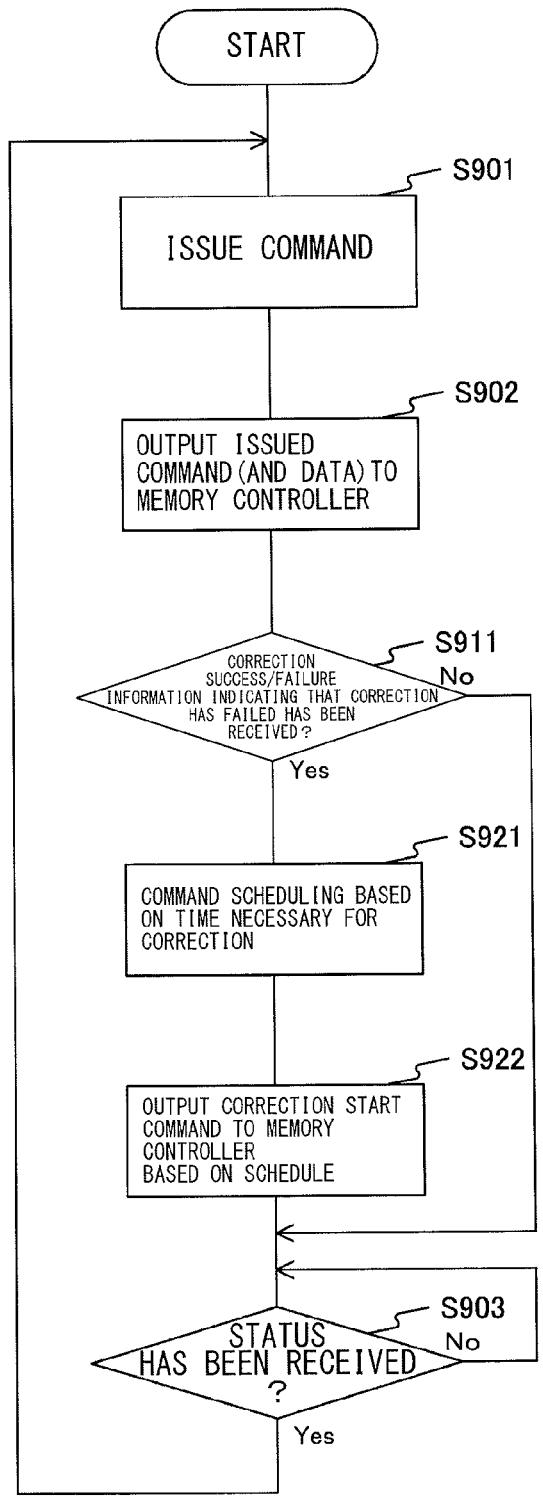
FIG. 25 is a flow chart illustrating an example of an operation of a host computer according to the second embodiment.

FIG. 25 is a flow chart illustrating an example of an operation of the host computer 100 according to the second embodiment. The host computer 100 according to the second embodiment differs from that according to the first embodiment in that steps S911, S921, and S922 are further executed.

The host computer 100 determines whether or not correction success/failure information indicating that correction has failed has been received after the step S902 (step S911). In a case where the host computer 100 has received the correction success/failure information indicating that the correction has failed (step S911: Yes), the host computer 100 performs scheduling of execution order of various commands including the correction start command (step S921). Then, the host computer 100 outputs the correction start command to the memory controller 300 according to schedule (step S922). In a case where the host computer 100 has not received correction success/failure information indicating that the correction has failed (step S911: No), or after the step S922, the host computer 100 executes the step S903.

Operation Example of Memory Controller

Figure 26:
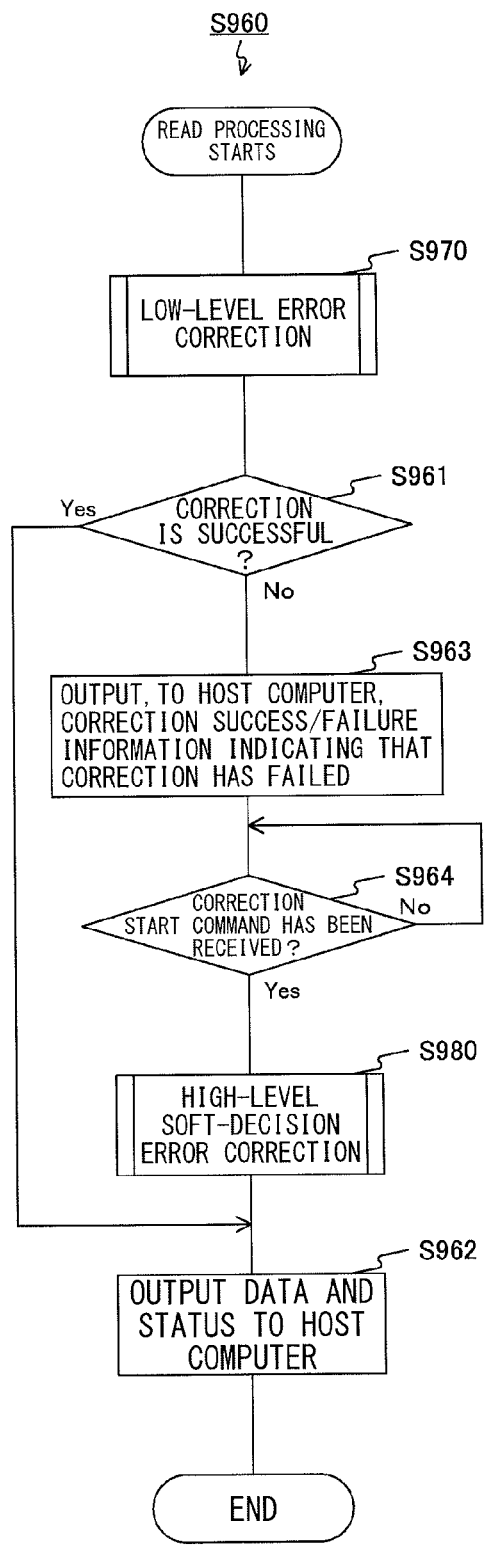
FIG. 26 is a flow chart illustrating an example of read processing according to the second embodiment.

FIG. 26 is a flow chart illustrating an example of read processing according to the second embodiment. The read processing according to the second embodiment differs from that according to the first embodiment in that steps S963 and S964 are further executed.

In a case where correction by the low-level algorithm has failed (step S961: No), the memory controller 300 generates correction success/failure information indicating that the correction has failed, and outputs the correction success/failure information to the host computer 100 (step S963). Then, the memory controller 300 determines whether or not the correction start command has been received from the host computer 100 (step S964). In a case where the memory controller 300 has not received the correction start command (step S964: No), the memory controller 300 returns to the step S964. In a case where the memory controller 300 has received the correction start command (step S964: Yes), the memory controller 300 executes the high-level soft-decision error correction (step S980).

Thus, in the second embodiment, the host computer 100 is allowed to control timing of start of error correction by the high-level algorithm; therefore, processing is allowed to be optimized. For example, in a case where error correction by the low-level algorithm has failed in reading of data #1 of data #1 and #2 that are not necessary to be read in order, the information processing system may delay timing of error correction to the data #1 by the high-level algorithm and may first perform reading of data #2 and error correction to the data #2 by the low-level algorithm. Thus, a throughput is improved.

First Modification Example

In the second embodiment, error correction by the high-level algorithm starts in response to control by the host computer 100. However, the error correction by the high-level algorithm may be suspended in response to control by the host computer 100, and then may restart after that. The memory controller 300 according to a first modification example of the second embodiment differs from that according to the second embodiment in that error correction by the high-level algorithm is suspended and restarts in response to control by the host computer 100.

Figure 27:
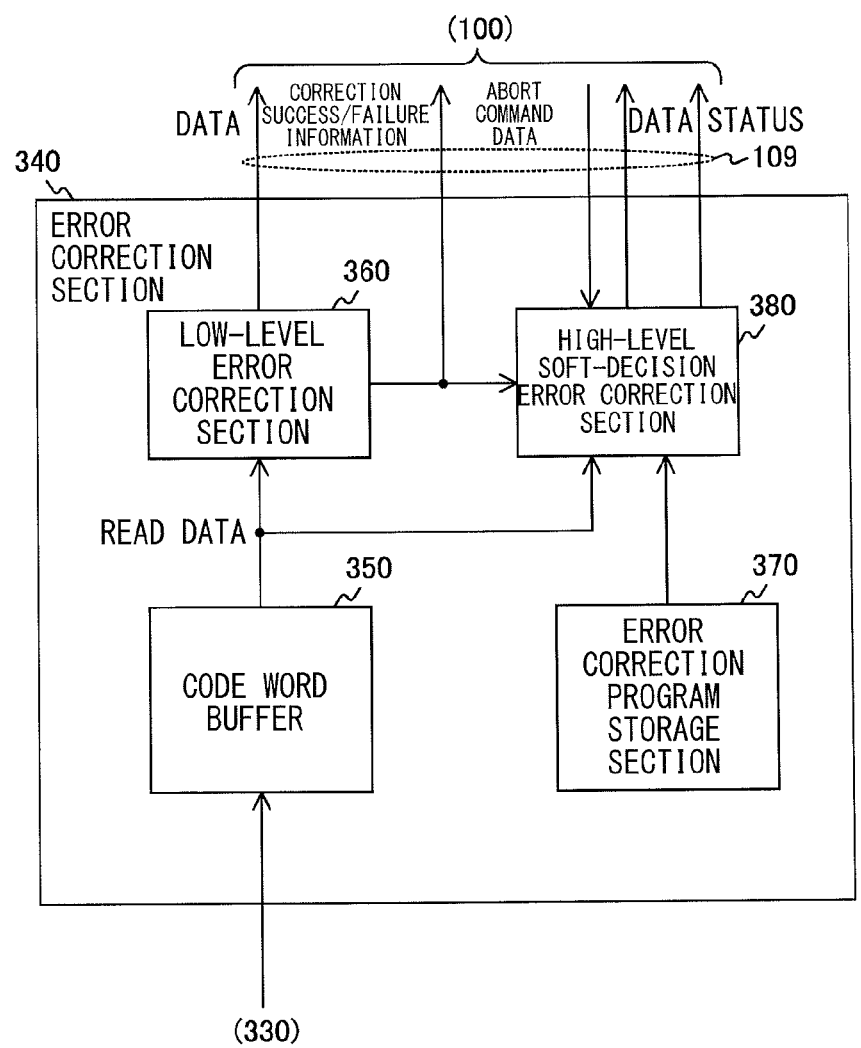
FIG. 27 is a block diagram illustrating a configuration example of an error correction section according to a first modification example of the second embodiment.

FIG. 27 is a block diagram illustrating a configuration example of the error correction section 340 according to the first modification example of the second embodiment. The high-level soft-decision error correction section 380 according to the first modification example of the second embodiment differs from that according to the second embodiment in that error correction is suspended in response to an abort command. The abort command is a command instructing the high-level soft-decision error correction section 380 to suspend error correction, and is issued by the host computer 100. Moreover, the high-level soft-decision error correction section 380 according to the first modification example of the second embodiment differs from that according to the second embodiment in that the suspended error correction restarts in response to a correction restart command. The correction restart command is a command instructing the high-level soft-decision error correction section 380 to restart error correction, and is issued by the host computer 100.

Figure 28:
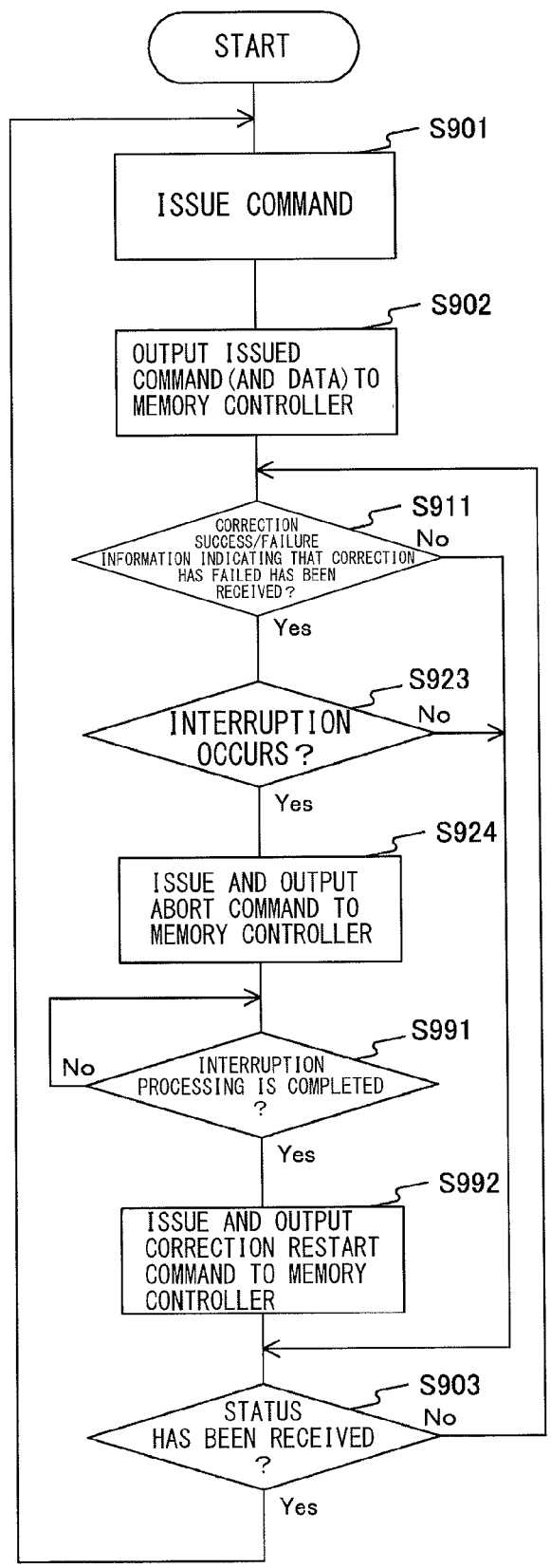
FIG. 28 is a flow chart illustrating an example of an operation of a host computer according to the first modification example of the second embodiment.

FIG. 28 is a flow chart illustrating an example of an operation of the host computer 100 according to the first modification example of the second embodiment. The host computer 100 according to the first modification example of the second embodiment differs from that according to the second embodiment in that steps S923, S924, S991, and S992 are executed, instead of the steps S921 and S922.

In a case where the host computer 100 has received correction success/failure information indicating that correction has failed (step S911: Yes), the host computer 100 determines whether or not interruption of read processing on data that is currently corrected has occurred (step S923). In a case where the interruption has occurred (step S923: Yes), the host computer 100 issues an abort command, and outputs the abort command to the memory controller 300 (step S924), and then determines whether or not interruption processing is completed (step S991). In a case where the interruption processing is not completed (step S991: No), the host computer 100 returns to the step S991. In a case where the interruption processing is completed (step S991: Yes), the host computer 100 issues the correction restart command, and outputs the correction restart command to the memory controller 300 (step S992). In a case where the host computer 100 has not received correction success/failure information indicating that the correction has failed (step S911: No), in a case where the interruption has not occurred (step S923: No), or after the step S992, the host computer 100 determines whether or not the status has been received (step S903).

In a case where the host computer 100 has not received the status (step S903: No), the host computer 100 returns to the step S911. In a case where the host computer 100 has received the status (step S903: Yes), the host computer 100 returns to the step S901.

Figure 29:
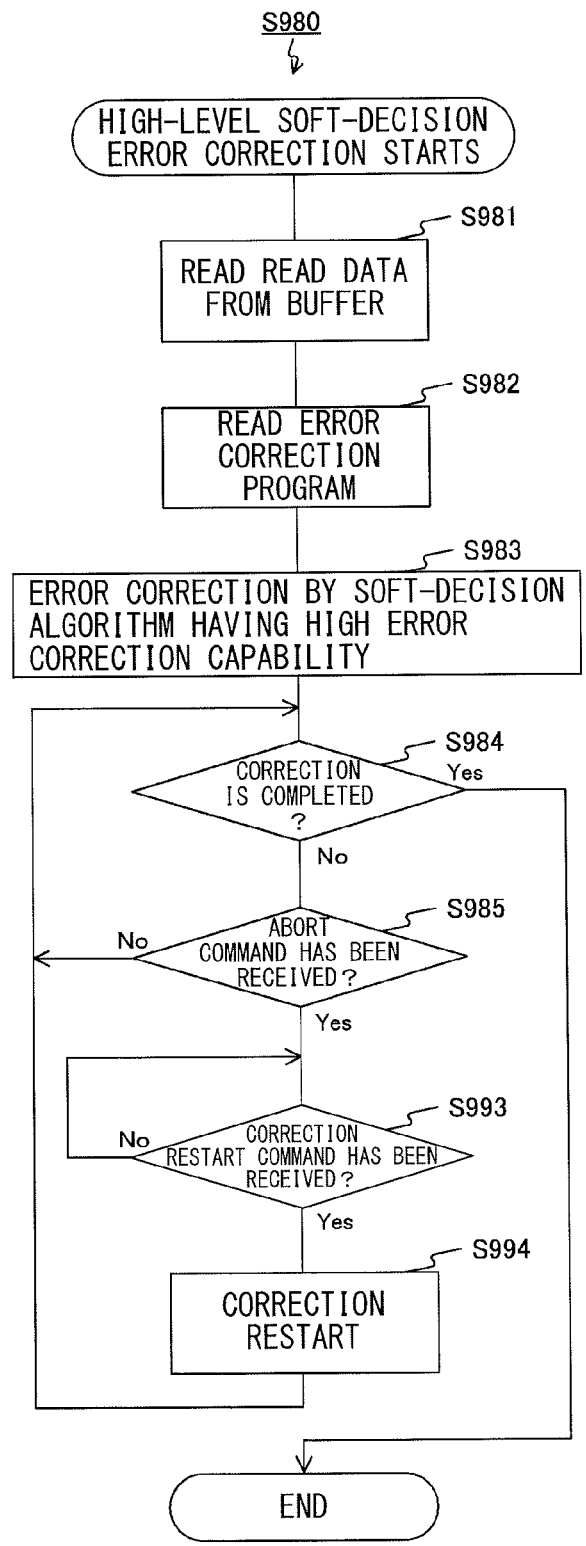
FIG. 29 is a flow chart illustrating an example of high-level soft-decision error correction according to the first modification example of the second embodiment.

FIG. 29 is a flow chart illustrating an example of the high-level soft-decision error correction according to the first modification example of the second embodiment. The high-level soft-decision error correction according to the first modification example of the second embodiment differs from that according to the second embodiment in that steps S984 and S985 are further executed.

The memory controller 300 determines whether or not correction is completed after execution of the step S983 (step S984). In a case where the correction is not completed (step S984: No), the memory controller 300 determines whether or not the abort command has been received (step S985). In a case where the memory controller 300 has received the abort command (step S985: Yes), the memory controller 300 determines whether or not the correction restart command has been received (step S993). In a case where the memory controller 300 has not received the correction restart command (step S993: No), the memory controller 300 returns to the step S993. In a case where the memory controller 30 has received the correction restart command (step S993: Yes), the memory controller 300 restarts the high-level soft-decision error correction (step S994). In a case where the memory controller 300 has not received the abort command (step S985: No), or after the step S994, the memory controller 300 returns to the step S984. In a case where the correction is completed (step S984: Yes), the memory controller 300 terminates the high-level soft-decision error correction.

Second Modification Example

In the second embodiment, the information processing system performs error correction by the high-level algorithm irrespective of the kind of data; however, error correction by the high-level algorithm may not be performed, depending on the kind of data. For example, in a case of video data or image data, even if data with some errors is reproduced, the data is viewable with less trouble. Therefore, it is less necessary to perform error correction by the high-level algorithm. On the other hand, data or a text data in a database is preferably completely corrected, no matter how long it takes. Therefore, it is highly necessary to perform error correction by the high-level algorithm. The information processing system according to the second modification example of the second embodiment differs from that according to the second embodiment in that whether or not to perform error correction by the high-level algorithm is determined, based on the kind of data.

Figure 30:
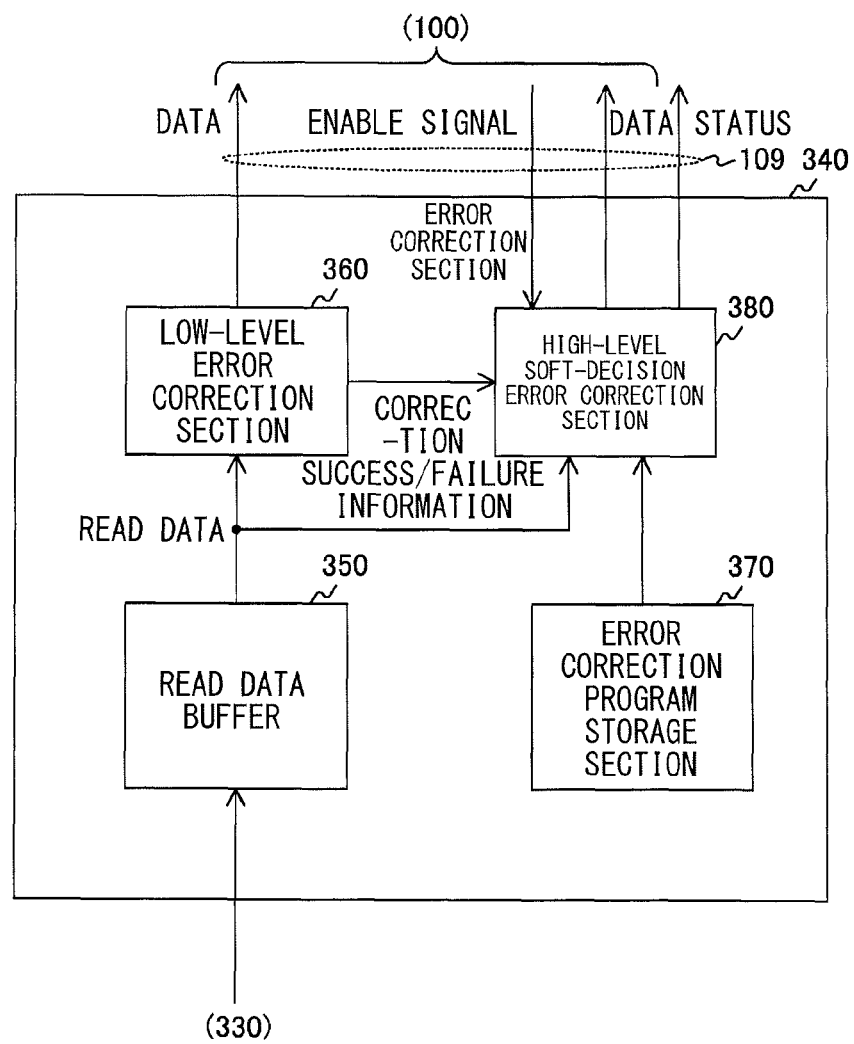
FIG. 30 is a block diagram illustrating a configuration example of an error correction section according to a second modification example of the second embodiment.

FIG. 30 is a block diagram illustrating a configuration example of the error correction section 340 according to the second modification example of the second embodiment. The high-level soft-decision error correction section 380 according to the second modification example of the second embodiment differs from that according to the second embodiment in that error correction is performed, based on an enable signal. The enable signal is a signal indicating whether or not to perform error correction in the high-level soft-decision error correction section 380, and is generated by the host computer 100. The enable signal may be set to "ON" in a case where error correction is to be performed, and may be set to "OFF" in a case where error correction is not to be performed.

Figure 31:
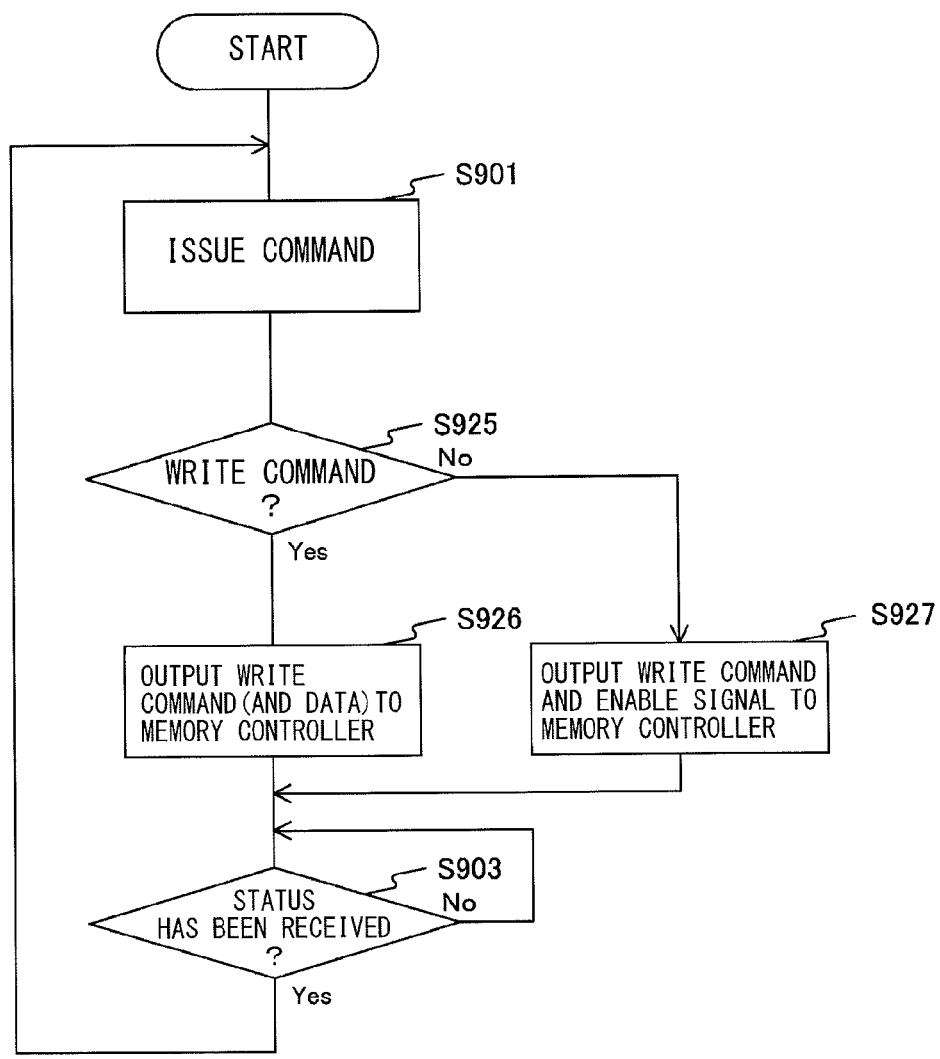
FIG. 31 is a flow chart illustrating an example of an operation of a host computer according to the second modification example of the second embodiment.

FIG. 31 is a flow chart illustrating an example of an operation of the host computer 100 according to the second modification example of the second embodiment. The host computer 100 according to the second modification example of the second embodiment differs from that according to the second embodiment in that steps S925 to S927 are executed instead of the steps S911, S921, and S922.

The host computer 100 issues a command (step S901). However, when a read command is issued in the step S901, the host computer 100 generates an enable signal, based on the kind of data that is to be read. The kind of data may be determined by, for example, an application that is currently executed. More specifically, if the application is an application for reproducing moving images, the data that is to be read is determined to be video data, and the enable signal set to be "OFF" is generated. Moreover, in a case where the application is an application for managing a database, the data to be read is determined to be data in the data base, and the enable signal set to be "ON" is generated.

It is to be noted that the kind of data may be determined by a region in the non-volatile memory 400 holding that data. For example, in a case where data is to be read from a region holding an OS (Operation System), the host computer 100 may set the enable signal to "ON", and in a case where data is to be read from other regions, the host computer 100 may set the enable signal to "OFF".

The host computer 100 determines whether or not the issued command is a write command (step S925). In a case where the issued command is the write command (step S925: Yes), the host computer 100 outputs the write command and write data to the memory controller 300 (step S926).

On the other hand, in a case where the issued command is a read command (step S925: No), the host computer 100 outputs the read command and the enable signal to the memory controller 300 (step S927). After the step S926 or the step S927, the host computer 100 executes the step S903.

It is to be noted that a configuration in which the enable signal is generated when a read command is generated is adopted: however, a timing at which the enable signal is generated is not limited to the time of reading. For example, the enable signal may be generated in the write processing, and the enable signal may be stored together with encoded data in the non-volatile memory 400.

Figure 32:
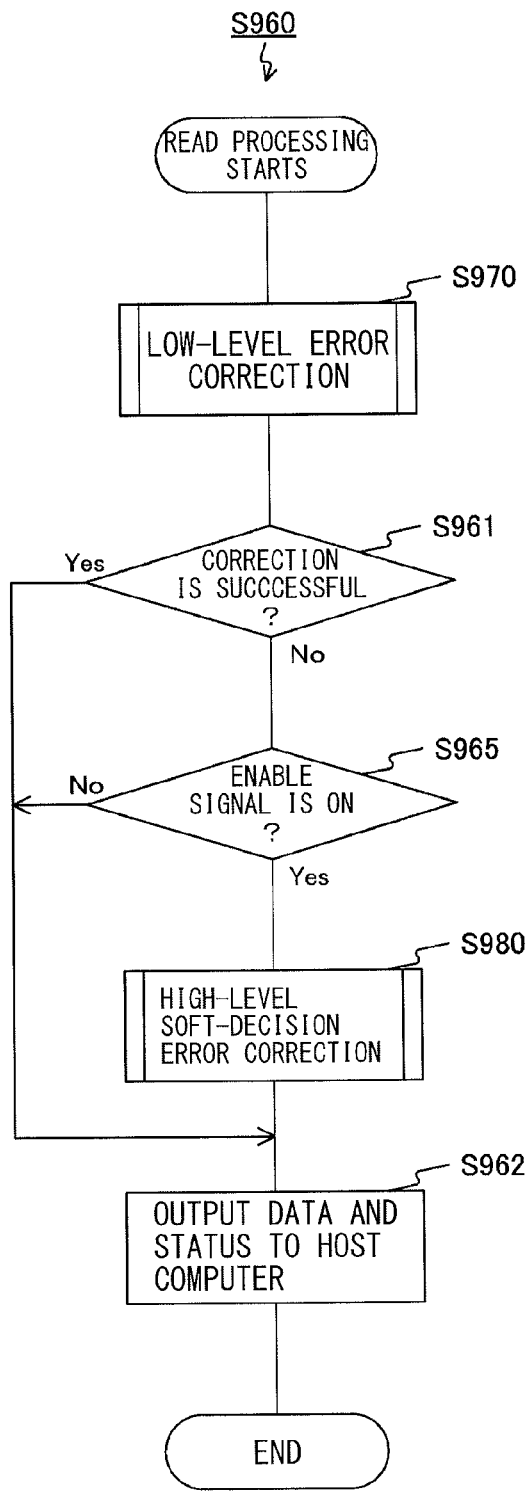
FIG. 32 is a flow chart illustrating an example of read processing according to the second modification example of the second embodiment.

FIG. 32 is a flow chart illustrating an example of read processing according to the second modification example of the second embodiment. The read processing according to the second modification example of the second embodiment differs from that according to the second embodiment in that a step S965 is executed instead of the steps S963 and S964.

In a case where correction by the low-level algorithm has failed (step S961: No), the memory controller 300 determines whether or not the enable signal is set to "ON" (step S965). In a case where the enable signal is set to "ON" (step S965: Yes), the memory controller 300 executes the high-level soft-decision error correction (step S980). In a case where the enable signal is set to "OFF" (step S965: No), or after the step S980, the memory controller 300 executes the step S962.

Third Modification Example

In the second embodiment, the information processing system uses one kind of high-level algorithm; however, an algorithm selected from a plurality of kinds of high-level algorithms may be used. An information processing system according to a third modification example of the second embodiment differs from that according to the second embodiment in that an algorithm selected from a plurality of high-level algorithms is used.

Figure 33:
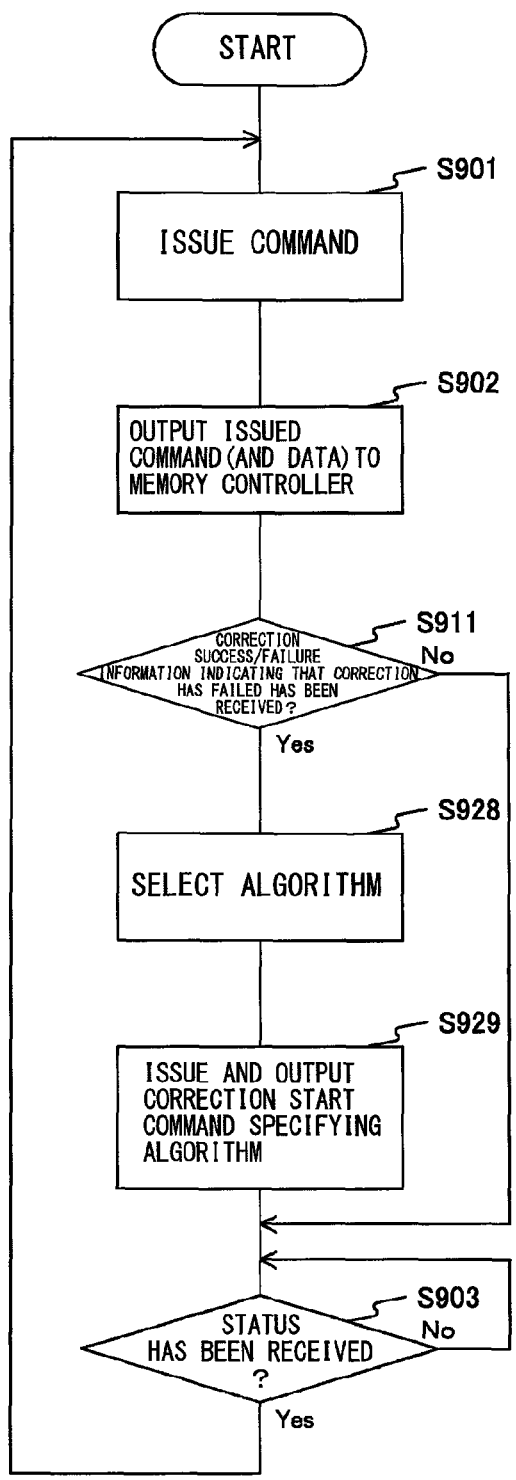
FIG. 33 is a flow chart illustrating an example of an operation of a host computer according to a third modification example of the second embodiment.

FIG. 33 is a flow chart illustrating an example of an operation of the host computer 100 according to the third modification example of the second embodiment. The host computer 100 according to the third modification example of the second embodiment differs from that according to the second embodiment in that steps S928 and S929 are executed instead of the steps S921 and S922.

In a case where the host computer 100 has received correction success/failure information indicating that correction has failed (step S911: Yes), the host computer 100 selects one high-level algorithm from a plurality of high-level algorithms having error correction capabilities different from one another, based on the kind of data. For example, in a case where the data is video data, a high-level algorithm having low error correction capability may be selected. Moreover, in a case where the data is data in a database, a high-level algorithm having high error correction capability may be selected. As the high-level algorithms, a BP algorithm, a Layered BP algorithm, a Shuffled BP algorithm, an Improved BP algorithm, linear programming, and the like may be prepared (step S928). The host computer 100 issues a correction start command specifying an error correction program corresponding to the selected algorithm, and outputs the correction start command to the memory controller 300 (step S929). After the step S929, the host computer 100 executes the step S903.

It is to be noted that the host computer 100 may specify an algorithm, based on a command different from the correction start command or a signal.

Figure 34:
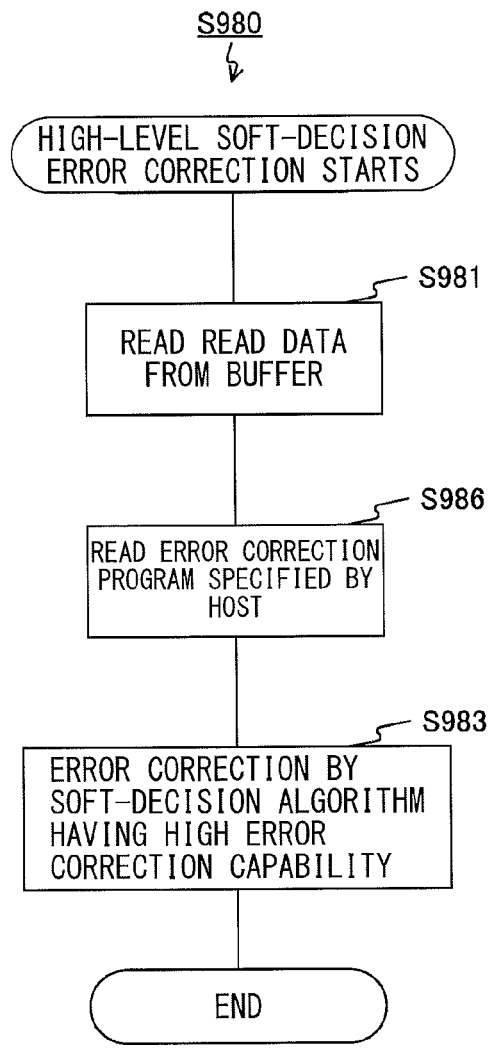
FIG. 34 is a flow chart illustrating an example of high-level soft-decision error correction according to the third modification example of the second embodiment.

FIG. 34 is a flow chart illustrating an example of high-level soft-decision error correction according to the third modification example of the second embodiment. The high-level soft-decision error correction according to the third modification example of the second embodiment differs from that according to the second embodiment in that a step S986 is executed instead of the step S982.

The memory controller 300 reads read data from the read data buffer 350 (step S981). The high-level soft-decision error correction section 380 reads the error correction program specified by the host computer 100 from the error correction program storage section 370 (step S986), and executes the step S983.

3. Third Embodiment

Configuration Example of Host Computer

In the first embodiment, the memory controller 300 executes high-level soft-decision error correction; however, this correction may be executed by the host computer 100. An information processing system according to a third embodiment differs from that according to the first embodiment in that the host computer 100 executes high-level soft-decision error correction.

Figure 35:
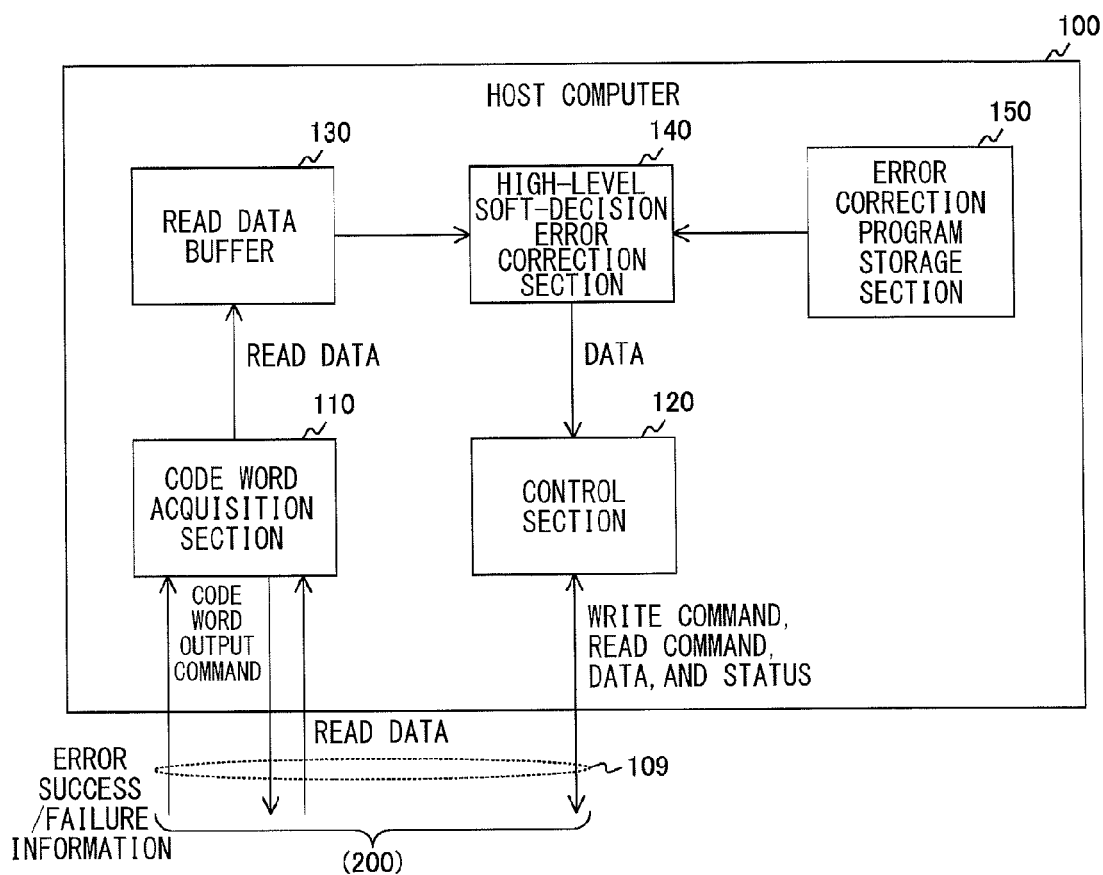
FIG. 35 is a block diagram illustrating a configuration example of a host computer according to a third embodiment.

FIG. 35 is a block diagram illustrating a configuration example of the host computer 100 according to the third embodiment. The host computer 100 includes a code word acquisition section 110, a control section 120, a read data buffer 130, a high-level soft-decision error correction section 140, and an error correction program storage section 150.

The code word acquisition section 110 is configured to acquire read data (data equivalent to a code word) from the memory controller 300 when the memory controller 300 fails in error correction. More specifically, the code word acquisition section 110 receives, from the memory controller 300, correction success/failure information indicating whether or not error correction is successful. In a case where the correction success/failure information indicates that the correction has failed, the code word acquisition section 110 issues a code word output command specifying an address of read data to which the correction has failed, and outputs the code word output command to the memory controller 300. The code word output command is a command instructing the memory controller 300 to output read data containing data and parity to the host computer 100.

The memory controller 300 outputs original data (k bits) that is a code word without parity to the host computer 100 in response to the read command. On the other hand, in response to the code word output command, the memory controller 300 outputs read data (n bits) as it is without removing parity. The code word acquisition section 110 receives the read data from the memory controller 300, and stores the read data in the read data buffer 130.

The control section 120 is configured to control the entire host computer 100. The control section 120 executes various applications according to an operation by a user, and issues a write command or a read command. Moreover, in a case where the control section 120 issues a write command, the control section 120 outputs the write command and data to the storage 200. On the other hand, in a case where the control section 120 issues the read command, the control section 120 receives error-corrected data from the memory controller 300 or the high-level soft-decision error correction section 140, and performs processing on the data. Further, the control section 120 receives the status from the memory controller 300.

The read data buffer 130 holds read data acquired by the code word acquisition section 110.

The configuration of the high-level soft-decision error correction section 140 is similar to that of the high-level soft-decision error correction section 380 in the memory controller 300 according to the first embodiment. The high-level soft-decision error correction section 140 supplies, to the control section 120, original data (k bits), as read data, that is a corrected code word without parity.

The configuration of the error correction program storage section 150 is similar to the error correction program storage section 370 in the memory controller 300 according to the first embodiment.

Configuration Example of Memory Controller

Figure 36:
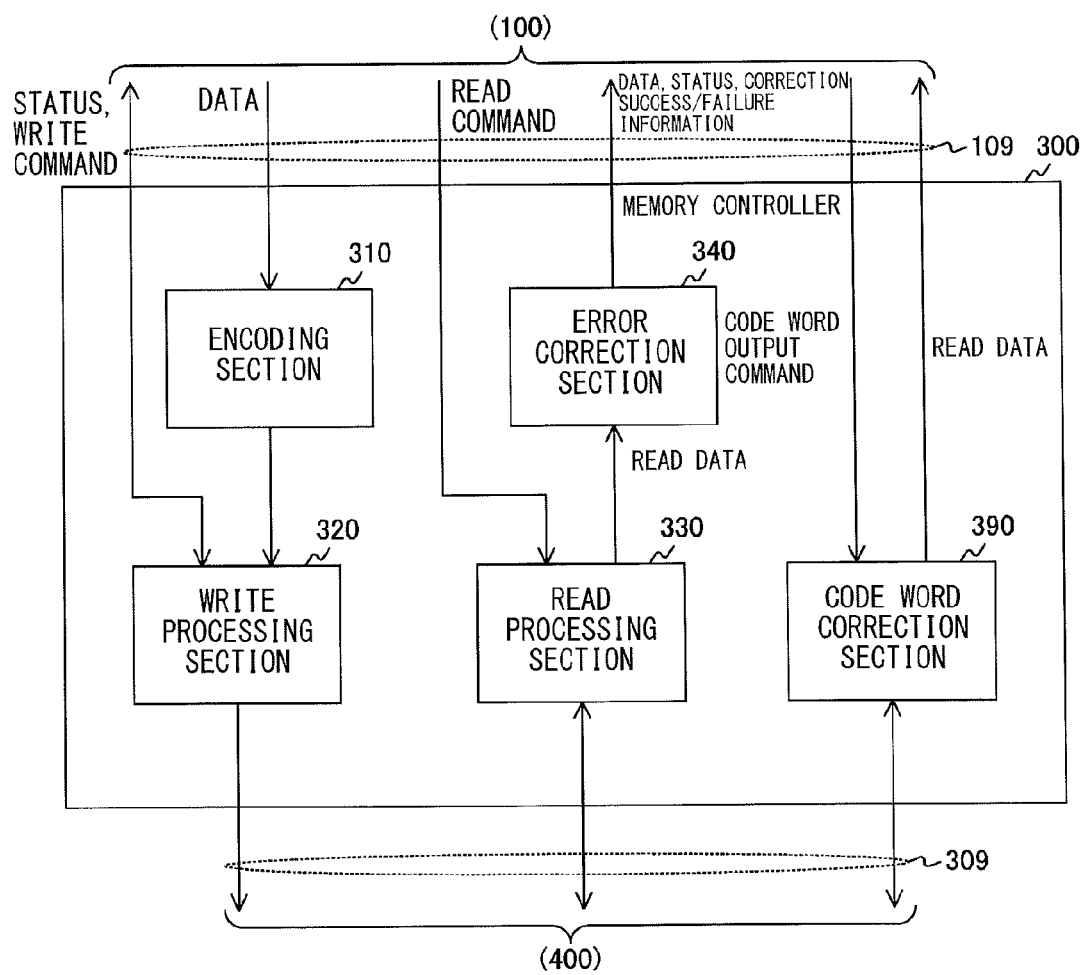
FIG. 36 is a block diagram illustrating a configuration example of a memory controller according to the third embodiment.

FIG. 36 is a block diagram illustrating a configuration example of the memory 300 according to the third embodiment. The configuration of the memory controller 300 according to the third embodiment differs from that according to the first embodiment in that the memory controller 300 further includes a code word output section 390.

The code word output section 390 is configured to read read data (n bits) from the non-volatile memory 400, and outputs the read data to the host computer 100 in response to a code word output command.

Moreover, the error correction section 340 according to the third embodiment differs from that according to the first embodiment in that correction success/failure information is output to the host computer 100 as well.

Configuration Example of Error Correction Section

Figure 37:
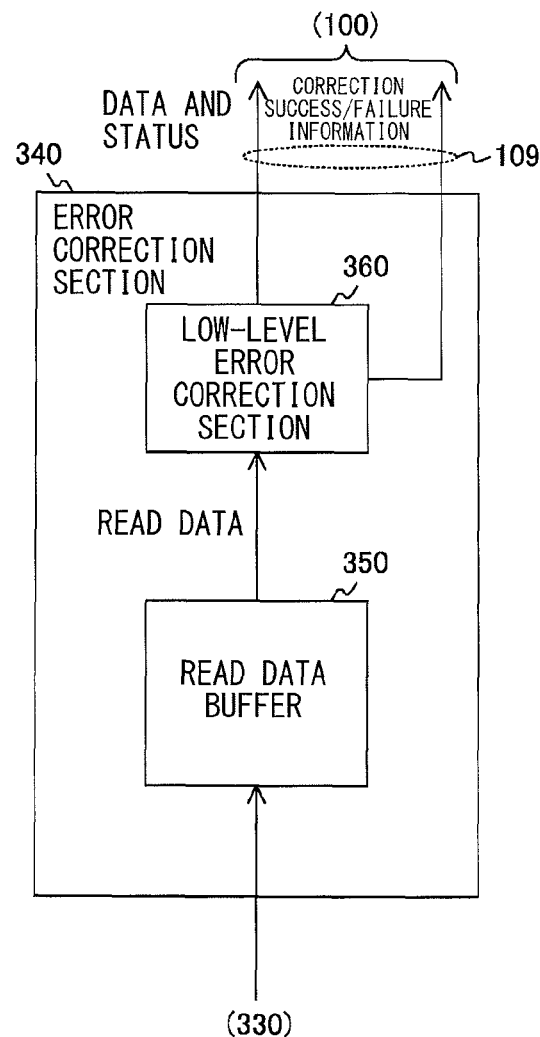
FIG. 37 is a block diagram illustrating a configuration example of an error correction section according to the third embodiment.

FIG. 37 is a block diagram illustrating a configuration example of the error correction section 340 according to the third embodiment. The error correction section 340 according to the third embodiment differs from that according to the first embodiment in that the error correction section 340 does not include the error correction program storage section 370 and the high-level soft-decision error correction section 380. Moreover, the low-level error correction section 360 according to the third embodiment outputs correction success/failure information to the host computer 100.

Operation Example of Host Computer

Figure 38:
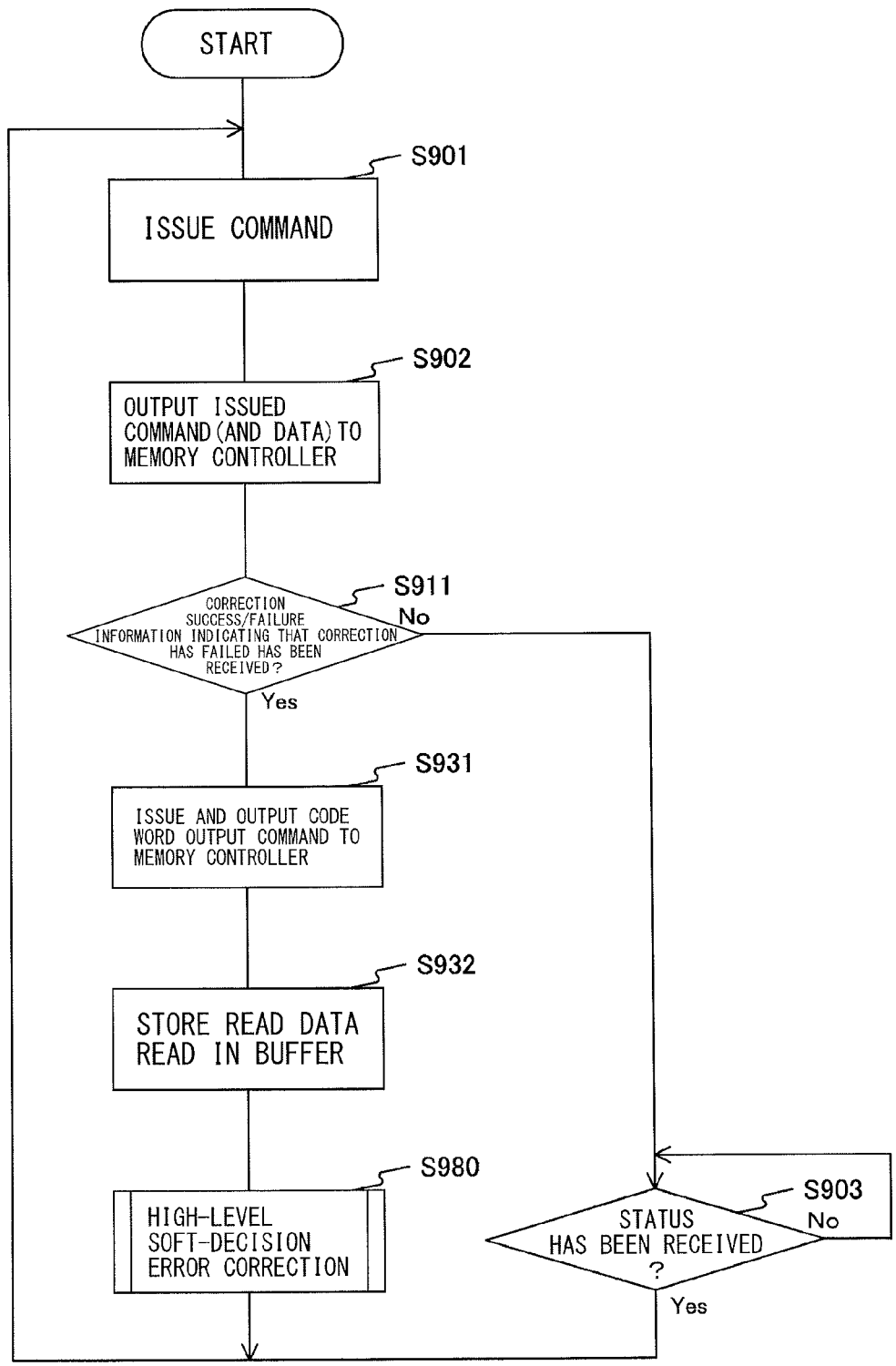
FIG. 38 is a flow chart illustrating an example of an operation of the host computer according to the third embodiment.

FIG. 38 is a flow chart illustrating an example of an operation of the host computer 100 according to the third embodiment. The host computer 100 according to the third embodiment differs from that according to the first embodiment in that steps S911, S931, S932, and S980 are further executed.

The host computer 100 determines, after the step S902, whether or not correction success/failure information indicating that correction has failed has been received (step S911). In a case where the host computer 100 has received the correction success/failure information indicating that the correction has failed (step S911: Yes), the host computer 100 issues a code word output command specifying an address of read data to which the error correction has failed. Then, the host computer 100 outputs the code word output command to the memory controller 300 (step S931). The host computer 100 stores read data read from the memory controller 300 in the read data buffer 130 (step S932). The host computer 100 executes high-level soft-decision error correction (step S980), and returns to the step S901.

In a case where the host computer 100 has not received the correction success/failure information indicating that the correction has failed (step S911: No), the host computer 100 executes the step S903.

Operation Example of Memory Controller

Figure 39:
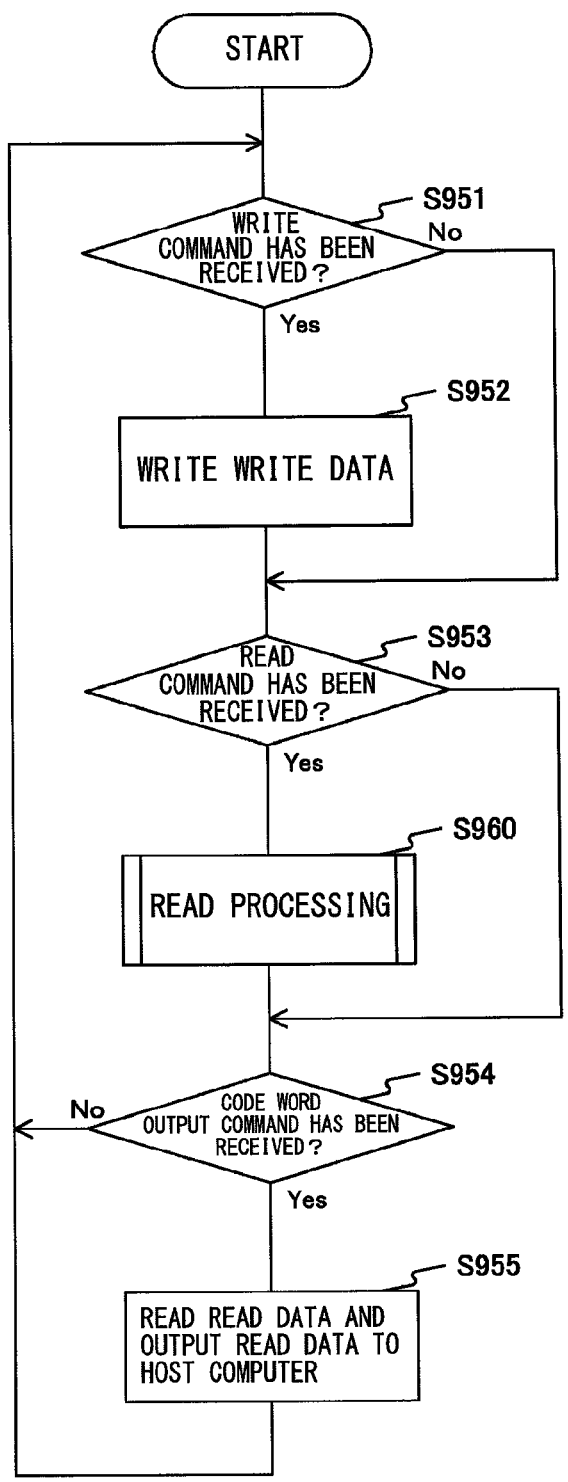
FIG. 39 is a flow chart illustrating an example of an operation of the memory controller according to the third embodiment.

FIG. 39 is a flow chart illustrating an example of an operation of the memory controller 300 according to the third embodiment. The memory controller 300 according to the third embodiment differs from that according to the first embodiment in that steps S954 and S955 are further executed.

In a case where the memory controller 300 has not received a read command (step S953: No), or after the step S960, the memory controller 300 determines whether or not a code word output command has been received (step S954). In a case where the memory controller 300 has received the code word output command (step S954: Yes), the memory controller 300 reads read data (n bits) from the non-volatile memory 400 and outputs the read data to the host computer 100 in response to the code word output command (step S955). In a case where the memory controller 300 has not received the code word output command (step S954: No), or after the step S955, the memory controller 300 returns to the step S951.

Figure 40:
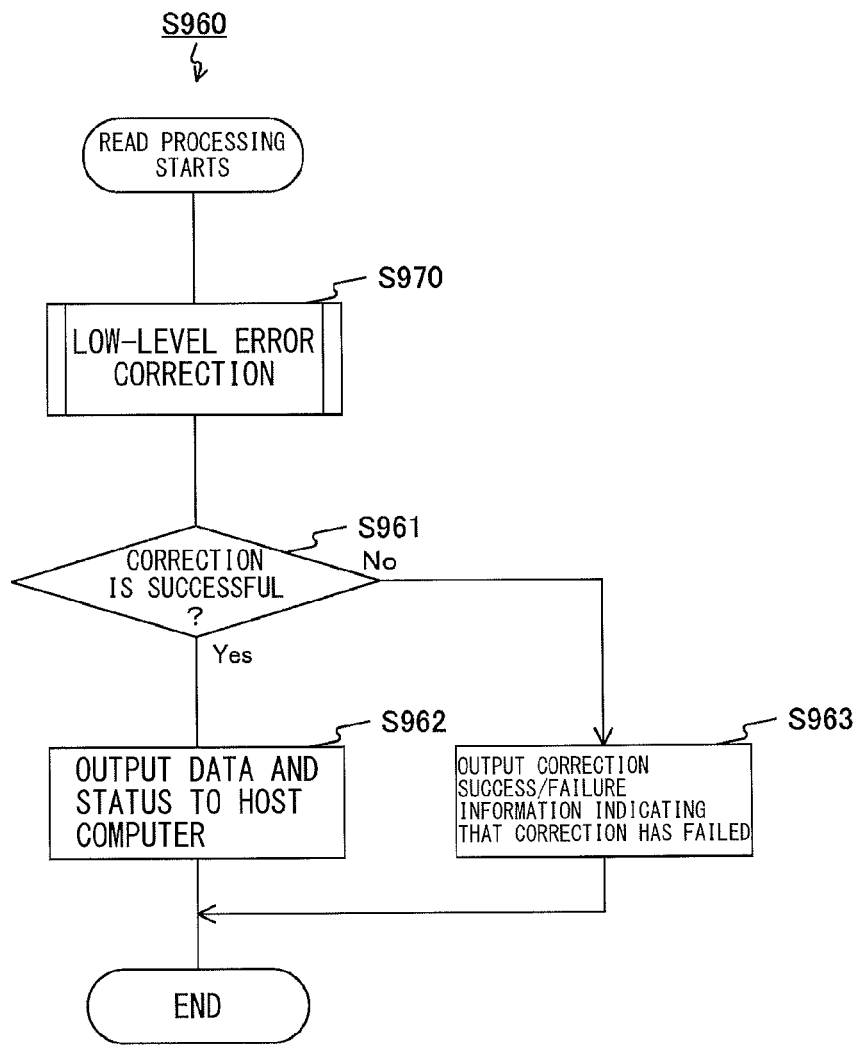
FIG. 40 is a flow chart illustrating an example of read processing according to the third embodiment.

FIG. 40 is a flow chart illustrating an example of read processing according to the third embodiment. The read processing according to the third embodiment differs from that according to the first embodiment in that a step S963 is executed instead of the step S980.

In a case where the correction is successful (step S961: Yes), the memory controller 300 outputs, to the host computer 100, original data (k bits) that is the corrected code word without parity, and the status (step S962). On the other hand, in a case where the correction has failed (step S961: No), the memory controller 300 outputs, to the host computer 100, correction success/failure information indicating that correction has failed (step S963). After the step S962 or the step S963, the memory controller 300 terminates the read processing.

Thus, in the third embodiment, the host computer 100 executes the high-level soft-decision error correction; therefore, the host computer 100 is allowed to use more abundant resources than the memory controller 300 in the high-level soft-decision error correction.

4. Fourth Embodiment

Configuration Example of Host Computer

In the third embodiment, the host computer 100 inputs a hard-decision value to the high-level soft-decision error correction section 140; however, error correction becomes easier by inputting a soft-decision value. The host computer 100 according to a fourth embodiment differs from that according to the third embodiment in that the host computer 100 generates a soft-decision value, and inputs the soft-decision value to the high-level soft-decision error correction section 140.

Figure 41:
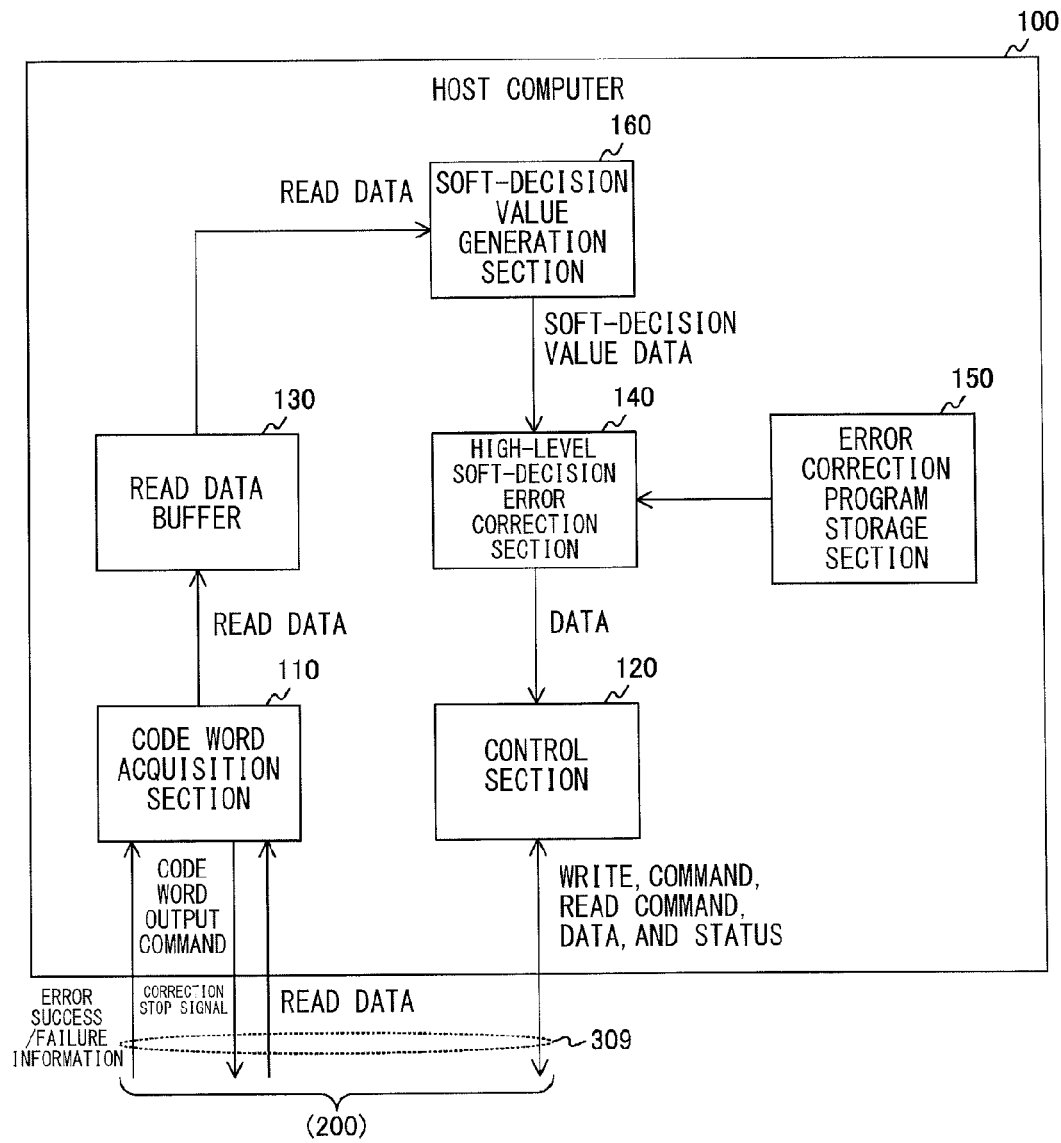
FIG. 41 is a block diagram illustrating a configuration example of a host computer according to a fourth embodiment.

FIG. 41 is a block diagram illustrating a configuration example of the host computer 100 according to the fourth embodiment. The host computer 100 according to the fourth embodiment differs from that according to the third embodiment in that the host computer 100 further includes a soft-decision value generation section 160.

Moreover, when the code word acquisition section 110 according to the fourth embodiment receives correction success/failure information indicating that correction has failed, the code word acquisition section 110 generates a correction stop signal, and outputs the correction stop signal to the storage 200 for a fixed period. Moreover, the host computer 100 outputs a code word output command to the storage 200 a plurality of times in fixed cycles during output of the correction stop signal.

The correction stop signal is a signal instructing the memory controller 300 to suspend the low-level error correction for a fixed period. Moreover, cycles in which the code word output command is output may be, for example, cycles in which a data value is varied by random telegraph noise or the like. The code word acquisition section 110 stores each of read data acquired a plurality of times in the read data buffer 130.

The soft-decision value generation section 160 is configured to generate a soft-decision value from read data read a plurality of times. The soft-decision value generation section 160 generates a soft-decision value corresponding to probability that each of bits is "1" or "0", based on each of a plurality of read data stored in the read data buffer 130. In this case, in a non-volatile memory, random telegraph noise that is noise causing variation in the data value with time may be generated. When such noise is generated, and same data is read a plurality of times at different timings, values of these data may be different from one another. Probability that each of bits is "1" or "0" is determined by keeping statistics on the values of these data. For example, in a case where the number of times same read data has been read is 10 times, and the number of times read data in which a value of a first bit is "1" has been read is 9 times, probability that the first bit is "1" is 0.9. On the other hand, probability that the first bit is "0" is 0.1. In a case where a log likelihood ratio is used as the soft-decision value, a value of ln9 ($\approx$2.2) is determined by the expression 1 as the soft-decision value. The soft-decision value generation section 160 determines soft-decision values of all bits in read data, generates soft-decision value data containing these soft-decision values, and supplies the thus-generated soft-decision value data to the high-level soft-decision error correction section 140.

The high-level soft-decision error correction section 140 uses the soft-decision values in the soft-decision value data as a message $u_{0\_OH}$ in the expression 6 to perform error correction.

It is to be noted that, as exemplified in the first embodiment, a configuration according to the fourth embodiment is applicable to a configuration in which the memory controller 300 performs error correction by a high-level algorithm. In this case, the soft-decision value generation section 160 is provided to the memory controller 300.

FIGS. 42A to 42D are diagrams illustrating an example of read data and the soft-decision values according to the fourth embodiment. A case where the memory controller 300 reads read data from an address A and error correction to the read data fails is considered.

In this case, the host computer 100 generates a correction stop signal, and outputs, to the memory controller 300, a code word output command specifying the address A a plurality of times (for example, three times). The memory controller 300 reads read data from the address A the plurality of times, and outputs the read data to the host computer 100 without performing error correction.

FIG. 42A illustrates an example of read data #1 read from the address A for a first time. It is assumed that a code length of a code word is n bits. FIG. 42B illustrates an example of read data #2 read from the address A for a second time, and FIG. 42C illustrates an example or read data #3 read from the address A for a third time. FIG. 42D illustrates an example of soft-decision value data generated from the read data #1 to #3. The soft-decision value data may be data containing an n-number of floating-point data, for example.

For example, in a case where all of values of 0th bits of the read data #1 to #3 are "0", probability that the 0th bit is "0" is 1.0; therefore, a negative infinite value is acquired as the value of the bit by the expression 1. In this case, a minimum value in a numerical range represented by signed floating-point data is generated as a soft-decision value. Moreover, in a case where the first bit of the read data #1 is "1", and the first bits of the read data #2 and #3 are "0", probability that the first bit is "1" is ⅓. In this case, as a soft-decision value of the first bit, ln 2 ($\approx$0.7) is generated by the expression 1. Likewise, a soft-decision value of each of n bits is generated. Data containing such n-number of soft-decision values is generated as soft-decision value data.

It is to be noted that the host computer 100 acquires the soft-decision value data from data read a plurality of times; however, the soft-decision values may be acquired by a different method. For example, a memory cell in the non-volatile memory 400 may include an A/D (Analog to Digital) converter, and a value of data stored in the memory cell may be read as the soft-decision value, and be A/D converted, and then be output. The host computer 100 acquires the soft-decision value read from the memory cell, and performs error correction.

Configuration Example of Memory Controller

Figure 43:
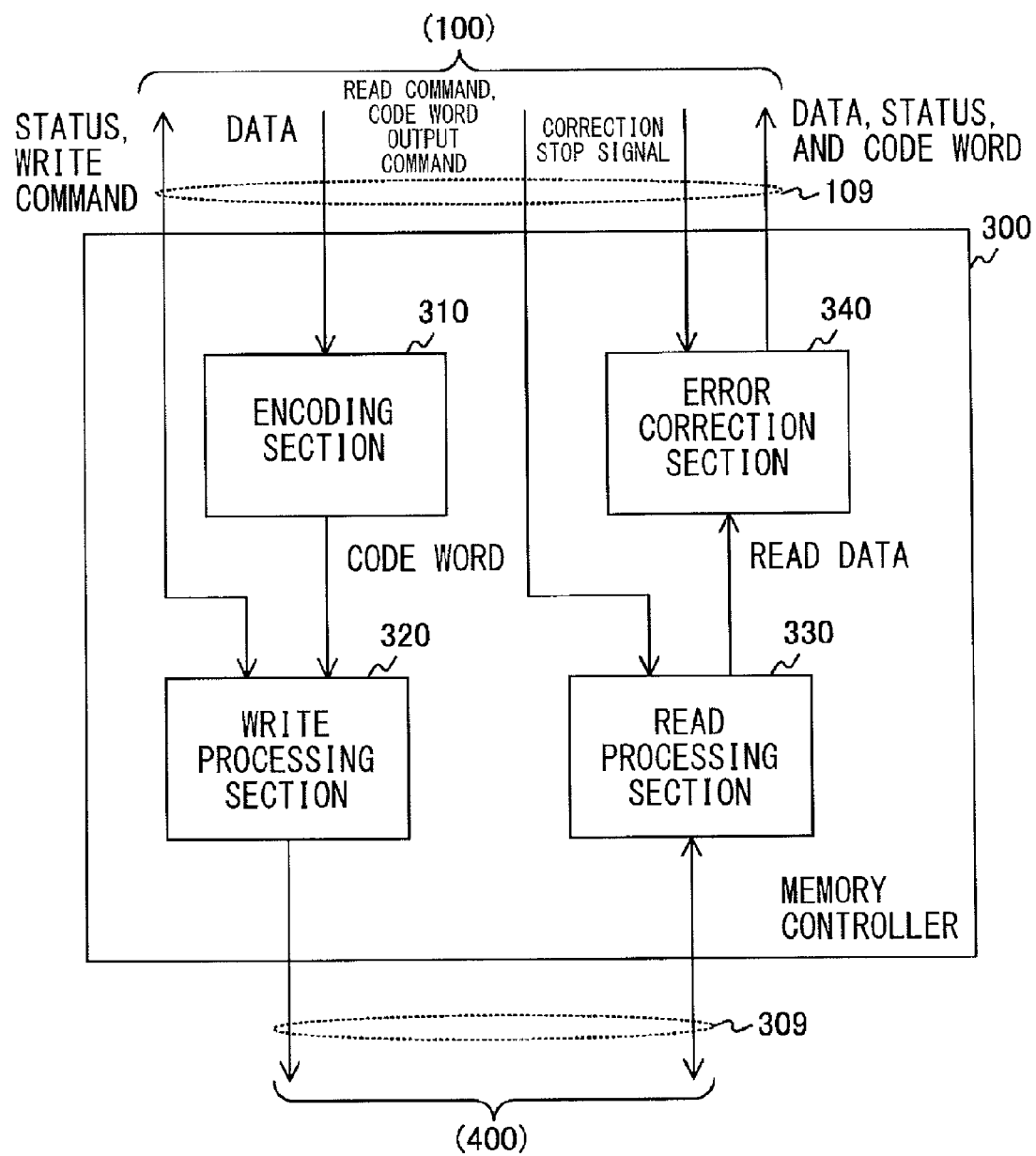
FIG. 43 is a block diagram illustrating a configuration example of a memory controller according to the fourth embodiment.

FIG. 43 is a block diagram illustrating a configuration example of the memory controller 300 according to the fourth embodiment. When the read processing section 330 according to the third embodiment receives a read command or a code word output command, the read processing section 330 reads read data from the non-volatile memory 400, and supplies the read data to the error correction section 340. The error correction section 340 outputs the read data without performing error correction to the read data during output of a correction stop signal from the host computer 100.

Operation Example of Host Computer

Figure 44:
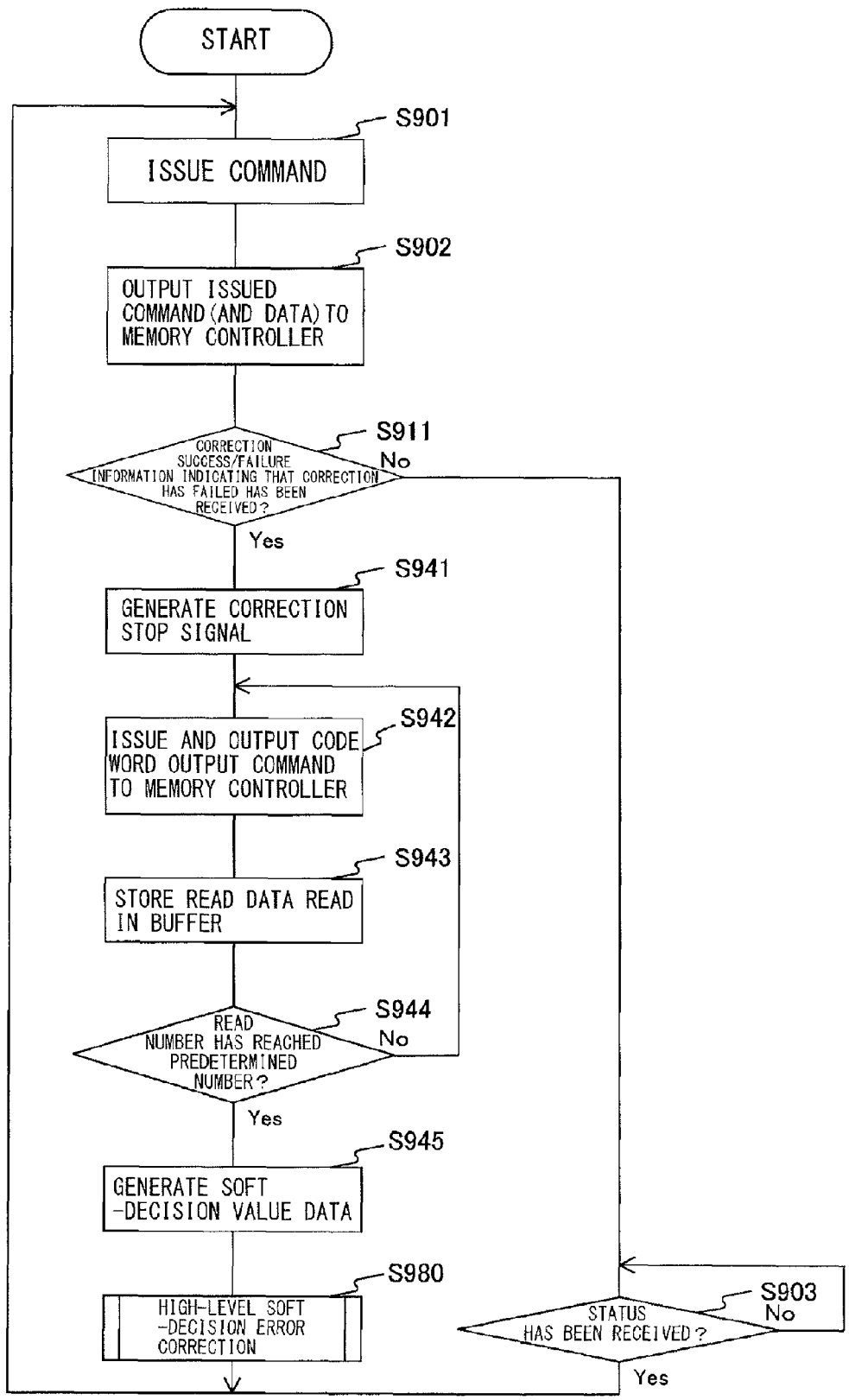
FIG. 44 is a flow chart illustrating an example of an operation of the host computer according to the fourth embodiment.

FIG. 44 is a flow chart illustrating an example of an operation of the host computer 100 according to the fourth embodiment. The host computer 100 according to the fourth embodiment differs from that according to the third embodiment in that steps S941 to S945 are executed instead of the steps S931 and S932.

In a case where the host computer 100 has received correction success/failure information indicating that correction has failed (step S911: Yes), the host computer 100 generates a correction stop signal, and starts to output the correction stop signal to the memory controller 300 (step S941). Then, the host computer 100 issues a code word output command specifying an address where read data to which error correction has failed is stored. Then, when a fixed period has passed since last reading of read data, the host computer 100 outputs a code word output command to the memory controller 300

(step S942). The host computer 100 stores the read data read from the memory controller 300 in the read data buffer 130 (step S943).

The host computer 100 determines whether or not the number of times read data is read has reached a predetermined number (step S944). In a case where the number of times read data is read is less than the predetermined number (step S944: No), the host computer 100 returns to the step S942. In a case where the number of times read data is read has reached the predetermined number (step S944: Yes), the host computer 100 generates, from the respective read data, soft-decision value data representing a soft-decision value of each bit of read data (step S945). The host computer 100 executes high-level soft-decision error correction with use of the soft-decision value as an input value (step S980).

Figure 45:
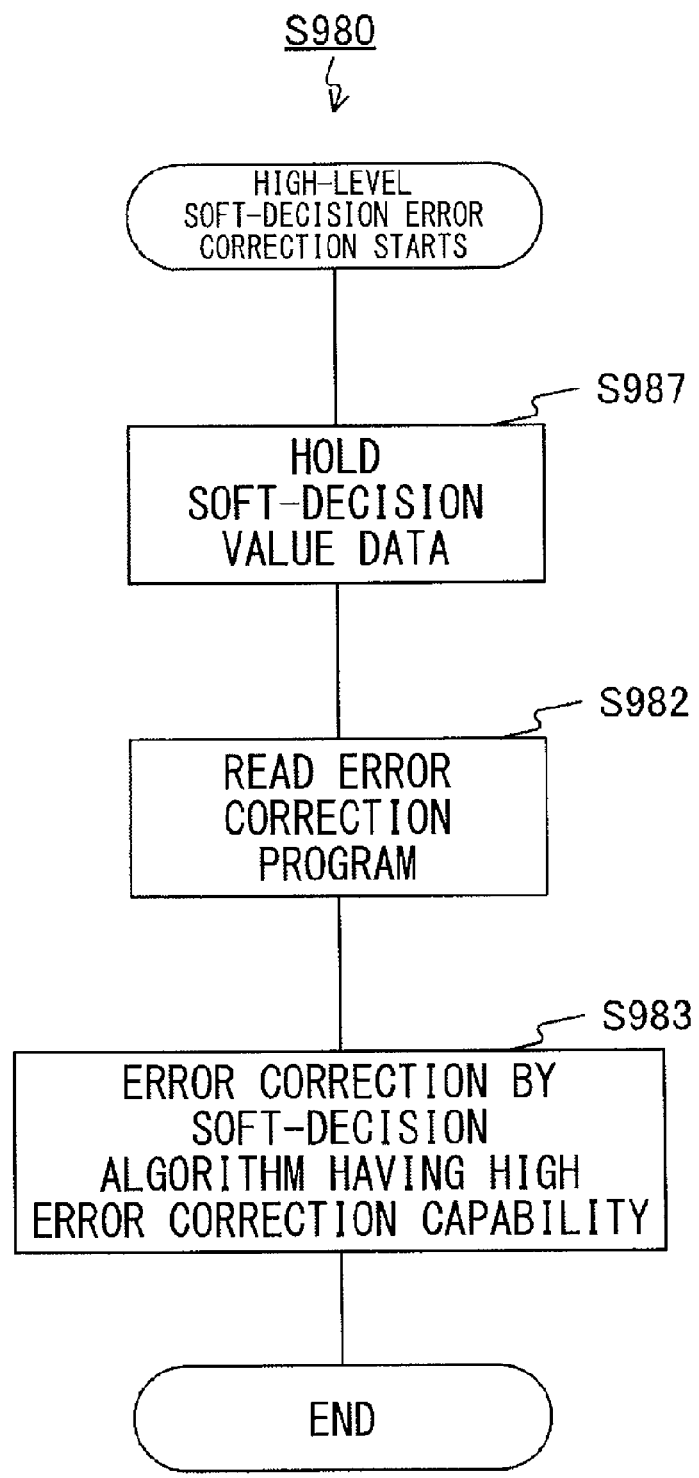
FIG. 45 is a flow chart illustrating an example of high-level soft-decision error correction according to the fourth embodiment.

FIG. 45 is a flow chart illustrating an example of the high-level soft-decision error correction according to the fourth embodiment. The high-level soft-decision error correction according to the fourth embodiment differs from that according to the first embodiment in that a step S987 is executed instead of the step S981.

The host controller 100 holds generated soft-decision value data (step S987), and executes the steps S982 and S983 with use of the soft-decision value data.

Operation Example of Memory Controller

Figure 46:
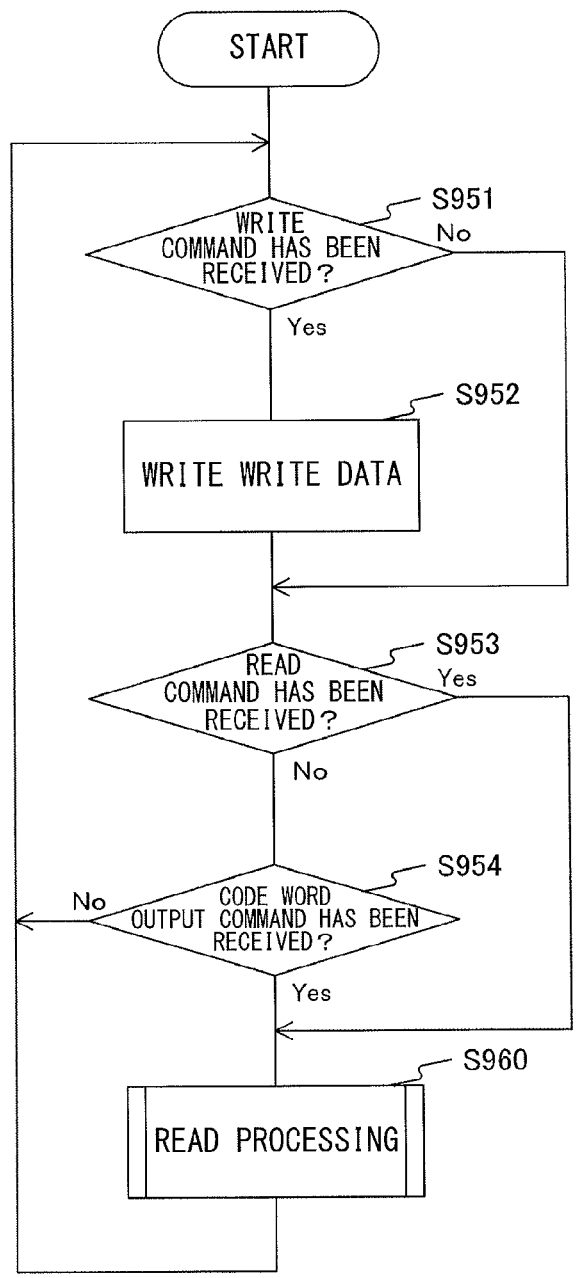
FIG. 46 is a flow chart illustrating an example of an operation of the memory controller according to the fourth embodiment.

FIG. 46 is a flow chart illustrating an example of an operation of the memory controller 300 according to the fourth embodiment. The memory controller 300 according to the fourth embodiment differs from that according to the first embodiment in that a step S954 is further executed.

In a case where the memory controller 300 has not received a read command (step S953: No), the memory controller 300 determines whether or not a code word output command has been received (step S954). In a case where the memory controller 300 has received the read command (step S953: Yes), or in a case where the memory controller 300 has received the code word output command (step S954: Yes), the memory controller 300 executes read processing (step S960). In a case where the memory controller 300 has not received the code word command (step S954: No), or after the step S960, the memory controller 300 returns to the step S951.

Figure 47:
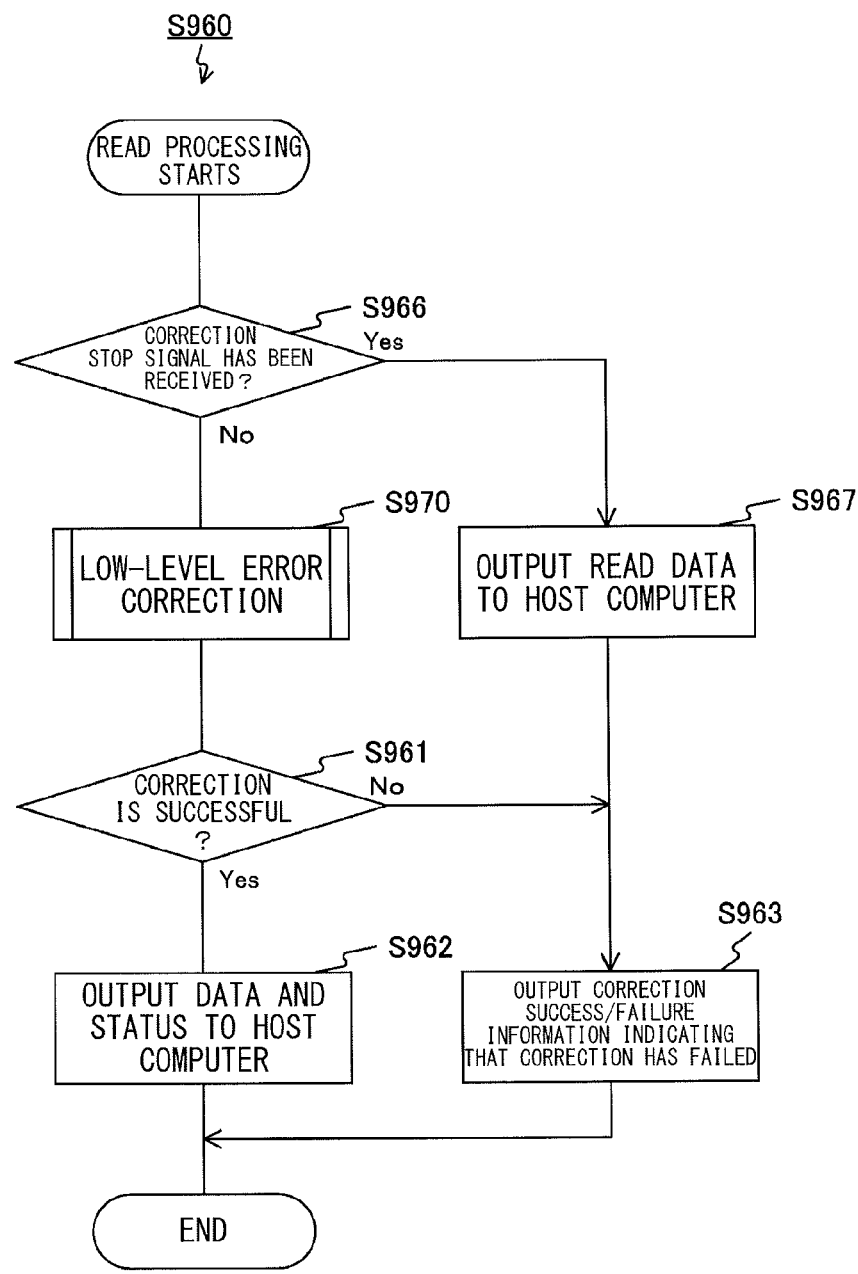
FIG. 47 is a flow chart illustrating an example of read processing according to the fourth embodiment.

FIG. 47 is a flow chart illustrating an example of the read processing according to the fourth embodiment. The read processing according to the fourth embodiment differs from that according to the first embodiment in that steps S963, S966, and S967 are executed instead of the step S980.

The memory controller 300 determines whether or not the correction stop signal has been received (step S966). In a case where the memory controller 300 has received the correction stop signal (step S966: Yes), the memory controller 300 reads read data and outputs the read data to the host computer 100 in response to the code word output command (step S967). On the other hand, in a case where the memory controller 300 has not received the correction stop signal (step S966: No), the memory controller 300 executes the low-level error correction (step S970). The memory controller 300 determines whether or not correction in the low-level error correction is successful (step S961).

In a case where the correction is successful (step S961: Yes), the memory controller 300 outputs, to the host computer 100, original data (k bits) that is the corrected code word without parity, and the status (step S962).

In a case where the correction has failed (step S961: No), or after the step S967, the memory controller 300 generates correction success/failure information indicating that the correction has failed, and outputs the correction success/failure information to the host computer 100 (step S963). After the step S962 or S963, the memory controller 300 terminates the read processing.

Thus, in the fourth embodiment, the host computer 100 generates the soft-decision value, and performs the high-level soft-decision error correction with use of the soft-decision value as an input value, thereby enabling to correct an error more easily than in a case where a hard-decision value is used as an input value. More specifically, error correction capability is improved. Moreover, time necessary for error correction is reduced.

Modification Example

In the fourth embodiment, the host computer 100 reads read data a plurality of times, and then performs error correction; however, error correction may be performed every time read data is read. In a case where an error rate is lower than expected, time necessary for error correction may be shorter in a case where error correction is performed every time read data is read. For example, a case is considered where, even though an expected error rate is to an extent that it is necessary to perform reading ten times, an actual error rate is to an extent that error correction is successful by performing reading five times. In this case, when error correction is performed every time reading is performed, error correction is successful at the fifth attempt; therefore, time necessary for error correction is shorter than that in a case where reading is performed ten times and then error correction is performed. The host computer 100 according to the present modification example of the fourth embodiment differs from that according to the fourth embodiment in that error correction is performed every time read data is read.

Figure 48:
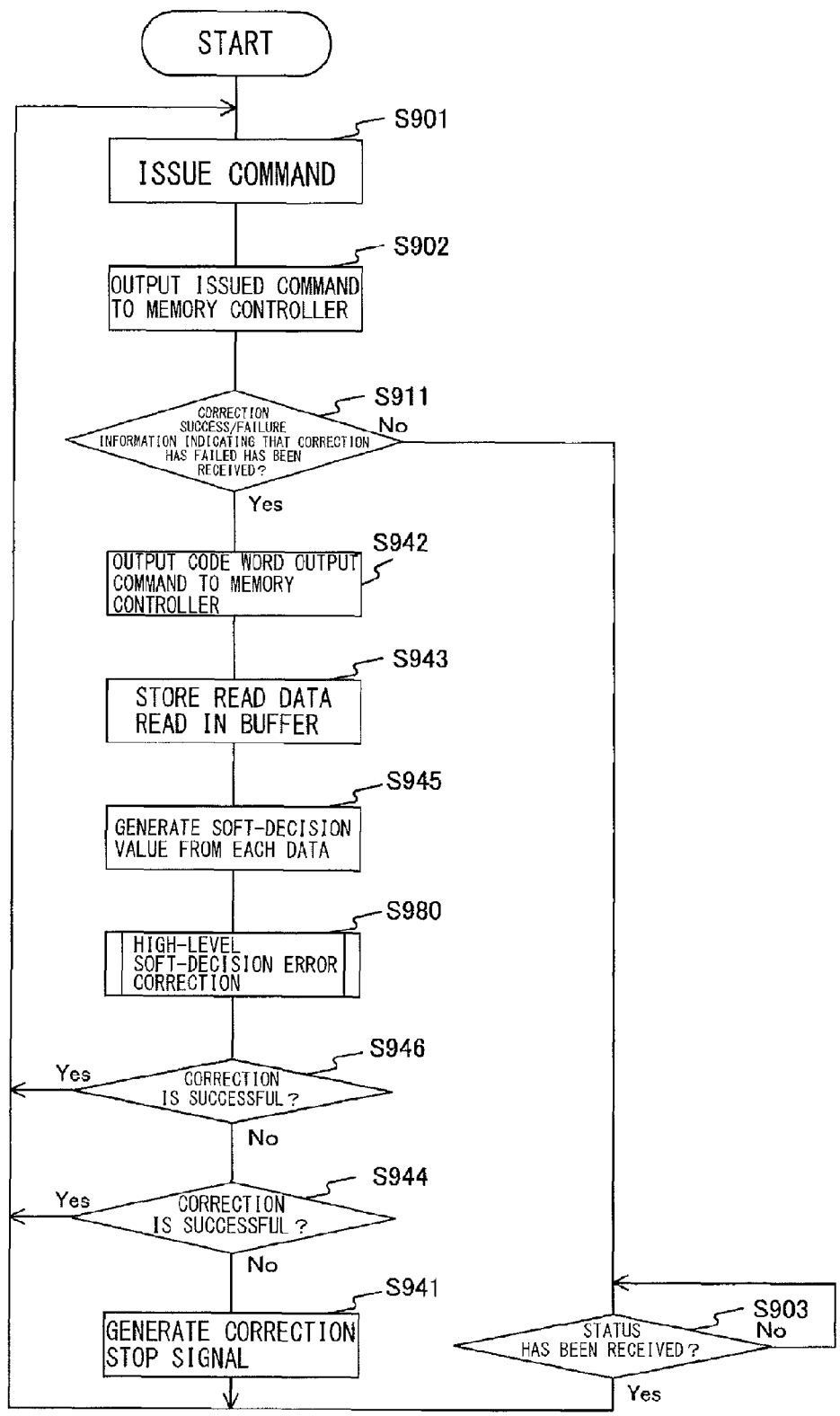
FIG. 48 is a flow chart illustrating an example of an operation of a host computer according to a modification example of the fourth embodiment.

FIG. 48 is a flow chart illustrating an example of an operation of the host computer 100 according to the modification example of the fourth embodiment. The host computer 100 according to the modification example differs from that according to the fourth embodiment in that high-level soft-decision error correction is executed every time read data is read.

More specifically, in a case where the host computer 100 has received correction success/failure information indicating that correction has failed (step S911: Yes), the host computer 100 outputs a code word output command to the memory controller 300 (step S942). The host computer 100 stores read data read from the memory controller 300 in the read data buffer 130 (step S943), and generates soft-decision value data (step S945). The host computer 100 executes the high-level soft-decision error correction with use of the soft-decision value data (step S980).

The host computer 100 determines whether or not error correction in the high-level soft-decision error correction is successful (step S946). In a case where the error correction has failed (step S946: No), the host computer 100 determines whether or not the number of times read data is read has reached a predetermined number (step S944). In a case where the number of times read data is read is less than the predetermined number (step S944: No), the host computer 100 generates a correction stop signal, and starts to output the correction stop signal to the memory controller 300 (step S941). After the step S941, the host computer 100 returns to the step S901. Moreover, in a case where the error correction is successful (step S946: Yes), or in a case where the number of times read data is read has reached the predetermined number (step S944: Yes), the host computer 100 executes predetermined processing, based on whether or not the error correction is successful, and returns to the step S901.

5. Fifth Embodiment

Configuration Example of Host Computer

In the fourth embodiment, the host computer 100 generates a soft-decision value from a plurality of read data read with use of a same threshold value; however, a soft-decision value may be generated from a plurality of read data read with use of different threshold values. The threshold value is a value used to determine whether a value of a bit stored in the non-volatile memory 400 is "1" or "0". The host computer 100 according to a fifth embodiment differs from that according to the fourth embodiment in that a soft-decision value is generated from a plurality of read data read with use of different threshold values.

In a case where the non-volatile memory 400 is a ReRAM, the non-volatile memory 400 includes a plurality of variable resistor elements, and a resistance value is used as a threshold value. These variable resistor elements are allowed to hold 1-bit data in two states, i.e., a high resistive state (HRS) and a low resistive state (LRS).

Figure 49:
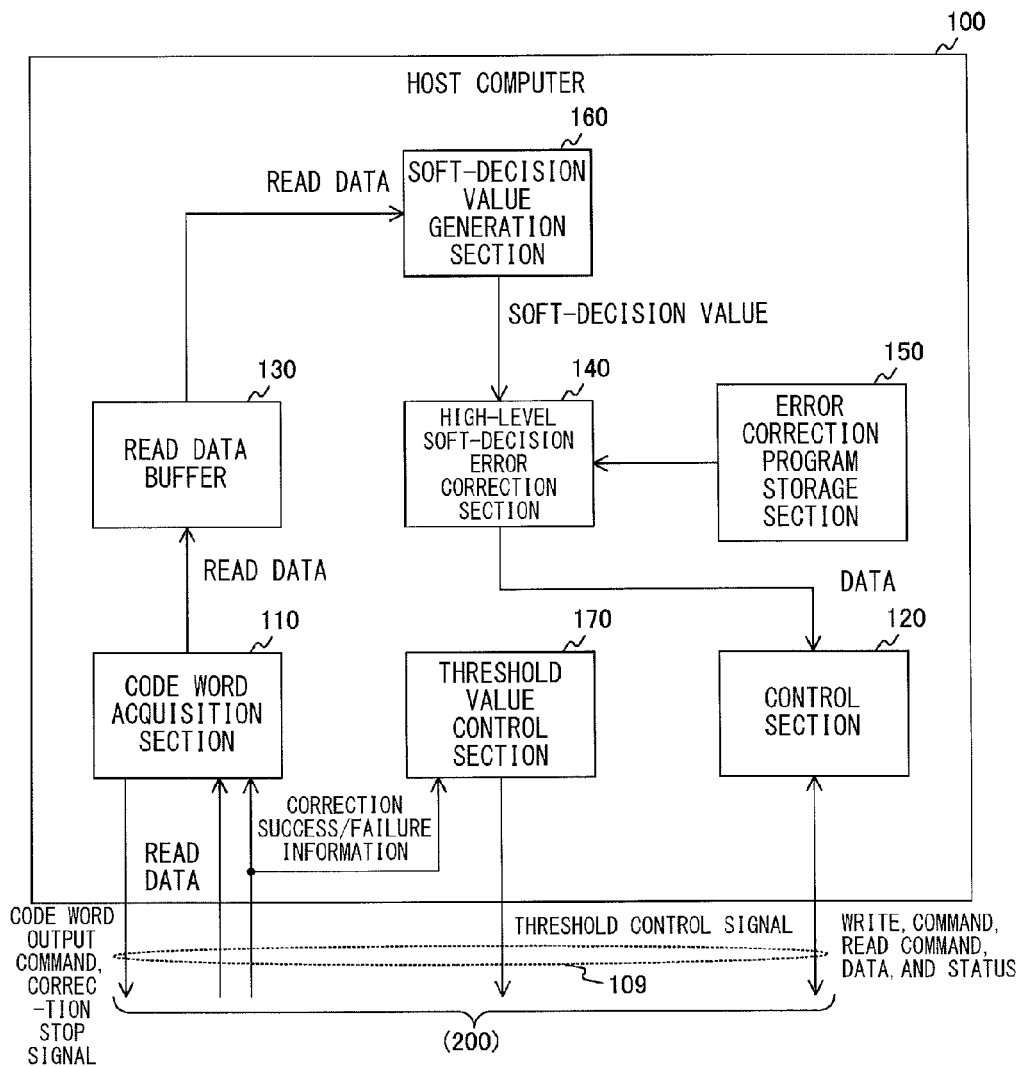
FIG. 49 is a block diagram illustrating a configuration example of a host computer according to a fifth embodiment.

FIG. 49 is a block diagram illustrating a configuration example of the host computer 100 according to the fifth embodiment. The host computer 100 according to the fifth embodiment differs from that according to the fourth embodiment in that a threshold value control section 170 is further provided.

The threshold value control section 170 is configured to control a threshold value when read data is to be read. The threshold value control section 170 receives a correction success/failure signal from the memory controller 300. In a case where the correction success/failure signal indicates that correction has failed, the threshold value control section 170 generates a control signal for controlling a threshold value when read data is to be read to be a threshold value different from a previous threshold value in a fixed range, and outputs the threshold value to the memory controller 300.

The soft-decision value generation section 160 according to the fifth embodiment generates a soft-decision value, based on a maximum value or a minimum value of threshold values when a specific value of "1" or "0" is read from a plurality of read data.

It is to be noted that, as exemplified in the first embodiment, a configuration according to the fifth embodiment is applicable to a configuration in which the memory controller 300 performs error correction by a high-level algorithm. In this case, the soft-decision value generation section 160 and the threshold value control section 170 are provided to the memory controller 300.

Configuration Example of Memory Controller

Figure 50:
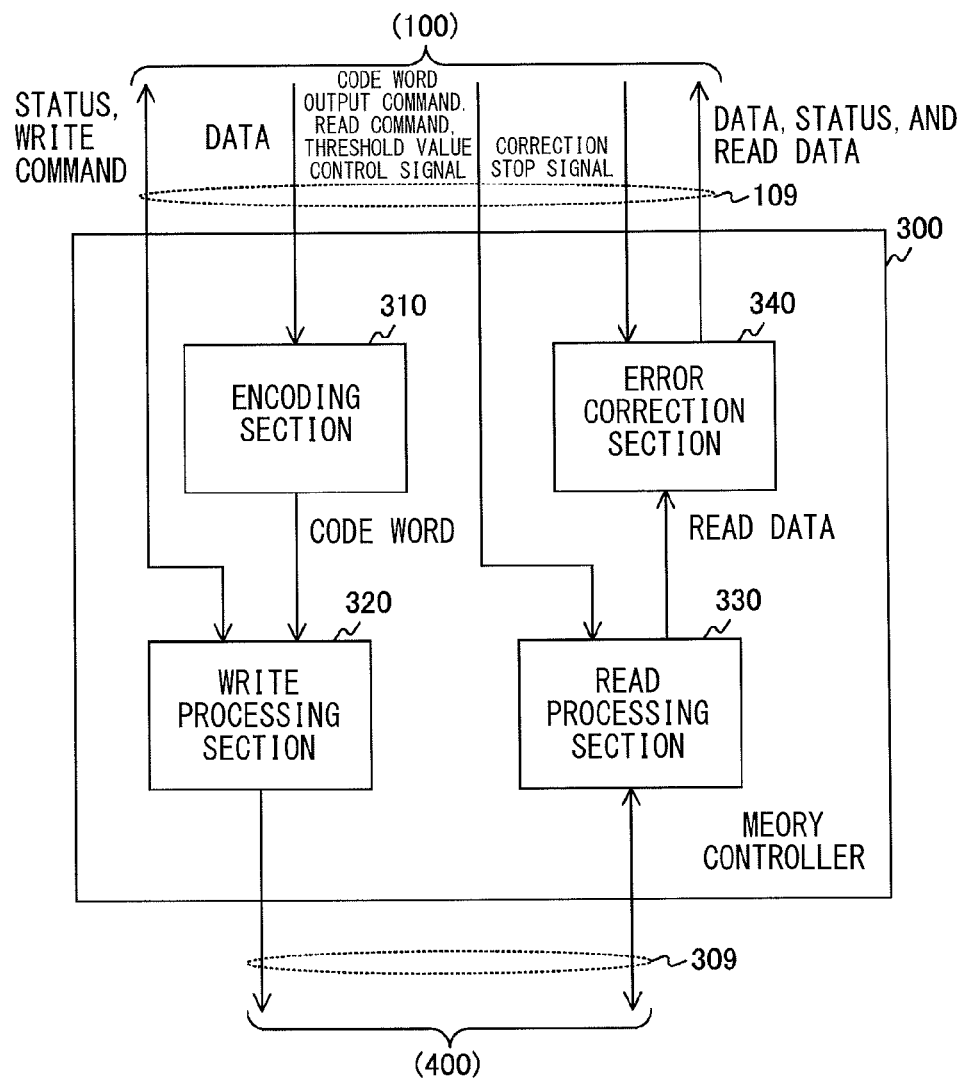
FIG. 50 is a block diagram illustrating a configuration example of a memory controller according to the fifth embodiment.

FIG. 50 is a block diagram illustrating a configuration example of the memory controller 300 according to the fifth embodiment. When the read processing section 330 according to the fifth embodiment receives a code word output command and a threshold value control signal from the host computer 100, the read processing section 330 controls the threshold value and reads read data in response to the threshold value control signal, and supplies the read data to the error correction section 340.

Figure 51:
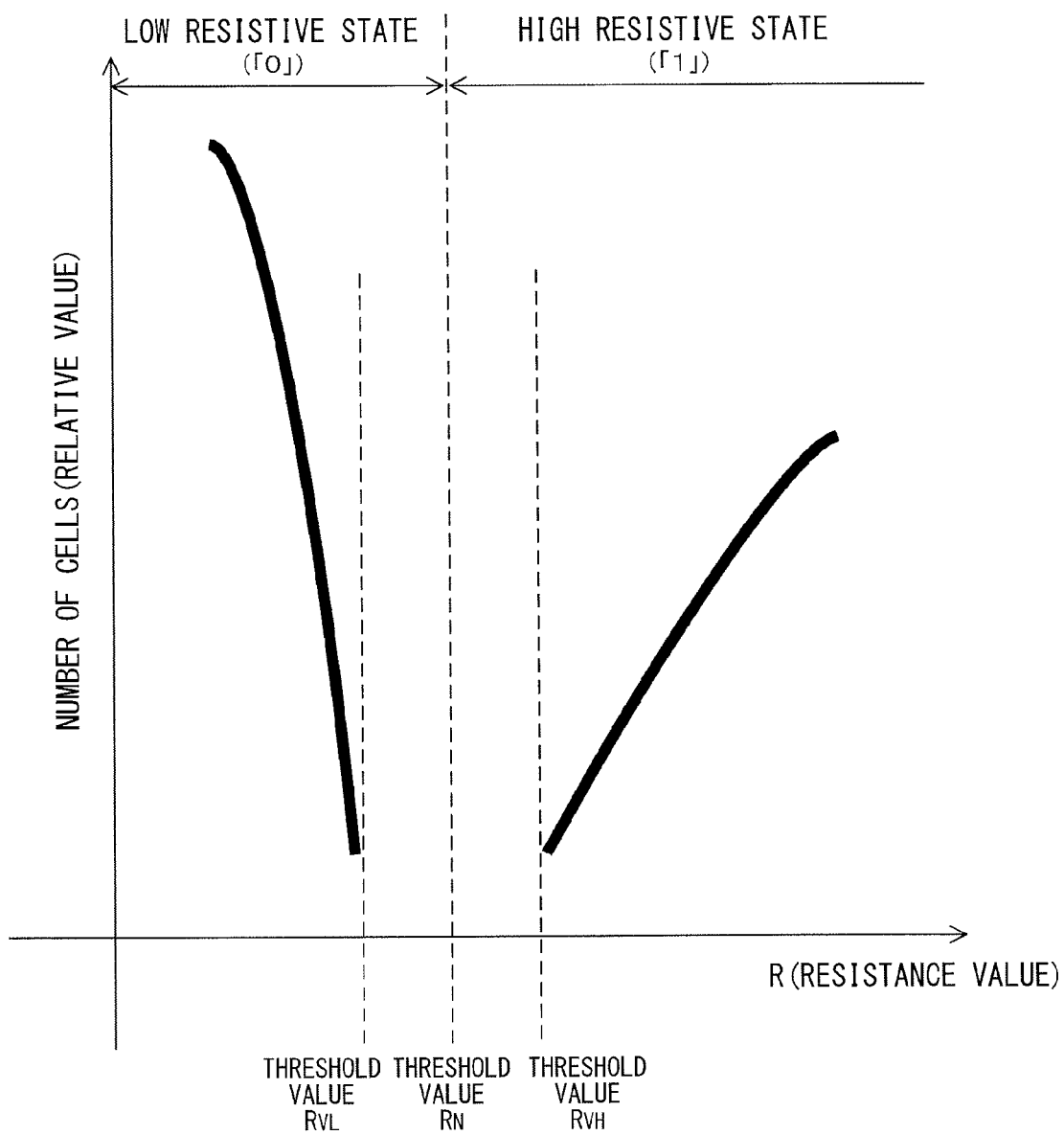
FIG. 51 is a diagram illustrating an example of a resistance distribution of variable resistor elements according to the fifth embodiment.

FIG. 51 is a diagram illustrating an example of a resistance distribution of the variable resistor elements in the fifth embodiment. A horizontal axis indicates a resistance value R, and a vertical value indicates a relative distribution of the number of cells in a relative value. As illustrated in the drawing, the resistance distribution of the variable resistor elements is separated into the low resistive state and the high resistive state.

The variable resistor elements each function as a memory cell by allowing the high resistive state and the low resistive state thereof to correspond to "0" and "1" or "1" and "0", respectively. Whether the high resistive state and the low resistive state correspond to "0" and "1", or "1" and "0", respectively, is optional. For example, the high resistive state may correspond to "1", and the low resistive state may correspond to "0".

A threshold value generally used, in a case where data stored in these variable resistor elements are read, to determine which one of the two states each of the variable resistor elements is in, i.e., which one of the two values each of the stored data is in, is defined as a threshold value $R_N$.

The closer a resistance value of a memory cell is to the threshold value $R_N$, the closer probability that a value of data stored in the memory cell is either one of "1" and "0" is to 0.5. The probability that the value of data is "1" or "0" being close to 0.5 means that the memory cell does not hold data properly. In other words, the probability represents an extent that data is stored properly. Therefore, in a case where the memory cell does not hold data properly, the memory controller 300 is allowed to prevent a decline in error correction capability by performing error correction, based on a soft-decision value corresponding to the probability.

An example is given in the following, where a predetermined threshold value smaller than the threshold value $R_N$ is defined as a threshold value $R_{VL}$, and a predetermined threshold value larger than the threshold value $R_N$ is defined as a threshold value $R_{VH}$. In a case where read data to which error correction has failed is read a plurality of times, the threshold value is controlled in a range from the threshold value $R_{VL}$ to the threshold value $R_{VH}$.

FIG. 52 is a diagram for describing a method of generating a soft-decision value according to the fifth embodiment. A case is considered where read data is read with use of four threshold values, i.e., threshold values $R_{VL}$, $R_L$, $R_H$, and $R_{VH}$. In this case, the threshold value $R_{VL}$ is smaller than the threshold value $R_L$, and the threshold value $R_L$ is smaller than the threshold value $R_H$. Moreover, the threshold value $R_H$ is smaller than the threshold value $R_{VH}$. The threshold value is controlled to respective threshold values in any order.

The resistance value of the memory cell is allowed to be estimated by statistics of values read from the memory cell at the respective threshold values, and a soft-decision value corresponding to probability that the bit stored in the memory cell is "1" or "0" is allowed to be determined from that resistance value. For example, the soft-decision value may be determined, based on a maximum value of the threshold values when "1" is read. Alternatively, the soft-decision value may be determined, based on a minimum value of the threshold values when "0" is read.

More specifically, a case where "1" is read at all of the threshold values $R_{VL}$, $R_L$, $R_H$, and $R_{VH}$, i.e., a case where a maximum threshold value when "1" is read is $R_{VH}$ is considered. In this case, "1" is read even in a case where the resistance value is at the maximum threshold value $R_{VH}$; therefore, the resistance value of the memory cell is larger than the threshold value $R_{VH}$. Since the resistance value of the memory cell is sufficiently large, the probability that data stored in the memory cell is "1" is sufficiently high, and is expected to be 1.0. Therefore, a positive infinite soft-decision value is generated by the expression 1.

Next, a case is considered where "1" is read at the threshold values $R_{VL}$ and $R_L$, i.e., a case where the maximum threshold value when "1" is read is $R_L$. In this case, the resistance value of the memory cell is a value intermediate between the threshold value $R_{VL}$ and the threshold value $R_{VH}$. Since the resistance value of the memory cell is close to the threshold value $R_N$, the probability that data stored in the memory cell is "1" is expected to be close to 0.5. Therefore, a soft-decision value of 0.0 is generated by the expression 1.

Further, a case where "0" is read at all of the threshold values $R_{VL}$, $R_L$, $R_H$, and $R_{VH}$, i.e., a case where the maximum threshold value when "1" is read is smaller than $R_{VL}$ is considered. In this case, since "0" is read even though the resistance value is at the minimum threshold value $R_{VL}$, the resistance value of the memory cell is smaller than the threshold value $R_{VL}$. Since the resistance value of the memory cell is extremely small, the probability that data stored in the memory cell is "1" is extremely low, and is expected to be 0.0. Therefore, a positive infinite soft-decision value is generated by the expression 1.

Furthermore, in a case where the maximum threshold value when "1" is read is $R_H$, a predetermined soft-decision value (for example, 1.1) between a positive infinite value and 0.0 is generated. In a case where the maximum threshold value when "1" is read is $R_{VL}$, a predetermined soft-decision value (for example, -1.1) between a negative infinite value and 0.0 is generated.

Operation Example of Host Computer

Figure 53:
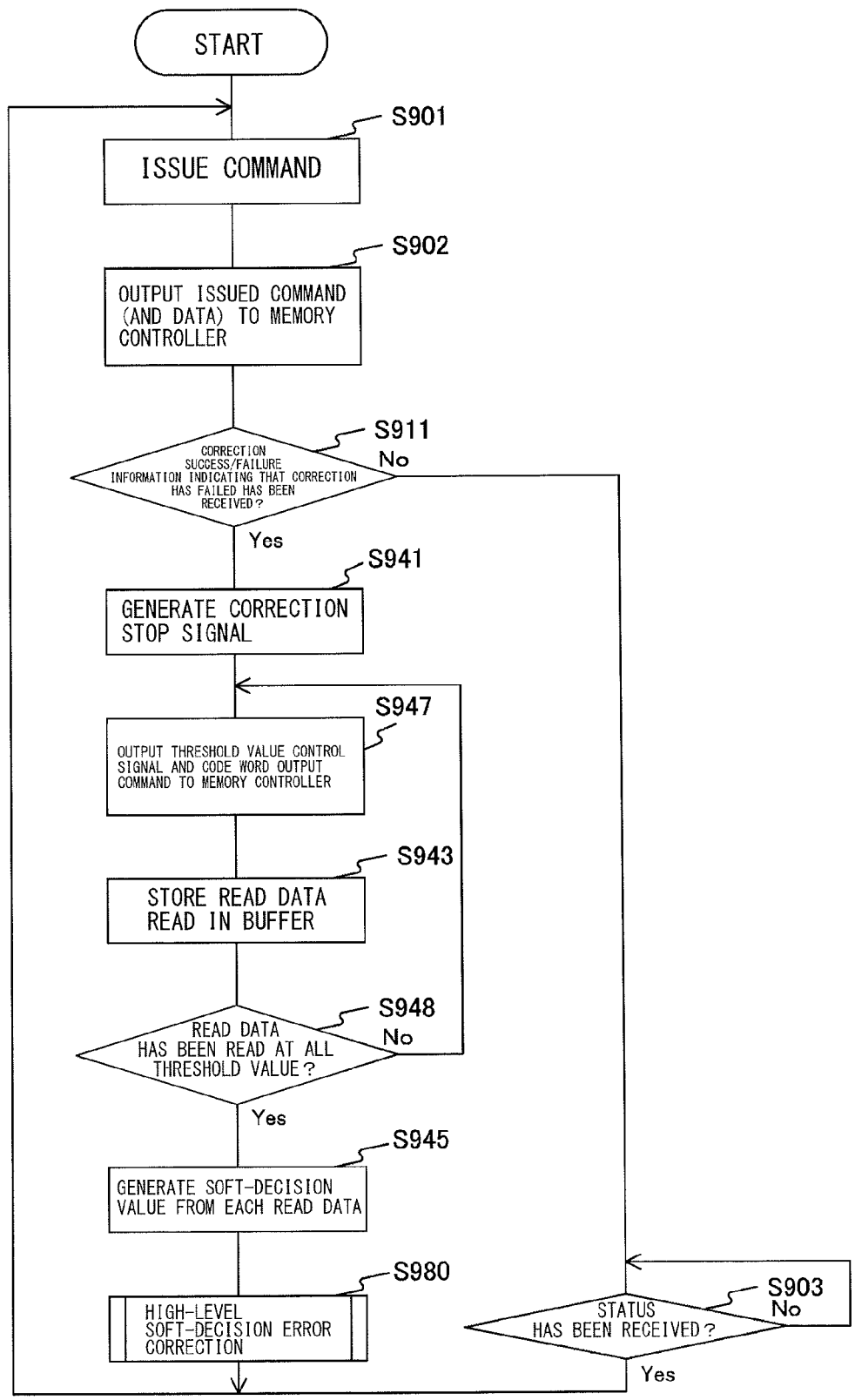
FIG. 53 is a flow chart illustrating an example of an operation of the host computer according to the fifth embodiment.

FIG. 53 is a flow chart illustrating an operation of the host computer 100 according to the fifth embodiment. The host computer 100 according to the fifth embodiment differs from that according to the fourth embodiment in that steps S947 and S948 are executed instead of the steps S942 and S944.

The host computer 100 starts to output a stop signal to the memory controller 300 (step S941), and outputs, to the memory controller 300, a threshold value control signal for controlling the threshold value to a value different from a previous threshold value, and code word output command (step S947). The host computer 100 stores read data read from the memory controller 300 in the read data buffer 130 (step S943). The host computer 100 determines whether or not read data has been read at all of the threshold values in a fixed range (step S948). In a case where read data has not been read at all of the threshold values (step S948: No), the host computer 100 returns to the step S947. On the other hand, in a case where read data has been read at all of the threshold values (step S948: Yes), the host computer 100 generates soft-decision value data from respective read data (step S945).

Operation Example of Memory Controller

Figure 54:
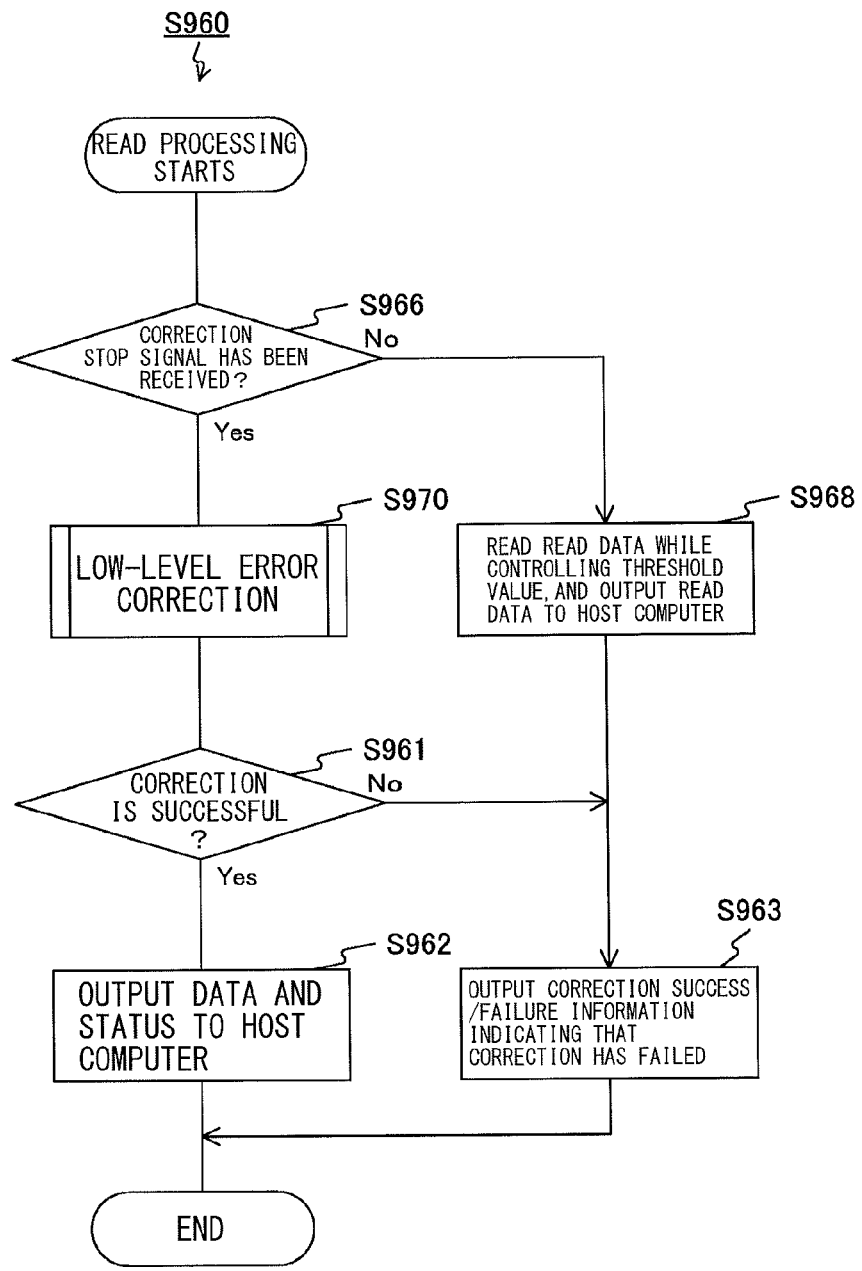
FIG. 54 is a flow chart illustrating an example of read processing according to the fifth embodiment.

FIG. 54 is a flow chart illustrating an example of an operation of read processing according to the fifth embodiment. The read processing according to the fifth embodiment differs from that according to the first embodiment in that a step S968 is executed instead of the step S967.

In a case where the memory controller 300 has received a correction stop signal (step S966: No), the memory controller 300 controls the threshold value and reads read data, based on the threshold value control signal and the code word output command, and outputs the read data to the host computer 100 (step S968). After the step S968, the memory controller 300 executes the step S963.

Thus, in the fifth embodiment, the memory controller 300 is allowed to correct an error more easily by generating a soft-decision value from a plurality of read data read with use of different threshold values and using the soft-decision value than in a case where a hard-decision value is used. The soft-decision value generated from a plurality of read data read at different threshold values is a value representing an extent that data is stored properly. Therefore, when error correction is performed, based on such a soft-decision value, a decline in error correction capability in a case where data is not stored properly is preventable.

Modification Example

In the fifth embodiment, the host computer 100 reads read data a plurality of times, and then performs error correction; however, error correction may be performed every time read data is read. The host computer according to a modification example of the fifth embodiment differs from that according to the fifth embodiment in that error correction is performed every time read data is read.

Figure 55:
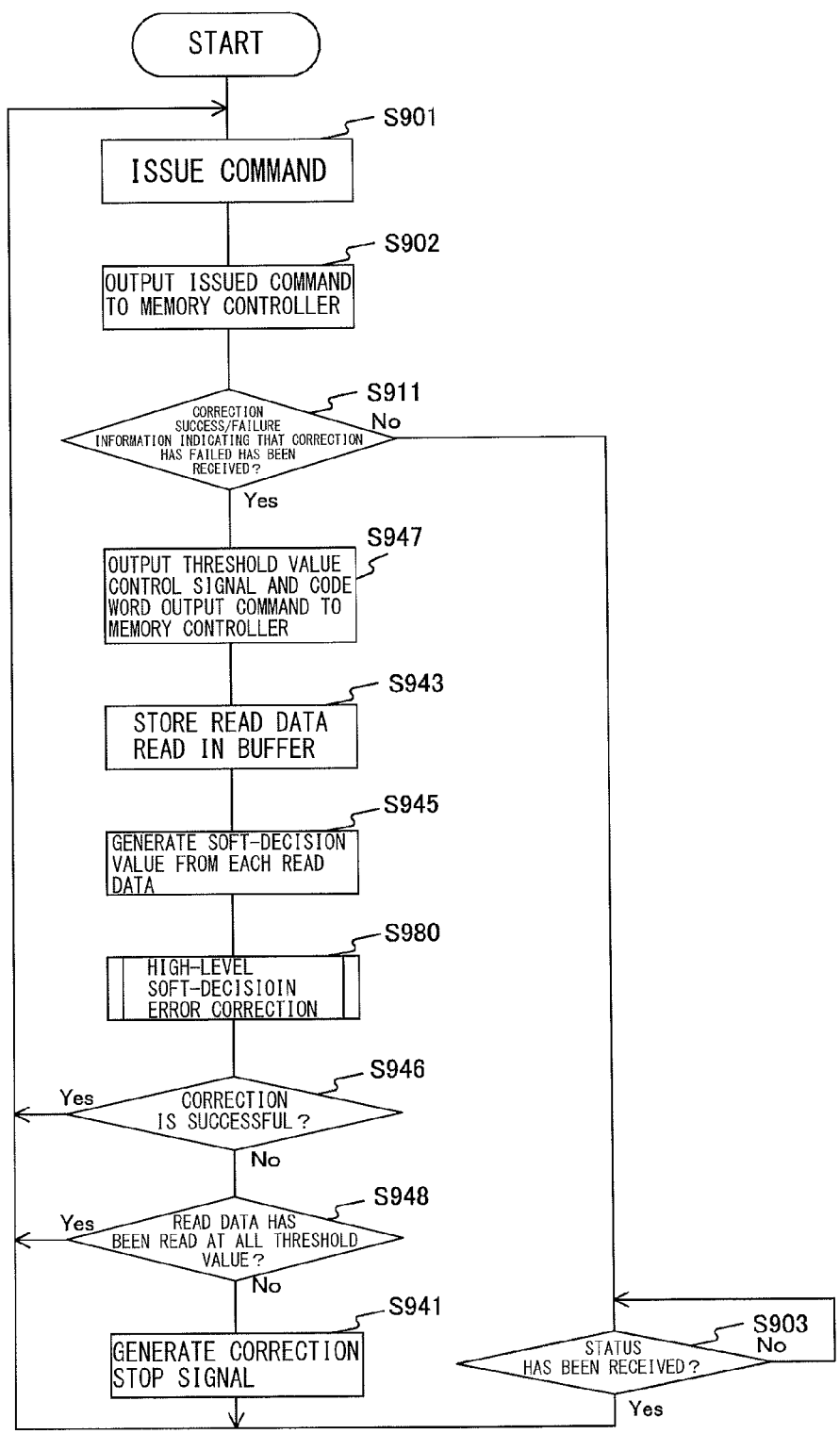
FIG. 55 is a flow chart illustrating an example of an operation of a host computer according to a modification example of the fifth embodiment.

FIG. 55 is a flow chart illustrating an example of an operation of the host computer 100 according to the modification example of the fifth embodiment. The host computer according to the modification example of the fifth embodiment differs from that according to the fifth embodiment in that high-level soft-decision error correction is executed every time read data is read.

More specifically, in a case where the host computer 100 has received correction success/failure information indicating that correction has failed (step S911: Yes), the host computer 100 outputs, to the memory controller 300, the threshold value control signal and the code word output command (step S947). The host computer 10 stores read data read from the memory controller 300 in the read data buffer 130 (step S943), and generates soft-decision value data (step S945). The host computer 10 executes the high-level soft-decision error correction with use of the thus-generated soft-decision value data (step S980).

The host computer 100 determines whether or not error correction in the high-level soft-decision error correction is successful (step S946). In a case where the error correction has failed (step S946: No), the host computer 100 determines whether or not read data has been read at all of the threshold values (step S948). In a case where the read data has not been read at all of the threshold values (step S948: No), the host computer 100 generates the correction stop signal, and starts to output the correction stop signal to the memory controller 300 (step S941). After the step S941, the host computer 100 returns to the step S901. Moreover, in a case where the error correction is successful (step S946: Yes), or in a case where read data has been read at all of the threshold values (step S948: Yes), the host computer 100 executes processing, based on whether or not error correction is successful, and returns to the step S901.

It is to be noted that the above-described embodiments of the present technology are merely examples for embodying the present technology, and there are correspondences between the features of the example embodiments of the present technology and the elements set forth in the appended claims. Similarly, there are correspondences between the elements set forth in the appended claims and the identically named features appearing in the example embodiments of the present technology. However, the present technology is not limited to the embodiments, and may be embodied by variously modifying the embodiments without departing from the scope of the present technology.

Moreover, the processing procedures described in the above-described embodiments may be regarded as a method having these procedures, or may be regarded as a program for causing a computer to execute these procedures or as a recording medium holding the program. As the recording medium, for example, a CD (Compact Disc), an MD (Mini Disc), a DVD (Digital Versatile Disk), a memory card, a Blu-ray Disc (registered trademark), or the like may be used.

It is to be noted that the present technology may have the following configurations.

(1) A controller including:

a low-level error correction section configured to execute low-level error correction in which an error in a code word is corrected with use of a predetermined decoding algorithm; and a high-level soft-decision error correction section configured to execute high-level soft-decision error correction in which the error in the code word is corrected with use of a high-level algorithm when the error correction by the low-level error correction section has failed, the high-level algorithm being a soft-decision decoding algorithm having higher error correction capability than error correction capability of the predetermined decoding algorithm.

(2) The controller according to (1), further including:

a read processing section configured to read the code word from a memory and supply the code word to the low-level error correction section, the code word including a plurality of code elements, a code word acquisition section configured to execute, a plurality of times, code word acquisition in which the code word is read from the memory when the error correction by the low-level error correction section has failed; and a soft-decision value generation section configured to generate, for each of the code elements, a soft-decision value corresponding to probability that a value of each of the code elements is a specific value, based on each of the code words read by the code word acquisition section, and supply, to the high-level soft-decision error correction section, the code word in which the soft-decision value is substituted for the value of each of the code elements.

(3) The controller according to (2), in which the soft-decision value generation section determines, for each of the code elements, frequency with which the specific value is read by the code word acquisition section, and generates the soft-decision value, based on the frequency.

(4) The controller according to (2), further including a threshold value control section configured to change, in a predetermined range, a threshold value every time the code word acquisition is executed, the threshold value being a threshold for determination of the values of the code elements, in which the soft-decision value generation section generates the soft-decision value, based on a maximum value or a minimum value of the threshold values when the code element with the specific value is read.

(5) The controller according to any one of (2) to (4), in which the soft-decision value generation section generates the soft-decision value after the code word acquisition is executed a plurality of times, and the high-level soft-decision error correction section executes the high-level soft-decision error correction when the soft-decision value is generated.

(6) The controller according to any one of (2) to (5), in which the soft-decision value generation section generates the soft-decision value every time the code word acquisition is executed, and the high-level soft-decision error correction section executes the high-level soft-decision correction every time the soft-decision value is generated.

(7) The controller according to any one of (1) to (6), in which the code word includes a plurality of code elements, and the low-level error correction section generates, for each of the code elements, a soft-decision value corresponding to probability that a value of each of the code elements is a specific value, and supplies, to the high-level soft-decision error correction section, the code word in which the soft-decision value is substituted for the value of each of the code elements.

(8) An information processing system including:

a host computer configured to issue a read command that instructs reading of a code word from a storage section;

a read processing section configured to read the code word from the storage section in response to the read command;

a low-level error correction section configured to execute low-level error correction in which an error in the code word is corrected with use of a predetermined decoding algorithm; and a high-level soft-decision error correction section configured to execute high-level soft-decision error correction in which the error in the code word is corrected with use of a high-level algorithm when error correction by the low-level error correction section has failed, the high-level algorithm being a soft-decision decoding algorithm having higher error correction capability than error correction capability of the predetermined decoding algorithm.

(9) The information processing system according to (8), in which the host computer determines execution order of one or more commands including a correction start command, based on processing time of the high-level soft-decision error correction, and supplies the one or more commands in the execution order to the high-level soft-decision error correction section, the correction start command that instructs starting of the high-level soft-decision error correction when the error correction by the low-level error correction section has failed, and the high-level soft-decision error correction section starts the high-level soft-decision error correction when the error correction by the low-level error correction section has failed and the correction start command is supplied to the high-level soft-decision error correction section.

(10) The information processing system according to (8) or (9), in which the host computer issues an abort command that suspends the high-level soft-decision error correction when the error correction by the low-level error correction section has failed and interruption of the reading of the code word has occurred, and the high-level soft-decision error correction section suspends, in response to the abort command, the high-level soft-decision error correction being in execution when the error correction by the low-level error correction section has failed.

(11) The information processing system according to any one of (8) to (10), in which the host computer further generates, based on kind of the code word, an enable signal indicating whether or not to execute the high-level soft-decision error correction, and the high-level soft-decision error correction section executes the high-level soft-decision error correction in response to the enable signal when the error correction by the low-level error correction section has failed.

(12) The information processing system according to any one of (8) to (11), in which the high-level algorithm includes a plurality of high-level algorithms, the host computer specifies one of the plurality of high-level algorithms, based on kind of the code word, and the high-level soft-decision error correction section corrects the error in the code word with use of the specified high-level algorithm when the error correction by the low-level error correction section has failed.

(13) An information processing system including:

a controller configured to read a code word from a storage section and execute low-level error correction in which an error in the code word is corrected with use of a predetermined decoding algorithm; and a host computer configured to execute high-level soft-decision error correction in which the error in the code word is corrected with use of a high-level algorithm when the error correction by the controller has failed, the high-level algorithm being a soft-decision decoding algorithm having higher error correction capability than error correction capability of the predetermined decoding algorithm.

(14) The information processing system according to (13), in which the host computer issues a code word output command when the error correction by the controller has failed, the code word output command instructing the controller to output the code word, and the controller reads the code word from the storage section and outputs the code word to the host computer without executing the low-level error correction in response to the code word output command.

(15) The information processing system according to (13) or (14), in which the controller generates correction success/failure information in the low-level error correction, and outputs the correction success/failure information to the host computer, the correction success/failure information indicating whether or not the error correction to the code word is successful, and the host computer determines, based on the correction success/failure information, whether or not the error correction by the controller has failed.

(16) A method of controlling a controller, the method including:

executing low-level error correction in which an error in a code word is corrected with use of a predetermined decoding algorithm; and executing high-level soft-decision error correction in which the error in the code word is corrected with use of a high-level algorithm when the error correction in the low-level error correction has failed, the high-level algorithm being a soft-decision algorithm having higher error correction capability than error correction capability of the predetermined decoding algorithm.

(17) A non-transitory tangible recording medium having a program embodied therein, the computer-readable program allowing, when executed by a computer, the computer to implement a method, the method including:

executing low-level error correction in which an error in a code word is corrected with use of a predetermined decoding algorithm; and executing high-level soft-decision error correction in which the error in the code word is corrected with use of a high-level algorithm when the error correction in the low-level error correction has failed, the high-level algorithm being a soft-decision algorithm having higher error correction capability than error correction capability of the predetermined decoding algorithm.

It should be understood by those skilled in the art that various modifications, combinations, sub-combinations, and alterations may occur depending on design requirements and other factors insofar as they are within the scope of the appended claims or the equivalents thereof.

What is claimed is:

1. A controller comprising:

a low-level error correction section configured to execute low-level error correction in which an error in a code word including a plurality of code elements is corrected with use of a predetermined decoding algorithm;

a high-level soft-decision error correction section configured to execute high-level soft-decision error correction in which the error in the code word is corrected with use of a high-level algorithm in an event the error correction by the low-level error correction section has failed, the high-level algorithm being a soft-decision decoding algorithm having higher error correction capability than error correction capability of the predetermined decoding algorithm; and a soft-decision value generation section configured to generate, for each of the code elements, a soft-decision value corresponding to probability that a value of each of the code elements is a specific value, wherein the soft-decision value generation section is configured to, for each of the code elements, determine frequency with which the specific value is read and generate the soft-decision value based on the determined frequency.

2. The controller according to claim 1, further comprising:

a read processing section configured to read the code word from a memory and supply the code word to the low-level error correction section; and a code word acquisition section configured to execute, a plurality of times, code word acquisition in which the code word is read from the memory in an event the error correction by the low-level error correction section has failed, wherein the soft-decision value generation section is configured to generate, for each of the code elements, the soft-decision value based on each of the code words read by the code word acquisition section, and supply, to the high-level soft-decision error correction section, the code word in which the soft-decision value is substituted for the value of each of the code elements.

3. The controller according to claim 2, further comprising a threshold value control section configured to change, in a predetermined range, a threshold value every time the code word acquisition is executed, the threshold value being a threshold for determination of the values of the code elements, wherein the soft-decision value generation section is configured to generate the soft-decision value, based on a maximum value or a minimum value of the threshold values in an event the code element with the specific value is read.

4. The controller according to claim 2, wherein the soft-decision value generation section is configured to generate the soft-decision value after the code word acquisition is executed a plurality of times, and the high-level soft-decision error correction section is configured to execute the high-level soft-decision error correction in an event the soft-decision value is generated.

5. The controller according to claim 2, wherein
the soft-decision value generation section is configured to generate the soft-decision value every time the code word acquisition is executed, and
the high-level soft-decision error correction section is configured to execute the high-level soft-decision correction every time the soft-decision value is generated.

6. The controller according to claim 1, wherein
the low-level error correction section is configured to generate, for each of the code elements, a soft-decision value corresponding to probability that the value of each of the code elements is a specific value, and supply, to the high-level soft-decision error correction section, the code word in which the soft-decision value is substituted for the value of each of the code elements.

7. An information processing system comprising:
a host computer configured to issue a read command that instructs reading of a code word from a storage section;
a read processing section configured to read the code word from the storage section in response to the read command;
a low-level error correction section configured to execute low-level error correction in which an error in the code word including a plurality of code elements is corrected with use of a predetermined decoding algorithm;
a high-level soft-decision error correction section configured to execute high-level soft-decision error correction in which the error in the code word is corrected with use of a high-level algorithm in an event error correction by the low-level error correction section has failed, the high-level algorithm being a soft-decision decoding algorithm having higher error correction capability than error correction capability of the predetermined decoding algorithm; and
a soft-decision value generation section configured to generate, for each of the code elements, a soft-decision value corresponding to probability that a value of each of the code elements is a specific value,
wherein the soft-decision value generation section is configured to, for each of the code elements, determine frequency with which the specific value is read and generate the soft-decision value based on the determined frequency.

8. The information processing system according to claim 7, wherein
the host computer is configured to determine execution order of one or more commands including a correction start command, based on processing time of the high-level soft-decision error correction, and supply the one or more commands in the execution order to the high-level soft-decision error correction section, the correction start command instructs starting of the high-level soft-decision error correction in an event the error correction by the low-level error correction section has failed, and
the high-level soft-decision error correction section is configured to start the high-level soft-decision error correction in an event the error correction by the low-level error correction section has failed and the correction start command is supplied to the high-level soft-decision error correction section.

9. The information processing system according to claim 7, wherein
the host computer is configured to issue an abort command that suspends the high-level soft-decision error correction in an event the error correction by the low-level error correction section has failed and interruption of the reading of the code word has occurred, and
the high-level soft-decision error correction section is configured to suspend, in response to the abort command, the high-level soft-decision error correction being in execution in an event the error correction by the low-level error correction section has failed.

10. The information processing system according to claim 7, wherein
the host computer is further configured to generate, based on kind of the code word, an enable signal indicating whether or not to execute the high-level soft-decision error correction, and
the high-level soft-decision error correction section is configured to execute the high-level soft-decision error correction in response to the enable signal in an event the error correction by the low-level error correction section has failed.

11. The information processing system according to claim 7, wherein
the high-level algorithm includes a plurality of high-level algorithms,
the host computer is configured to specify one of the plurality of high-level algorithms, based on kind of the code word, and
the high-level soft-decision error correction section is configured to correct the error in the code word with use of the specified high-level algorithm in an event the error correction by the low-level error correction section has failed.

12. An information processing system comprising:
a controller configured to read a code word from a storage section and execute low-level error correction in which an error in the code word including a plurality of code elements is corrected with use of a predetermined decoding algorithm;
a host computer configured to execute high-level soft-decision error correction in which the error in the code word is corrected with use of a high-level algorithm in an event the error correction by the controller has failed, the high-level algorithm being a soft-decision decoding algorithm having higher error correction capability than error correction capability of the predetermined decoding algorithm; and
a soft-decision value generation section configured to generate, for each of the code elements, a soft-decision value corresponding to probability that a value of each of the code elements is a specific value,
wherein the soft-decision value generation section is configured to, for each of the code elements, determine frequency with which the specific value is read and generate the soft-decision value based on the determined frequency.

13. The information processing system according to claim 12, wherein
the host computer is configured to issue a code word output command in an event the error correction by the controller has failed, the code word output command instructing the controller to output the code word, and
the controller is configured to read the code word from the storage section and output the code word to the host computer without executing the low-level error correction in response to the code word output command.

14. The information processing system according to claim 12, wherein
the controller is configured to generate correction success/failure information in the low-level error correction, and output the correction success/failure information to the host computer, the correction success/failure information indicating whether or not the error correction to the code word is successful, and the host computer is configured to determine, based on the correction success/failure information, whether or not the error correction by the controller has failed.

15. A method of controlling a controller, the method comprising:

executing low-level error correction in which an error in a code word including a plurality of code elements is corrected with use of a predetermined decoding algorithm;

executing high-level soft-decision error correction in which the error in the code word is corrected with use of a high-level algorithm in an event the error correction in the low-level error correction has failed, the high-level algorithm being a soft-decision algorithm having higher error correction capability than error correction capability of the predetermined decoding algorithm; and generating, for each of the code elements, a soft-decision value corresponding to probability that a value of each of the code elements is a specific value, wherein the soft-decision value is generated based on frequency with which the specific value, for each of the code elements, is read.

16. A non-transitory computer-readable recording medium having a set of instructions embodied therein, the set of instructions allowing, when executed by a computer, the computer to implement a method, the method comprising:

executing low-level error correction in which an error in a code word including a plurality of code elements is corrected with use of a predetermined decoding algorithm;

executing high-level soft-decision error correction in which the error in the code word is corrected with use of a high-level algorithm in an event the error correction in the low-level error correction has failed, the high-level algorithm being a soft-decision algorithm having higher error correction capability than error correction capability of the predetermined decoding algorithm; and generating, for each of the code elements, a soft-decision value corresponding to probability that a value of each of the code elements is a specific value, wherein the soft-decision value is generated based on frequency with which the specific value, for each of the code elements, is read.

* * * * *